United States Patent
Hayakawa et al.

(10) Patent No.: US 7,112,827 B2
(45) Date of Patent: Sep. 26, 2006

(54) TUNABLE WAVELENGTH LASER

(75) Inventors: Akinori Hayakawa, Kawasaki (JP); Yoshihiro Sato, Kawasaki (JP); Ken Morito, Kawasaki (JP); Norihiko Sekine, Machida (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 10/690,469

(22) Filed: Oct. 22, 2003

(65) Prior Publication Data

US 2004/0119079 A1    Jun. 24, 2004

(30) Foreign Application Priority Data

Oct. 22, 2002 (JP) ............... 2002-306832
Dec. 6, 2002 (JP) ............... 2002-355271
May 14, 2003 (JP) ............... 2003-135908

(51) Int. Cl.
*H01L 29/74* (2006.01)
*H01L 31/111* (2006.01)
*H01S 3/10* (2006.01)
*H01S 3/17* (2006.01)

(52) U.S. Cl. ............... 257/116; 372/20; 372/44
(58) Field of Classification Search ............... 257/116; 372/20, 44
See application file for complete search history.

(56) References Cited

U.S. PATENT DOCUMENTS 5,048,049 A    9/1991   Amann ............... 372/96
6,693,937 B1*  2/2004   Steffens ............... 372/50

FOREIGN PATENT DOCUMENTS

| JP | 6-97591 | 4/1994 |
|----|---------|--------|
| JP | 7-131121 | 5/1995 |
| JP | 7-135368 | 5/1995 |
| JP | 7-326820 | 12/1995 |
| JP | 2002-6352 | 1/2002 |

OTHER PUBLICATIONS

Wolf, T., et al., "Tunable Twin-Guide Lasers with Improved Performemance Fabricated by Metal-Organic Vapor Phase Epitaxy", Mar. 1993, IEEE Photonics Tech. Letters, vol. 5, No. 3, p. 273-275.*
Schmidt et al., "Design and Realization of a Buried-Heterostructure Turnable-Twin-Guide Laser Diode with Electrical Blocking Regions", *IEEE Journal of Quantum Electronics*, vol. 35, No. 5, May 1999, pp. 794-802.
Bouda et al., "Compact High-Power Wavelength Selectable Lasers for WDM Applications", *Optical Fiber Communication Conference, 2000, Technical Digest*, vol. 1, pp. 178-180.
Mason et al., "Design of Sampled Grating DBR Lasers with Integrated Semiconductor Optical Amplifiers", *IEEE Photonics Technology Letters*, vol. 12, No. 7, Jul. 2000, pp. 762-764.

* cited by examiner

*Primary Examiner*—Howard Weiss
(74) *Attorney, Agent, or Firm*—Armstrong, Kratz, Quintos, Hanson & Brooks, LLP

(57) ABSTRACT

A light oscillation part including an active layer for generating light by current injection, a tuning layer with an intermediate layer formed between the active layer and the tuning layer, for varying an oscillation wavelength by current injection and a diffraction grating formed near the active layer and the tuning layer, and a light amplification part including an active layer for amplifying light by current injection are formed on a semiconductor substrate. Light oscillation elements having wide wavelength variation ranges and the light amplification are integrated on a semiconductor substrate, whereby wide wavelength variation ranges can be obtained and the output light can be much increased.

35 Claims, 41 Drawing Sheets

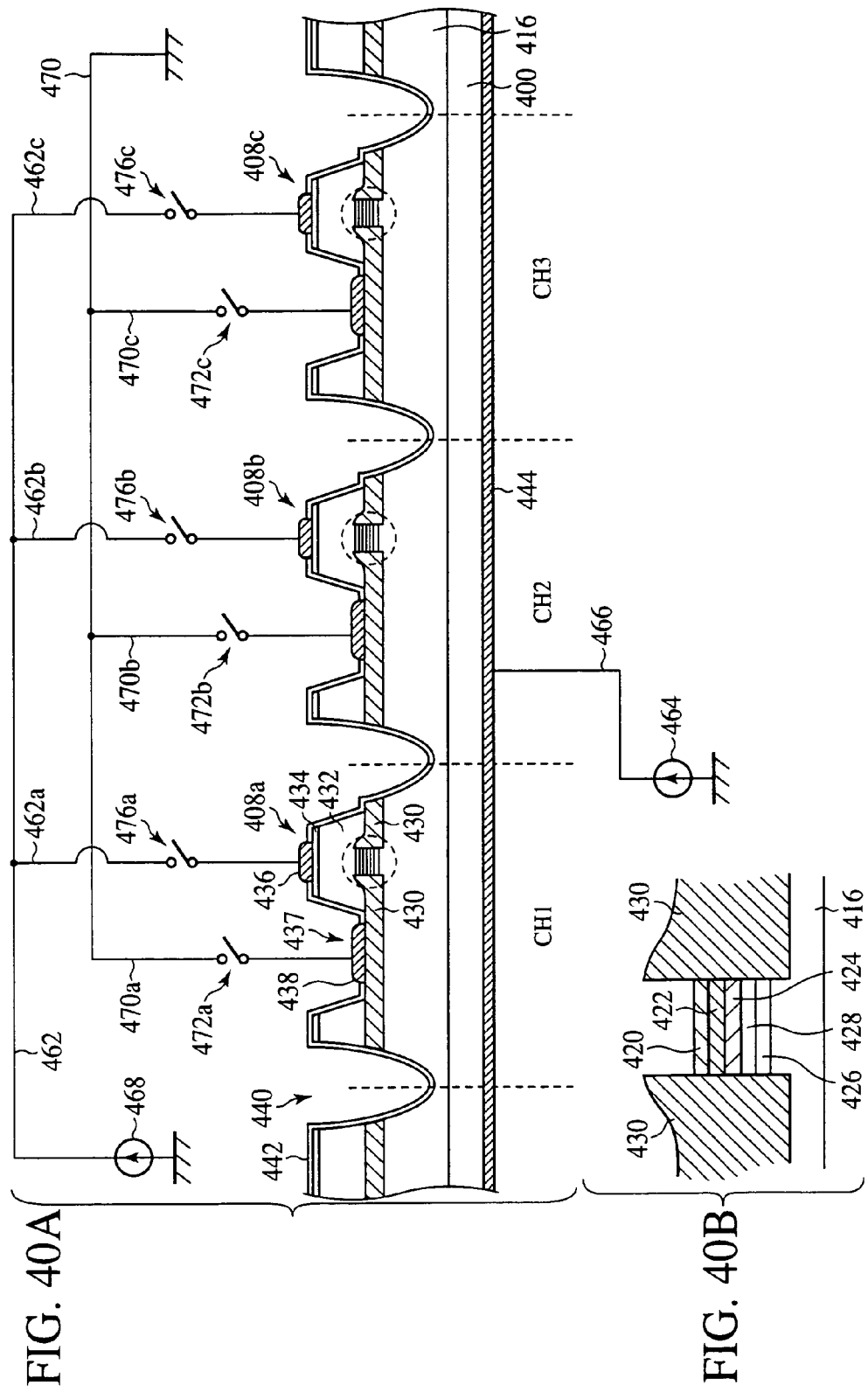

US 7,112,827 B2

TUNABLE WAVELENGTH LASER

CROSS-REFERENCE TO APPLICATIONS

This application is based upon and claims priorities of Japanese Patent Application No. 2002-306832, filed on Oct. 22, 2002, Japanese Patent Application No. 2002-355271, filed on Dec. 6, 2002, and Japanese Patent Application No. 2003-135908, filed on May 14, 2003, the contents being incorporated herein by reference.

BACKGROUND OF THE INVENTION

1. Field of the Invention

The present invention relates to a photosemiconductor device, a method for fabricating the photosemiconductor device and a method for driving the photosemiconductor device, more specifically a photosemicondcutor device which has a wide wavelength variation range and can provide high photooutputs, a method for driving the photosemiconductor device, and a photosemiconductor device including a tunable twin guide laser and an optical waveguide integrated on one and the same substrate and a method for fabricating the photosemiconductor device.

2. Description of the Related Art

Presently, in the trunk transmission systems of large-capacity optical communication networks, WDM (Wavelength Division Multiplexing) method, which multiplexes photosignals along a wavelength axes for larger transmission capacities, is used. In the WDM, a number of semiconductor lasers must be larger for a larger multiplexing number. The same number or more back-up light sources are also required. The large number of the parts complicates the inventory control.

In such background, it is expected to simplify the inventory control by using a wavelength selective light source which can vary the oscillation wavelength. The wavelength selective light source used in the WDM is required to have a wide continuous wavelength variation width.

As the wavelength selective light source, various wavelength selective lasers have been so far proposed. To give examples, the wavelength selective laser of the type that a DFB laser or a DBR laser is used to control the temperature to thereby vary the oscillation wavelength, and the wavelength selective laser of the type that a DBR laser is used to vary the oscillation wavelength by controlling the value of the current to be supplied to the tuning part thereof are known. As the DBR type are also known GCSR-DBR lasers having the filter function, and SG/SSG-DBR lasers which vary the oscillation wavelength by the modulation by partial diffraction grating patterns. However, these laser light sources have disadvantages such that they cannot provide larger photooutputs when they vary the wavelength, the range in which the wavelength can be continuously varied is as narrow as some nanometers, which makes the wavelength control complicated, and the mode hopping causes the discontinuous wavelength variation, etc.

Among these wavelength selective light sources, tunable twin guide DFB laser (hereafter called TTG-DFB laser) is characterized by a continuous wavelength variation width of about 8 nm, which is relatively wide, and by the simple wavelength variation method. Tunable twin guide lasers (hereinafter called TTG-LD), such as the TTG-DFB laser, etc. are described in, e.g., Japanese Patent Application Unexamined Publication No. Hei 07-131121 (1995), Japanese Patent Application Unexamined Publication No. Hei 07-326820 (1995) and Specification of U.S. Pat. No. 5,048,049 (1991).

The TTG-LD, which is known one laser which can control the above-described oscillation wavelength, has advantages that it can continuously control the oscillation wavelength in a single mode and can perform the wavelength control at high speed (refer to, e.g., Specification of U.S. Pat. No. 5,048,049). Furthermore, the TTG-LD also has the advantage that the wavelength control mechanism is simple. Owing to the advantages, the TTG-LD including the TTG-DFB laser is expected to be applicable to the light source, etc. for the optical communication of the WDM.

The conventional TTG-LD disclosed in Specification of U.S. Pat. No. 5,048,049 will be explained with reference to FIG. 41. FIG. 41 is a sectional view of the conventional TTG-LD, which shows a structure thereof.

A p type InP buffer layer 502 is formed on a p type InP semiconductor substrate 500. A p type electrode 504 for the wavelength control is formed on the underside of the semiconductor substrate 500.

On the buffer layer 502, a mesa stripe of InGaAsP wavelength control layer 506, an n type InP intermediate layer 508, an InGaAsP MQW active layer 510 and a p type InP clad layer 512 are formed by being laid one on another in the stated order and etched. A quaternary diffraction grating layer 514 having a diffraction grating formed in is formed between the buffer layer 502 and the wavelength tuning layer 506.

On the buffer layer 502 on both sides of the mesa stripe, an n type InP buried layer 516 is formed and buries the mesa stripe.

A p type InP cap layer 518 is formed on the buried layer 516 and the clad layer 512 of the mesa stripe. On the cap layer 518 a p type electrode 520 is formed electrically connected to the MQW layer 510 via the cap layer 518 and the clad layer 512.

On the buried layer 516 an n type electrode 522 is formed electrically connected to the intermediate layer 508 via the buried layer 516.

In the TTG-LD having the above-described structure, the p type electrode 504 formed on the underside of the semiconductor substrate 500 injects current into the wavelength tuning layer 506 formed below the intermediate layer 508 via the semiconductor substrate 500 and the buffer layer 502. On the other hand, the p type electrode 520 formed on the cap layer 518 injects current into the MQW layer 510 formed on the upper side of the intermediate layer 508 via the cap layer 518 and the clad layer 512.

The intermediate layer 508 is formed between the wavelength tuning layer 506 and the MQW layer 510 and is connected to the outside earth potential by the n type electrode 522. That is, the intermediate layer 508 connected to the earth potential functions as the common earth potential of the elements. Thus, the intermediate layer 508 connected to the outside earth potential makes the two functional layers, i.e., the MQW active layer 510 and the wavelength tuning layer 506 electrically independent of each other. Accordingly, the TTG-LD having this structure controls the current amount injected into the respective functional layers to thereby perform the laser oscillation control and the oscillation wavelength control independent of each other.

As described above, the TTG-DFB laser is characterized by the continuous, relatively wide wavelength variation range and the easy wavelength variation control method, and is attractive in comparison with the other lasers. However, the TTG-DFB laser as well as the other lasers has the disadvantage that the injection of current in the wavelength tuning layer for varying a wavelength to a shorter wavelength increases the internal loss of the laser, causing large decrease of photooutput.

Means for compensating the photooutput decrease is further injection of current into the active layer. However, this causes, on the other hand, the active layer temperature, i.e., the element temperature increase, causing the opposite effect of shifting the oscillation wavelength to a longer wavelength. Resultantly, the wavelength variation width is decreased. Furthermore, the wavelength shift due to the temperature increase must be again controlled by the wavelength tuning current, which complicates the wavelength variation method.

Japanese Patent Application Unexamined Publication No. Hei 07-326820 (1995) discloses a photosemiconductor device comprising a TTG-DFB laser, a photo-phase adjuster, a photo-intensity adjuster, and a reflection mirror. Japanese Patent Application Unexamined Publication No. Hei 07-326820 (1995) discloses that the absorption loss in a TTG-DFB laser is compensated by adjusting return light from the photo-phase adjuster and the photo-intensity adjuster. However, it cannot be said that the control disclosed in Japanese Patent Application Unexamined Publication No. Hei 07-326820 (1995) is easy. The integrated structure is not of optical elements having gains, and is not expected to much increase the photooutput.

As described above, the above-described photosemiconductor devices cannot realize high photooutputs although having wide wavelength variation ranges. Photosemiconductor devices which can simultaneously realize both have been expected.

The TTG-LD includes, as described above, 2 layers, the MQW active layer for current to be injected into from the electrode formed on the upper surface of the substrate and the wavelength tuning layer for current to be injected into from the electrode formed on the underside of the substrate. Accordingly, when the TTG-LD is integrated with other elements, such as an optical waveguide, etc., on one and the same substrate, disadvantages, such as characteristic deterioration, etc., will take place.

The technique of integrating the TTG-LD with other elements, such as an optical waveguide, etc. on one and the same substrate without causing the characteristic deterioration will be essential to the wide applicability of the TTG-LD.

SUMMARY OF THE INVENTION

An object of the present invention is to provide a photosemiconductor device which can have a wide wavelength variation range and can provide high photooutputs.

Another object of the present invention is to provide a photosemiconductor device which can integrate the TTG-LD with an optical waveguide on one and the same substrate without the characteristic deterioration and a method for fabricating the photosemiconductor device.

Further another object of the present invention is to provide a photosemiconductor device which can stably operate, and can have a wide wavelength variation range and can provide high photooutputs, and a method for driving the photosemiconductor device.

According to one aspect of the present invention, there is provided a photosemiconductor device comprising: a light oscillation part formed in a first region of a first conduction-type semiconductor substrate and including a first active layer which generates light by current injection, a wavelength tuning layer with a second conduction-type intermediate layer formed between the first active layer and the wavelength tuning layer, for varying an oscillation wavelength by current injection, and a diffraction grating formed near the first active layer and the wavelength tuning layer; and a light amplification part formed in a second region of the semiconductor substrate and including a second active layer which amplifies light by current injection, for amplifying light generated by the light oscillation part.

According to another aspect of the present invention, there is provided a photosemiconductor device comprising: a light oscillation part formed in a first region of a first conduction-type semiconductor substrate and including an active layer, for generating light by current injection, and a wavelength tuning layer with a second-conduction type intermediate layer formed between the active layer and the wavelength tuning layer, for varying an oscillation wavelength of the active layer by current injection; and an optical waveguide part including an insulation film formed in a second region of the semiconductor substrate and an optical waveguide layer formed above the insulation film, for guiding light output from the light oscillation part.

According to further another aspect of the present invention, there is provided a method for fabricating a photosemiconductor device comprising the steps of: forming in a first region of a first conduction-type semiconductor substrate an active layer for generating light by current injection, and a wavelength tuning layer with a second conduction-type intermediate layer formed between the active layer and the wavelength tuning layer, for changing an oscillation wavelength of the active layer by current injection; forming an insulation film in a second region of the semiconductor substrate; forming an optical waveguide layer on the insulation film; patterning the active layer, the intermediate layer and the wavelength tuning layer to form a first mesa stripe in the first region, and patterning the insulation film and the optical waveguide layer to form a second mesa stripe in the second region; and forming a buried layer electrically connected to the intermediate layer, for covering the side surface of the first mesa stripe and the side surface of the second mesa stripe.

According to further another aspect of the present invention, there is provided a photosemiconductor device comprising: a light oscillation part formed on a first conduction-type semiconductor substrate and including a plurality of light oscillation elements which include an active layer for generating light by current injection, a wavelength tuning layer with a second conduction-type intermediate layer formed between the active layer and the wavelength tuning layer, for varying an oscillation wavelength by current injection, and a diffraction grating formed near the active layer and the wavelength tuning layer; and a current leading-out part for selectively leading out current injected into the active layer or the wavelength tuning layer from the intermediate layer of an arbitrary one of the light oscillation elements.

According to further another aspect of the present invention, there is provided a method for driving a photosemiconductor device comprising a plurality of light oscillation elements formed on a first conduction-type semiconductor substrate and including an active layer for generating light by current injection, a wavelength tuning layer with a second conduction-type intermediate layer formed between the active layer and the wavelength tuning layer, for varying oscillation wavelengths by current injection, and a diffraction grating formed near the active layer and the wavelength tuning layer, the method comprising the step of injecting current into the active layer or the wavelength tuning layer of the plurality of the light oscillation elements with the intermediate layer of one selected out of the light oscillation elements connected to a reference potential and with the intermediate layer of the other light oscillation elements floated.

According to further another aspect of the present invention, there is provided a method for driving a photosemiconductor device comprising: a light oscillation part formed on a first conduction-type semiconductor substrate and including a plurality of light oscillation elements including an active layer for generating light by current injection, a wavelength tuning layer with a second conduction-type intermediate layer formed between the active layer and the wavelength tuning layer, for varying oscillation wavelengths by current injection, a diffraction grating formed near the active layer and the wavelength tuning layer; a first current injecting part for injecting current into the active layer or the wavelength tuning layer of the plurality of the light oscillation elements via an electrode formed on the side of a first surface of the semiconductor substrate; a second current injecting part for injecting current into the wavelength tuning layer or the active layer of the plurality of the light oscillation elements via an electrode formed on the side of a second surface of the semiconductor substrate; a current leading-out part including a plurality of wires connecting the intermediate layer of the respective plurality of the light oscillation elements to a reference potential and a plurality of switches provided in the respective plurality of the wires, the method comprising the step of injecting current by the first current injecting part and the second current injecting part with one of the plurality of the switches being closed and with the other switches opened.

According to further another aspect of the present invention, there is provided a method for driving a photosemiconductor device comprising: a light oscillation part formed on a first conduction-type semiconductor substrate and including a plurality of light oscillation elements including an active layer for generating light by current injection, a wavelength tuning layer with a second conduction-type intermediate layer formed between the active layer and the wavelength tuning layer, for varying an oscillation wavelength by current injection, and a diffraction grating formed near the active layer and the wavelength tuning layer; a first current injecting part including a first electric power source, a plurality of first wires connecting the active layer or the wavelength tuning layer of the plurality of the light oscillation elements in parallel to the first electric power source and a plurality of first switches respectively provided in the plurality of the first wires, for injecting current into the active layer or the wavelength tuning layer of an arbitrary one of the light oscillation elements via an electrode formed on the side of a first upper surface of the semiconductor substrate; a second current injecting part including a second electric power source, for injecting current into the wavelength tuning layer or the active layer of the plurality of light oscillation elements via an electrode formed on the side of a second surface of the semiconductor substrate; and a current leading-out part including a plurality of second wires connecting the intermediate layer of the respective plurality of the light oscillation elements to a reference potential and a plurality of second switches provided respectively in the plurality of the second wires, the method comprising the step of driving the first electric power source and the second electric power source to drive one of the plurality of light oscillation elements with the first switch and the second switch provided in the first wire and the second wire connected to one of the plurality of the light oscillation elements closed and with the other first switches and the second switches provided in the first wires and the second wires connected to the other light oscillation elements opened.

As described above, according to the present invention, a TTG-DFB laser and an SOA are integrated on a semiconductor substrate, whereby a continuous and wide wavelength variation range, which is characteristics of TTG-DFB lasers, can be provided, and the output light can be much increased by the SOA.

According to the present invention, a light oscillation part formed in a first region of a first conduction-type semiconductor substrate and including an active layer and a wavelength tuning layer formed with a second conduction-type intermediate layer between the active layer and the wavelength tuning layer, for varying an oscillation wavelength of the active layer by current injection is provided, and an optical waveguide part including an insulation film formed in a second region of the semiconductor device and an optical waveguide layer formed above the insulation film, for guiding light output from the light oscillation part are provided. Accordingly, the TTG-LD and the optical waveguide part can be integrated on one and the same substrate without characteristic deterioration.

According to the present invention, a light oscillation part formed on a first conduction-type semiconductor substrate and including a plurality of light oscillation elements including an active layer for generating light by current injection, a wavelength tuning layer with a second conduction-type intermediate layer formed between the active layer and the wavelength tuning layer, for varying oscillation wavelengths by current injection, and a diffraction grating formed near the active layer and the wavelength tuning layer is provided, and a current leading-out part for leading out current injected into the active layer or the wavelength tuning layer selectively from the intermediate layer of an arbitrary one of the plurality of the light oscillation elements is provided. Accordingly, the light oscillation elements can be driven independently of one another, and photooutputs of wavelength variation ranges which are wider than those provided by using one light oscillation element can be realized.

BRIEF DESCRIPTION OF THE DRAWINGS

FIGS. 40A–40B are sectional views of the photosemiconductor device according to a fourteenth embodiment, which show a structure of the laser array part and the driving circuit.

DETAILED DESCRIPTION OF THE INVENTION

[A First Embodiment]

The photosemiconductor device and the method for fabricating the photosemiconductor device according to a first embodiment of the present invention will be explained with reference to FIGS. 1A–1C, 2A–2D and 3A–3D.

Figure 1A:
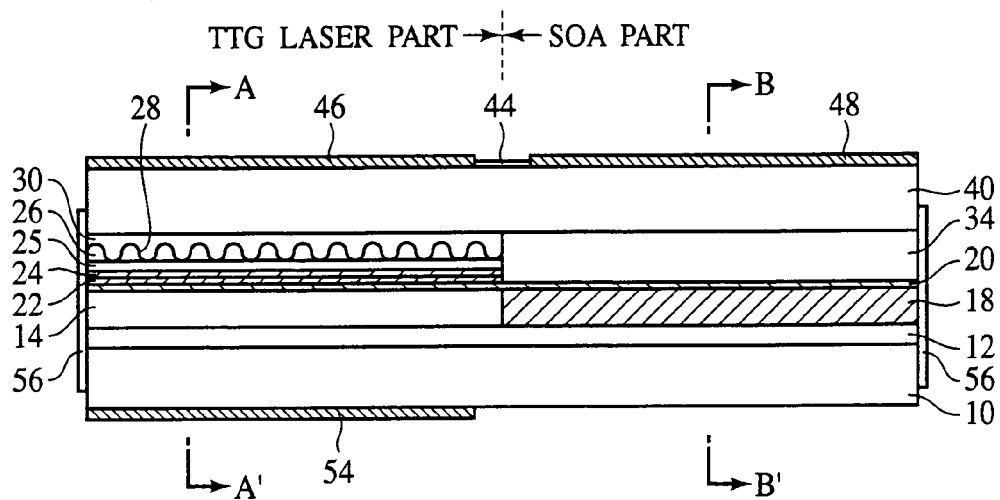
FIGS. 1A–1C are diagrammatic sectional views of the photosemiconductor device according to a first embodiment of the present invention, which show a structure thereof.
Figure 1B:
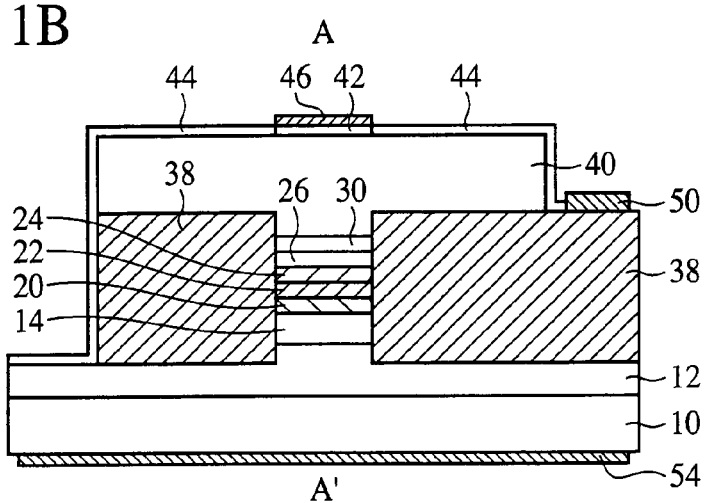
Figure 1C:
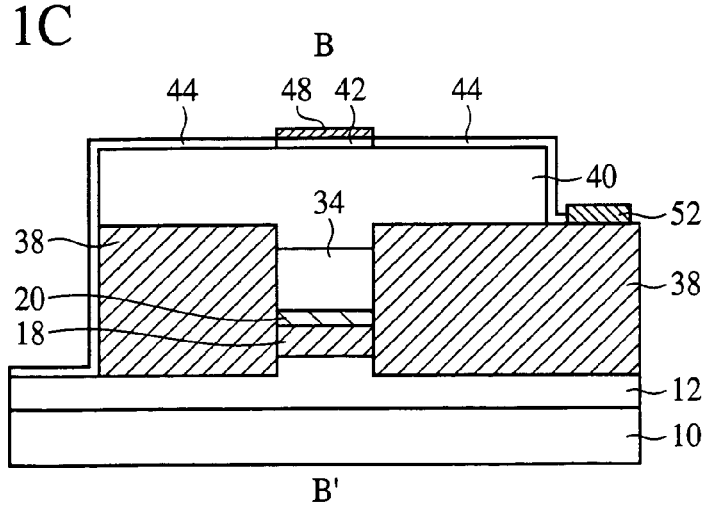

FIGS. 1A–1C are diagrammatic sectional views of the photosemiconductor device according to the present embodiment, which show the structure thereof. FIGS. 2A–2D and 3A–3D are sectional views of the photosemiconductor device according to the present embodiment in the steps of the method for fabricating the photosemiconductor device, which show the method.

First, the structure of the photosemiconductor device according to the present embodiment will be explained with reference to FIGS. 1A–1C. FIG. 1A is a diagrammatic sectional of the mesa stripe along the extension thereof. FIG. 1B is a diagrammatic sectional view of the TTG laser part along the line A–A' in FIG. 1A. FIG. 1C is a diagrammatic sectional view of the SOA part along the line B–B'.

The TTG laser part and the SOA part are provided on a semiconductor substrate 10.

The TTG laser part has the sectional structure shown in FIG. 1B. On the semiconductor substrate 10 of p type InP there are formed a p type InP layer 12, a lower clad layer 14 of p type InP, an MQW (Multiple Quantum Well) active layer 20, an intermediate layer 22 of an n type InP layer, a wavelength tuning layer 24 of an InGaAsP layer, a clad layer 25 of a p type InP layer, an InGaAsP layer 26 with a diffraction grating 28 formed in and a buried layer 30 of an InP layer. The buried layer 30, the InGaAsP layer 26, the wavelength tuning layer 24, the intermediate layer 22, the MQW active layer 20 and the lower clad layer 14 are patterned in a mesa, forming a mesa stripe. A buried layer 38 of an n type InP layer is formed on both sides of the mesa stripe. A p type InP layer 40 is formed on the buried layers 30, 38. An electrode 46 of Au/Zn is formed on the p type InP layer 40 with a contact layer 42 of a p type InGaAs layer formed therebetween. An electrode 50 of Au/Ge is formed on the buried layer 38. An electrode 54 of Au/Zn is formed on a second surface with no element formed on, i.e. the underside of the semiconductor substrate 10. A protection film 44 of silicon oxide film is formed on the exposed surfaces of the p type InP layers 12, 40 and the buried layer 38. In this specification, the first surface of the semiconductor substrate means the upper surface of the semiconductor substrate with the element formed on, and the second surface of the semiconductor device means underside of the semiconductor device with no element formed on.

The SOA part has the sectional structure shown in FIG. 1C. On the semiconductor substrate 10 there are formed the p type InP layer 12, the lower clad layer 18 of an n type InP layer, the MQW active layer 20 and an upper clad layer 34 of a p type InP layer. The upper clad layer 34, the MQW active layer 20 and the lower clad layer 18 are patterned in a mesa, forming a mesa stripe. The buried layer 38 of an n type InP layer is formed on both sides of the mesa stripe. The p type InP layer 40 is formed on the upper clad layer 34 and the buried layer 38. An electrode 48 of Au/Zn is formed on the p type InP layer 40 with the contact layer 42 of a p type InGaAs layer formed therebetween. An electrode 52 of Au/Ge is formed on the buried layer 38. The electrode 52 may be formed in one pattern continuous to the electrode 50 of the TTG laser part. The protection film 44 of silicon oxide film is formed on the exposed surfaces of the p type InP layers 12, 40 and the buried layer 38.

As shown in FIG. 1A, the mesa stripe of the TTG laser and the mesa stripe of the SOA part are arranged to be continuous to each other. The MQW active layer of the TTG laser and the MQW active layer of the SOA part are formed of a common semiconductor layer. Anti-reflection coatings 56 are formed on the end surfaces of the mesa stripe.

Then, the operation of the photosemiconductor device according to the present embodiment will be explained.

In the TTG laser part, a prescribed voltage is applied between the electrode 54 and the electrode 50 to inject current from the electrode 54. The current injected from the electrode 54 is injected into the MQW active layer 20 via the InP layer 12 and the lower clad layer 14 to be led out from the electrode 50 via the intermediate layer 22 and the buried layer 38. A current of above an oscillation threshold value is injected into the MQW active layer 20, whereby the light emitted in the MQW active layer 20 is oscillated in the DFB mode by the diffraction grating 28.

Simultaneously therewith, a prescribed voltage is applied between the electrode 46 and the electrode 50 to inject current from the electrode 46. The current injected from the electrode 46 is injected into the wavelength tuning layer 24 via the p type InP layer 40, the buried layer 30 and the InGaAsP layer 26 to be led out from the electrode 50 via the intermediate layer 22 and the buried layer 38. The current is injected into the wavelength tuning layer 24 to thereby decrease the refractive index by the plasma effect and decrease the effective refractive index of the optical waveguide layer. Resultantly the DFB oscillation wavelength is shortened. Thus, the DFB oscillation wavelength can be controlled by the current injected into the wavelength tuning layer 24.

In the SOA part, a prescribed voltage is applied between the electrode 48 and the electrode 52 to inject current from the electrode 48. The current injected from the electrode 48 is injected into the MQW active layer 20 via the p type InP layer 40 and the upper clad layer 34 to be led out from the electrode 52 via the lower clad layer 18 and the buried layer 38. The current is injected into the MQW active layer 20, whereby the light propagating inside the MQW active layer 20 can be amplified. The lower clad layer 18, which has some thickness, permits the current to be injected into the active layer, keeping the electric resistance low.

Accordingly, when the wavelength variation control in the TTG laser part and the light amplification control in the SOA part are performed independently of each other, high photooutputs having wide continuous wavelength variation widths can be realized while the heating in the SOA part is depressed, and the large longer wavelength-side shift of gain wavelengths and gain drops are depressed.

Then, the method for fabricating the photosemiconductor device according to the present embodiment will be explained with reference to FIGS. 2A–2D and 3A–3D.

First, the p type InP layer 12 is deposited, e.g., in a 2000 nm-thickness and a $1 \times 10^{18}$ cm$^{-3}$ dopant dose by, e.g., MOCVD on a p type InP semiconductor substrate 10 of, e.g., a $1 \times 10^{18}$ cm$^{-3}$ dopant dose.

Next, a p type InP layer of, e.g., a $1 \times 10^{18}$ cm$^{-3}$ dopant dose is formed on the InP layer 12 by, e.g., MOCVD.

Then, a silicon oxide film 16 of, e.g., a 300 nm-thickness is deposited on the p type InP layer by, e.g., CVD.

Next, the silicon oxide film 16 is patterned by photolithography and dry etching to selectively remove the silicon oxide film 16 in the SOA part.

Figure 2A:
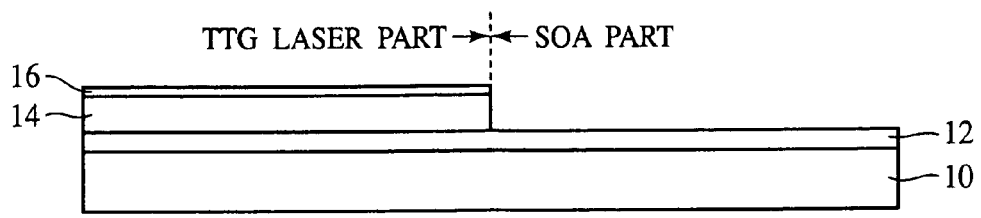
FIGS. 2A–2D are sectional views of the photosemiconductor device according to the first embodiment of the present invention in the steps of the method for fabricating the photosemiconductor device, which show the method (Part 1).

Next, with the silicon oxide film 16 as a mask, the p type InP layer is anisotropically etched to selectively remove the p type InP layer in the SOA part. Thus, the lower clad layer 14 of the p type InP layer is formed in the TTG laser part (FIG. 2A).

Then, on the semiconductor substrate 10 in the SOA part, an n type InP layer is selectively grown, e.g., in a 5000 nm-thickness and a $1\times10^{18}$ cm$^{-3}$ dopant dose by, e.g., MOCVD. The n type InP layer is grown in a thickness which is substantially equal to that of the lower clad layer 14. The lower clad layer 18 of the n type InP layer is thus formed in the SOA part.

Figure 2B:
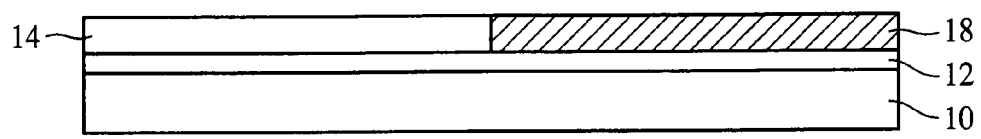

Then, the silicon oxide film 16 on the lower clad layer 14 is removed (FIG. 2B).

Next, on the lower clad layer 14, 18, a 100 nm-thickness SCH layer of InGaAsP of a 1.15 μm-composition and a 40 nm-thickness SCH layer of InGaAsP of a 1.25 μm-composition are deposited by, e.g., MOCVD.

Then, on the SCH layer, a 9 nm-thickness barrier layer of InGaAsP of a 1.25 μm-composition and a 7 nm-thickness well layer of InGaAsP with a 0.8% compressive strain introduced in are repeatedly deposited to thereby form a multiple quantum well layer having 7 well layers and a 1.55 μm-PL wavelength.

Then, a 40 nm-thickness SCH layer of InGaAsP of a 1.25 μm-composition is deposited on the multiple quantum well layer by, e.g., MOCVD.

Thus, the MQW active layer 20 formed of the multiple quantum well layer sandwiched by the SCH layers is formed. The structure of the active layer is may not essentially have the above-described structure.

Figure 2C:
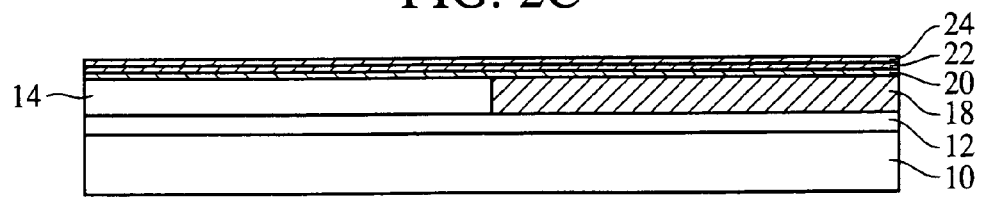

Then, on the MQW layer 20, an n type InP layer, e.g. of a 160 nm-thickness and a $1\times10^{18}$ cm$^{-3}$ dopant dose, and an InGaAsP layer, e.g. of a 290 nm-thickness and a 1.3 μm-composition are formed by, e.g., MOCVD. Thus, on the MQW active layer 20, the intermediate layer 22 of the n type InP layer, and the wavelength tuning layer 24 of the InGaAsP layer are formed (FIG. 2C).

Then, on the wavelength tuning layer 24, the clad layer 25, e.g. of a 10 nm-thickness and a $1\times10^{18}$ cm$^{-3}$ dopant dose, and the InGaAsP layer 26 of a 200 nm-thickness and a 1.15 μm-composition are formed.

Next, the InGaAsP layer 26 is etched by photolithography using interference exposure, and dry etching to form the diffraction grating 28 in the surface of the InGaAsP layer 26. A pitch of the diffraction grating 28 is, e.g., 240 nm.

Figure 2D:
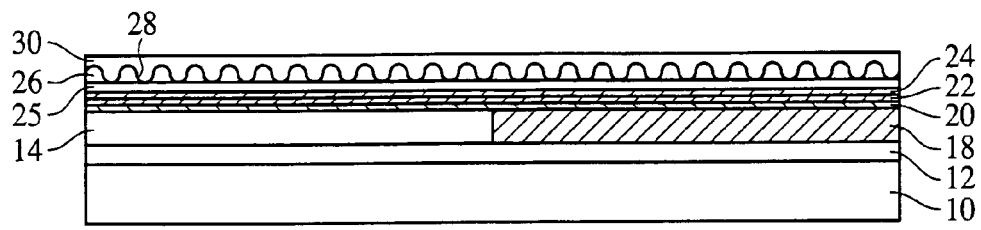

Then, on the InGaAsP layer 26 with the diffraction grating 28 formed in, the buried layer 30 of a 100 nm-thickness p type InP layer is formed by MOCVD (FIG. 2D).

Next, on the buried layer 30, the silicon oxide film 32 is deposited by, e.g., CVD.

Then, the silicon oxide film 32 in the SOA part is selectively removed by photolithography and dry etching.

Figure 3A:
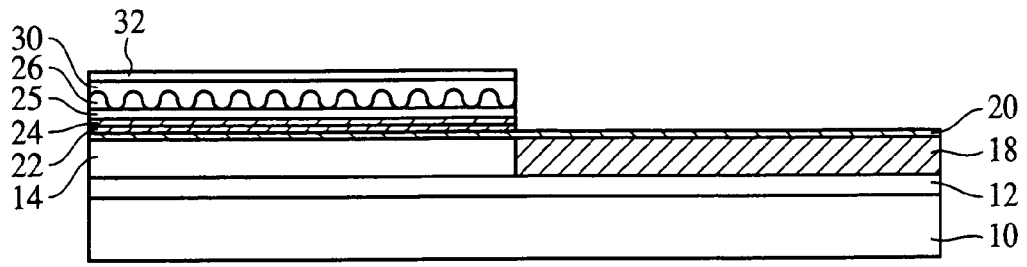
FIGS. 3A–3D are sectional views of the photosemiconductor device according to the first embodiment of the present invention in the steps of the method for fabricating the photosemiconductor device, which show the method (Part 2).

Then, with the silicon oxide film 32 as a mask, the buried layer 30, the InGaAsP layer 26, the wavelength tuning layer 24 and the intermediate layer 22 are etched to remove the buried layer 30, the InGaAsP layer 26, the wavelength tuning layer 24 and the intermediate layer 22 in the SOA part (FIG. 3A).

The wavelength tuning layer 24 and the intermediate layer 22 in the SOA part may not be essentially removed. The composition of the wavelength tuning layer 24 is more similar to that of the active layer than that of the clad layer, and the wavelength tuning layer 24 is somewhat photo-absorptive. Accordingly, leaving the wavelength tuning layer 24 in the SOA part makes the light loss large. However, the wavelength tuning layer 24 acts to confine light, as does the active layer. In the case that the optical waveguide is bent in the SOA part, the wavelength tuning layer 24 acts to decrease the bend loss. Preferably, whether or not the wavelength tuning layer 24 is left in the SOA part is suitably determined depending on the trade between the photo-absorption and the bend loss.

Then, a p type InP layer, e.g. of a $1\times10^{18}$ cm$^{-3}$ dopant dose and a 800 nm-thickness is formed by, e.g., MOCVD. The p type InP layer is grown to have substantially the same thickness as the buried layer 30. Thus, the upper clad layer 34 of the p type InP layer is formed in the SOA part.

Then, the silicon oxide film 32 on the buried layer 30 is removed.

Next, the silicon oxide film 36 is deposited on the buried layer 30 and the p type InP layer 34 by, e.g., CVD.

Figure 3B:
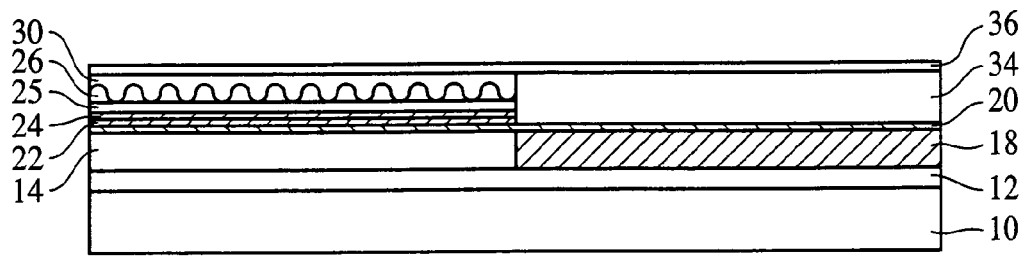

Then, the silicon oxide film 36 is patterned by photolithography and dry etching to leave the silicon oxide film 36 selectively in the region for the mesa stripe to be formed in (FIG. 3B).

Then, with the silicon oxide film 36 as a mask, the buried layer 30, the InGaAsP layer 26, the wavelength tuning layer 24, the intermediate layer 22, the MQW active layer 20, the lower clad layer 14 in the TTG laser part, and the upper clad layer 34, the MQW active layer 20 and the lower clad layer 18 in the SOA part are anisotropically etched to form the mesa stripe of, e.g., a 1.0 μm-width (refer to FIGS. 1B and 1C).

Then, an n type InP layer, e.g. of a $2\times10^{18}$ cm$^{-3}$ and a 1500 nm-thickness is grown selectively on the InP layer 12 exposed on both sides of the mesa stripe by, e.g., MOCVD. Thus, the buried layer 38 of the n type InP layer is formed on both sides of the mesa stripe (refer to FIGS. 1B and 1C).

Figure 3C:
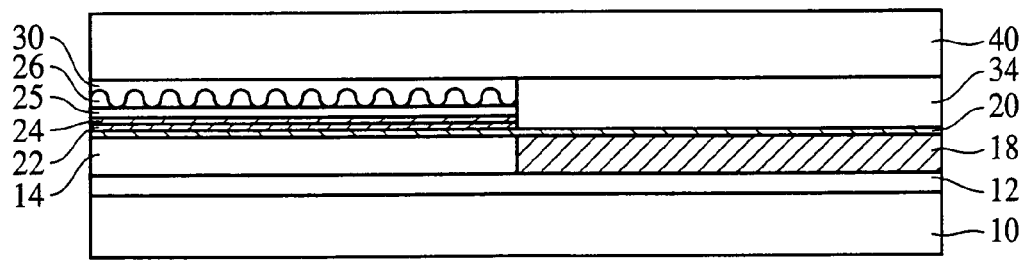

Then, after the silicon oxide film 36 on the mesa stripe has been removed, the p type InP layer 40, e.g. of a $1\times10^{18}$ cm$^{-3}$ dopant dose and a 5000 nm-thickness is deposited on the entire surface by, e.g., MOCVD (FIG. 3C).

Next, on the p type InP layer 40, a p type InGaAs layer, e.g. of a $1\times10^{19}$ cm$^{-3}$ and a 50 nm-thickness is formed by, e.g., MOCVD. Thus, the contact layer 42 of the p type InGaAs layer is formed (refer to FIGS. 1B and 1C).

Then, the p type InP layer 40 is etched by photolithography and dry etching to expose a part of the upper surface of the buried layer 38 so as to form a contact to the buried layer 38.

Then, a silicon oxide film of, e.g., 300 nm-thickness is formed on the entire surface by, e.g., CVD. Thus, the protection film 44 of the silicon oxide film is formed on the surface (refer to FIGS. 1B and 1C).

Next, by the usual electrode forming process, the electrode 46 is formed of a 1 μm-thickness Au/Zn film on the contact layer 42 of the TTG laser part, the electrode 48 is formed of a 1 μm-thickness Au/Zn film on the contact layer 42 of the SOA part, the electrode 50 is formed of a 1 μm-thickness Au/Ge film on the buried layer 38 of the TTG laser part, the electrode 52 is formed of a 1 μm-thickness Au/Ge film on the buried layer 38 of the SOA part, and the electrode 54 is formed of a 1 μm-thickness Au/Zn film on the underside of the semiconductor substrate 10 (refer to FIGS. 1B and 1C).

Figure 3D:
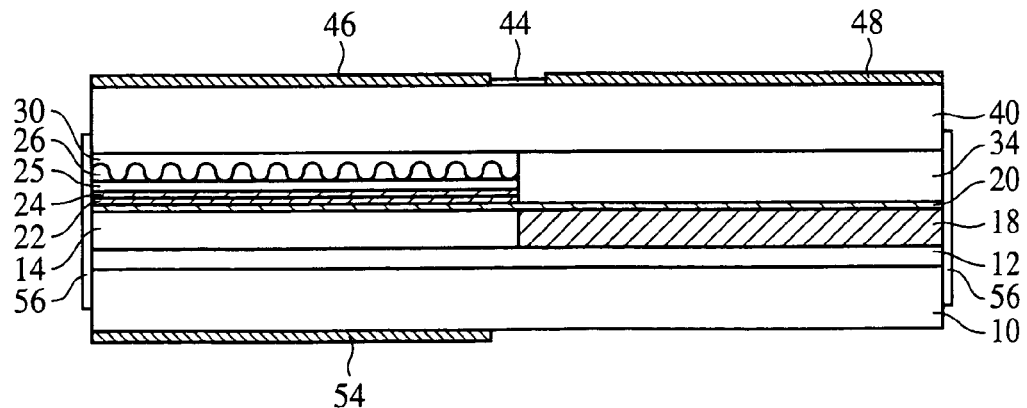

Then, the semiconductor substrate 10 is cleaved in, e.g., a 400 μm-length of the TTG laser part and in, e.g., a 600 μm-length of the SOA part, and then the anti-reflection films 56 are formed on the end surfaces (FIG. 3D).

Thus, the photosemiconductor device, as shown in FIGS. 1A–1C, with the TTG-DFB laser and the SOA integrated on the semiconductor substrate 10 of p type InP can be fabricated.

As described above, according to the present embodiment, the TTG-DFB laser and the SOA are integrated on the semiconductor substrate, whereby characteristics of the TTG-DFB laser, continuous, wide wavelength variation ranges can be obtained, and the photooutput can be much increased by the SOA.

In the present embodiment, the electrode 54 connected to the semiconductor substrate 10 is formed on the underside of the semiconductor substrate 10. However, the electrode 54 may be formed on the side of the front of the semiconductor substrate 10; specifically, the electrode 54 may be formed on the upper surface of the p type InP layer 12 on the left side of the buried layer 38 in the structure shown in FIG. 1B.

[A Second Embodiment]

The photosemiconductor device and the method for fabricating the photosemiconductor device according to a second embodiment of the present invention will be explained with reference to FIGS. 4A–4C and 5A–5D. The same members of the photosemiconductor device according to the present embodiment as those of the photosemiconductor device and the method for fabricating the photosemiconductor device according to the first embodiment shown in FIGS. 1A–1C, 2A–2D and 3A–3D are represented by the same reference numbers not to repeat or to simplify their explanation.

Figure 4A:
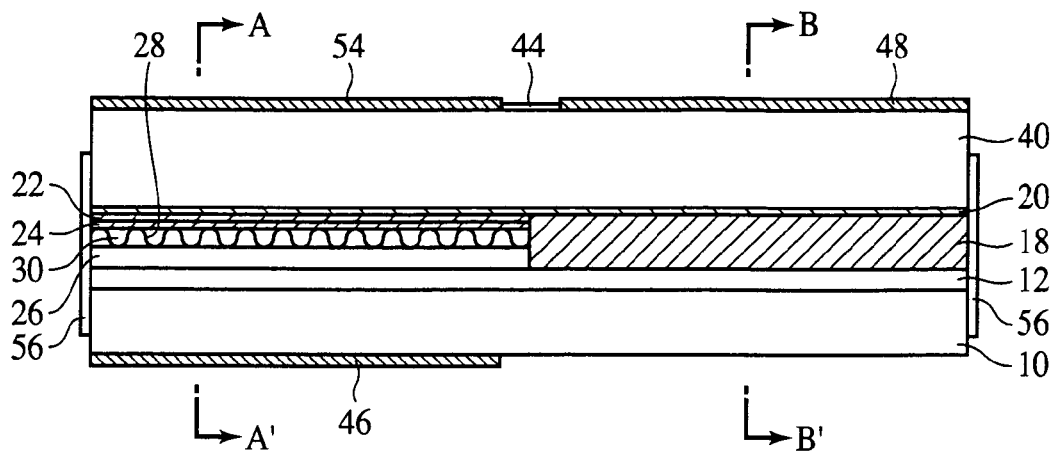
FIGS. 4A–4C are diagrammatic sectional views of the photosemiconductor device according to a second embodiment of the present invention, which show a structure thereof.
Figure 4B:
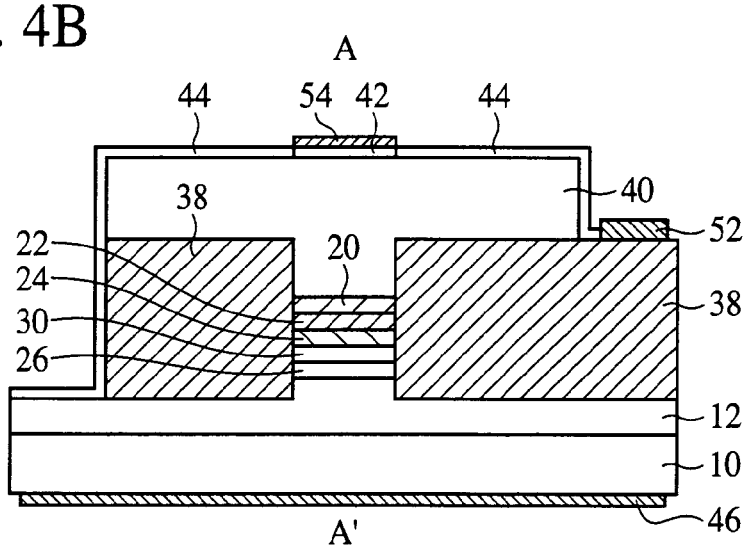
Figure 4C:
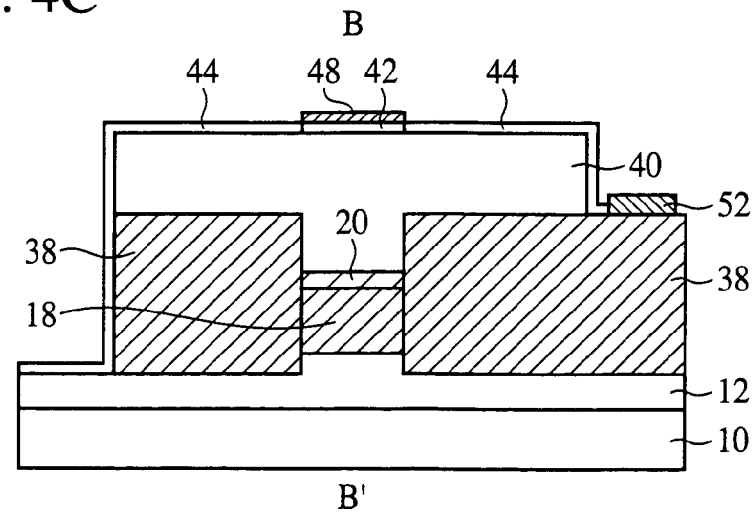

FIGS. 4A–4C are diagrammatic sectional views of the photosemiconductor device according to the present embodiment, which show a structure thereof. FIGS. 5A–5D are sectional views of the photosemiconductor device according to the present embodiment in the steps of the method for fabricating the same, which show the method.

First, the structure of the photosemiconductor device according to the present embodiment will be explained with reference to FIGS. 4A–4C. FIG. 4A is a diagrammatic sectional view of the photosemiconductor device in the direction of extension of the mesa stripe. FIG. 4B is the diagrammatic sectional view of the TTG laser part along the line A–A' in FIG. 4A. FIG. 4C is the diagrammatic sectional view of the SOA part along the line B–B'.

The photosemiconductor device according to the present embodiment is the same as the photosemiconductor device according to the first embodiment except that the former has a layer structure opposite to the layer structure of the MQW active layer 20 to the buried layer 30.

That is, the TTG laser part has the sectional structure shown in FIG. 4B. On a semiconductor substrate 10 of p type InP there are formed a p type InP layer 12, an InGaAsP layer 26 with a diffraction grating 28 formed in, a buried layer 30 of an InGaAsP layer, a wavelength tuning layer 24 of an InGaAsP layer, an intermediate layer 22 of an n type InP layer and an MQW active layer 20. The MQW active layer 20, the intermediate layer 22, the wavelength tuning layer 24, the buried layer 30 and the InGaAsP layer 26 are patterned in a mesa, forming a mesa stripe. A buried layer 38 of an n type InP layer 38 is formed on both sides of the mesa stripe. A p type InP layer 40 is formed on the MQW active layer 20 and the buried layer 38. On the p type InP layer 40, an electrode 46 of Au/Zn is formed with the contact layer 42 of a p type InGaAs layer formed therebetween. On the buried layer 38, an electrode 50 of Au/Ge is formed. On the underside of the semiconductor substrate 10, an electrode 54 of Au/Zn is formed. A protection film 44 of silicon oxide film is formed on the exposed surfaces of the p type InP layers 12, 40 and the buried layer 38.

As shown in FIG. 4C, the SOA part is basically the same as that of the photosemiconductor device according to the first embodiment shown in FIG. 1C. A difference of the photosemicondcutor device according to the present embodiment from the first embodiment is that the upper surface of the lower clad layer 18 is substantially flush with the upper surface of the intermediate layer 22.

In the photosemiconductor device according to the present embodiment, a prescribed voltage is applied between the electrode 54 and the electrode 50 to inject current from the electrode 54. The current injected from the electrode 54 is injected into the MQW active layer 20 via the p type InP layer 40 to be led out from the electrode 50 via the intermediate layer 22 and the buried layer 38. A current of above an oscillation threshold value is injected into the MQW active layer 20, whereby light emitted in the MQW active layer 20 is oscillated in DFB mode by the diffraction grating 28.

Simultaneously therewith, a prescribed voltage is applied between the electrode 46 and the electrode 50 to inject current from the electrode 46. The current injected from the electrode 46 is injected into the wavelength tuning layer 24 via the p type InP layer 12, the buried layer 30 and the InGaAsP layer 26 to be led out from the electrode 50 via the intermediate layer 22 and the buried layer 38. The current is injected into the wavelength tuning layer 24 to thereby decrease the refractive index by the plasma effect and decrease the effective refractive index of the optical waveguide layer. Resultantly the DFB oscillation wavelength is shortened. Thus, the DFB oscillation wavelength can be controlled by the current injected into the wavelength tuning layer 24.

Then, the method for fabricating the semiconductor device according to the present embodiment will be explained with reference to FIGS. 5A–5D.

First, the p type InP layer 12, e.g. of a 2000 nm-thickness and a $1 \times 10^{18}$ cm$^{-3}$ dopant dose is deposited by, e.g., MOCVD on a semiconductor substrate 10 of p type InP of, e.g., a $1 \times 10^{18}$ cm$^{-3}$ dopant dose.

Then, on the p type InP layer 12, an InGaAsP layer 26 of a 200 nm-thickness and a 1.15 μm-composition is formed.

The InGaAsP layer 26 is etched by photolithography using interference exposure and dry etching to form the diffraction grating 28 in the surface of the InGaAsP layer 26. A pitch of the diffraction grating 28 is, e.g., 240 nm.

Figure 5A:
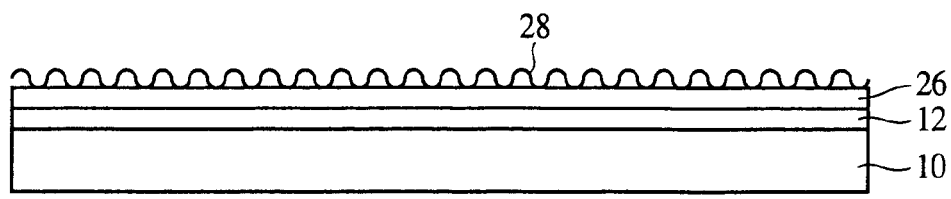
FIGS. 5A–5D are sectional views of the photosemiconductor device according to the second embodiment of the present invention in the steps of the method for fabricating the photosemiconductor device, which show the method.

Next, the buried layer 30 of a 100 nm-thickness p type InP layer is formed by, e.g., MOCVD on the InGaAsP layer 26 with the diffraction grating 28 formed in (FIG. 5A).

Figure 5B:
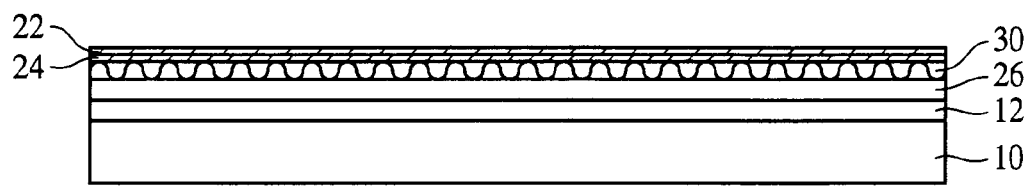

Then, on the buried layer 30, an InGaAsP layer, e.g. of a 290 nm-thickness and a 1.3 μm-composition and an n type InP layer, e.g. of a 160 nm-thickness and a $1 \times 10^{18}$ cm$^{-3}$ dopant dose are formed. Thus, the wavelength tuning layer 24 of the InGaAsP layer and the intermediate layer 22 of the n type InP layer are formed on the buried layer 30 (FIG. 5B).

Next, the silicon oxide film 32 is formed on the intermediate layer 22 by, e.g., CVD.

Then, the silicon oxide film 32 in the SOA part is selectively removed by photolithography and dry etching.

Figure 5C:
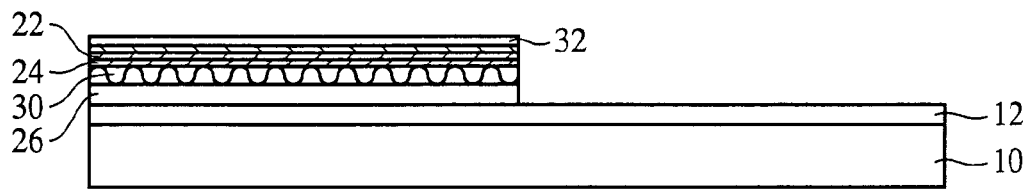

Next, with the silicon oxide film 32 as a mask, the intermediate layer 22, the wavelength tuning layer 24, the buried layer 30 and the InGaAsP layer 26 are etched to remove the intermediate layer 22, the wavelength tuning layer 24, the buried layer 30 and the InGaAsP layer 26 in the SOA part (FIG. 5C).

Then, an n type InP layer, e.g. of a $1 \times 10^{18}$ cm$^{-3}$ thickness and an about 550 nm-thickness is grown selectively on the n type InP layer 12 by, e.g., MOCVD. The n type InP layer is grown into a thickness substantially equal to a height of the upper surface of the intermediate layer 22. Thus, in the SOA part, the lower clad layer 18 is formed of the n type InP layer.

Next, the silicon oxide film 32 on the buried layer 30 is removed.

Next, on the intermediate layer 22 and the lower clad layer 18, the same MQW active layer 20 as that of the photosemiconductor device according to, e.g., the first embodiment, and the p type InP layer 21, e.g. of a $1 \times 10^{18}$ cm$^{-3}$ dopant dose and an bout 200 nm-thickness is formed by, e.g., MOCVD.

Next, the silicon oxide film 36 is deposited on the p type InP layer 21 by, e.g., CVD.

Figure 5D:
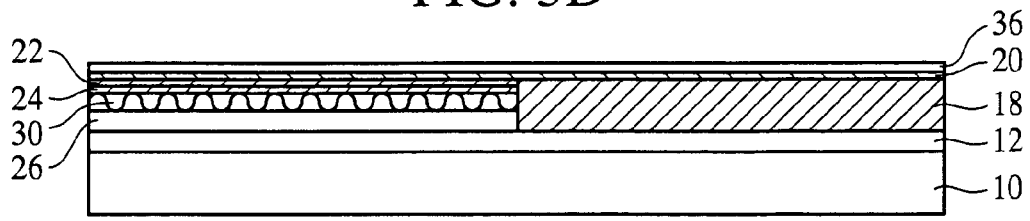

Then, the silicon oxide film 36 is patterned by photolithography and dry etching to leave the silicon oxide film 36 selectively in the region for the mesa stripe to be formed in (FIG. 5D).

Next, with the silicon oxide film 36 as a mask, the p type InP layer 21, the MQW active layer 20, the intermediate layer 22, the wavelength tuning layer 24, the buried layer 30 and the InGaAsP layer 26 in the TTG laser part, and the p type InP layer 21, the MQW active layer 20 and the lower clad layer 18 in the SOA part are anisotropically etched to form the mesa stripe of, e.g., a 1.0 μm-width (refer to FIGS. 4B and 4C).

Then, the buried layer 38, the p type InP layer 40, the protection film 44, the electrodes 46, 48, 50, 52, 54, the anti-reflection film 56. etc. are formed, e.g., in the same way as in the method for fabricating the photosemiconductor device according to the first embodiment shown FIGS. 3C and 3D to form the photosemiconductor device shown in FIGS. 4A–4C.

As described above, according to the present embodiment, the TTG-DFB laser and the SOA are integrated on the semiconductor substrate, whereby characteristics of the TTG-DFB laser, continuous, wide wavelength variation ranges can be obtained, and the photooutput can be much increased by the SOA.

[A Third Embodiment]

The photosemiconductor device and the method for fabricating the photosemiconductor device according to a third embodiment of the present invention will be explained with reference to FIG. 6. The same reference numbers of the present embodiment as those of the photosemiconductor device and the method for fabricating the photosemiconductor device according to the first and the second embodiments shown in FIGS. 1A–1C, 2A–2D, 3A–3D, 4A–4C and 5A–5D are represented by the same reference numbers not to repeat or to simplify their explanation.

Figure 6:
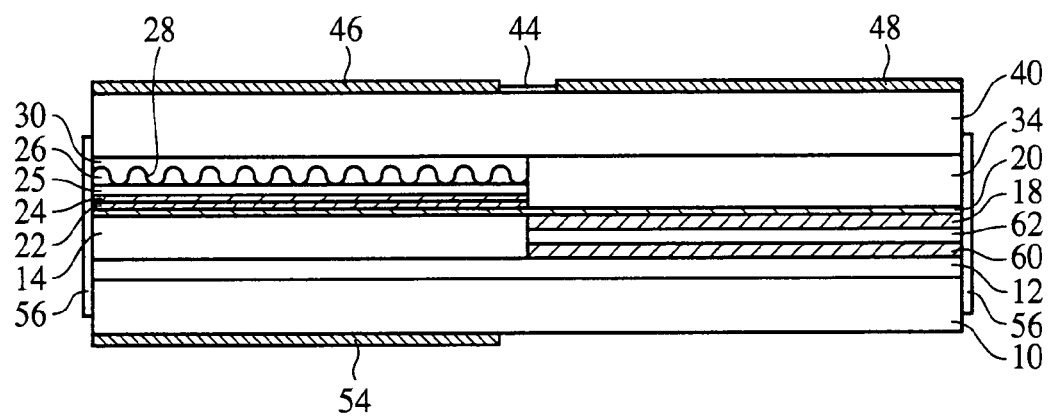
FIG. 6 is a sectional view of the photosemiconductor device according to a third embodiment of the present invention, which shows a structure thereof.

FIG. 6 is a diagrammatic sectional view of the photosemiconductor device according to the present embodiment, which shows the structure thereof.

The basic structure of the photosemiconductor device according to the present embodiment is the same as that of the photosemiconductor device according to the first embodiment shown in FIGS. 1A–1C. The present embodiment is different from the photosemiconductor device according to the first embodiment in that in the former, an n type InP layer 60, e.g., of a 300 nm-thickness and a $1 \times 10^{18}$ cm$^{-3}$ dopant dose and a p type InP layer 62, e.g., of a 500 nm-thickness and a $5 \times 10^{17}$ cm$^{-3}$ dopant dose are characteristically formed between the p type InP layer 12 and the lower clad layer 18 in the SOA part.

The n type InP layer 60 and the p type InP layer 62 are formed below the lower clad layer 18, thereby forming a pnpn junction of repeated layers of a p type semiconductor and an n type semiconductor, whereby the semiconductor substrate 10 and the lower clad layer 18 are more effectively electrically insulated from each other. In the photosemiconductor device according to the present embodiment, influences of the current injected in the MQW active layer 20 of the SOA on the current injected in the MQW active layer 20 of the TTG-DFB laser can be further depressed.

The photosemiconductor device according to the present embodiment can be fabricated by growing the n type InP layer 60 and the p type InP layer 62 prior to growing the n type InP layer, which is to be the lower clad layer 18 in the step of the method for fabricating the photosemiconductor device according to the first embodiment shown in FIG. 2B.

As described above, according to the present embodiment, the electric insulation between the semiconductor substrate and the SOA is improved, whereby the influence of the current injected into the active layer of the SOA on the current injected into the active layer of the TTG-DFB laser can be further depressed.

In the present embodiment, the n type InP layer 60 and the p type InP layer 62 are provided, whereby the electric insulation between the semiconductor substrate 10 and the lower clad layer 18 is improved by the pn junction isolation. However, in place of the n type InP layer 60 and the p type InP layer 62, a semi-insulating InP layer of, e.g., a 800 nm-thickness may be provided. The semi-insulating InP layer can be an InP layer doped with, e.g., a $1 \times 10^{17}$ cm$^{-3}$ dose of Fe.

In the present embodiment, 2 semiconductor layers, the n type InP layer 60 and the p type InP layer 62, are provided between the semiconductor substrate 10 and the lower clad layer 18, but 3 or more semiconductor layers may be provided.

In the present embodiment, the electric insulation between the semiconductor substrate and the SOA of the photosemiconductor device according to the first embodiment is improved, but this is applicable to the photosemiconductor device according to the second embodiment.

[A Fourth Embodiment]

The photosemiconductor device and the method for fabricating the photosemiconductor device according to a fourth embodiment of the present invention will be explained with reference to FIGS. 7A–7C. The same reference numbers of the present embodiment as those of the photosemiconductor device and the method for fabricating the photosemiconductor device according to the first to the third embodiments shown in FIGS. 1A–1C, 2A–2D, 3A–3D, 4A–4C, 5A–5D and 6 are represented by the same reference numbers not to repeat or to simplify their explanation.

Figure 7A:
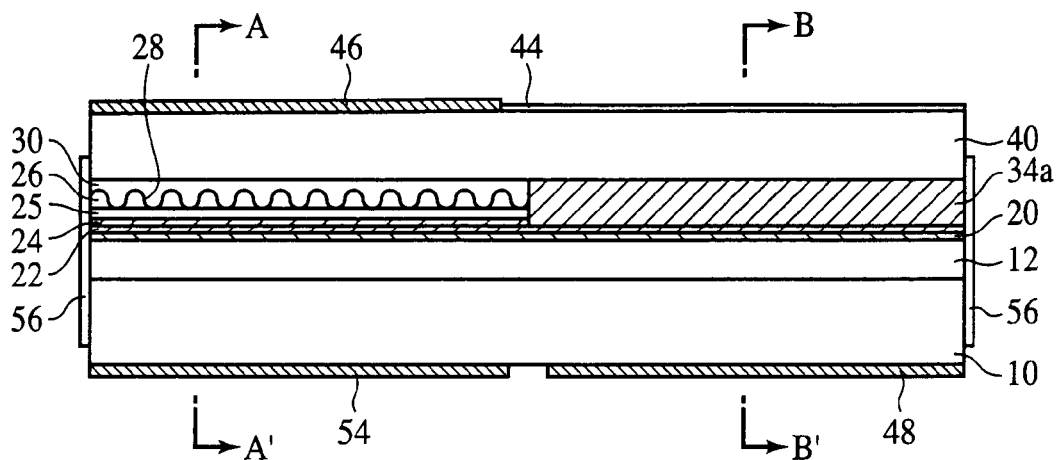
FIGS. 7A–7C are sectional views of the photosemiconductor device according to a fourth embodiment of the present invention, which show a structure thereof.
Figure 7B:
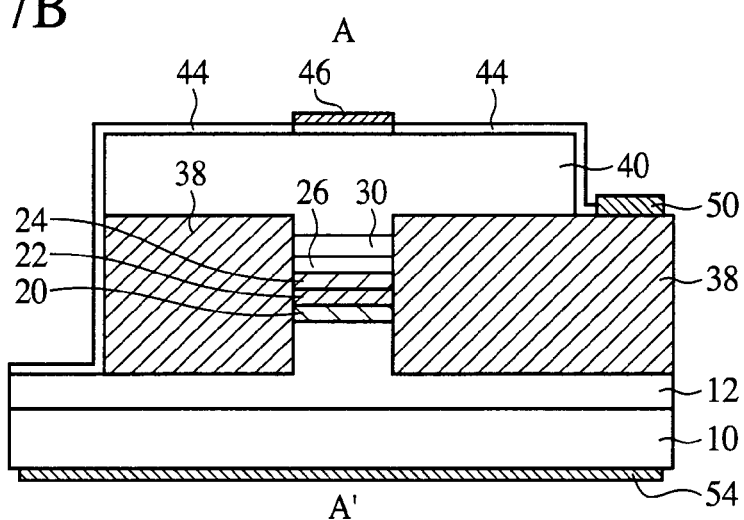
Figure 7C:
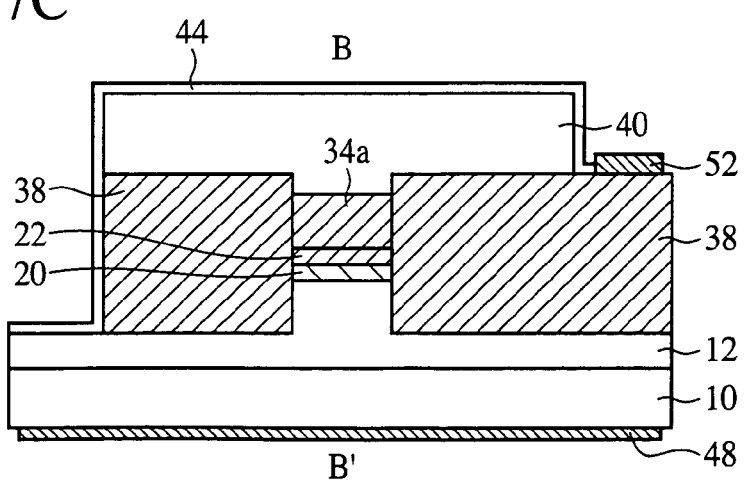

FIGS. 7A–7C are diagrammatic sectional views of the photosemiconductor device according to the present embodiment which show the structure thereof. FIG. 7A is a diagrammatic sectional view in the direction of extension of the mesa stripe. FIG. 7B is the diagrammatic sectional view of the TTG laser part along the line A–A' in FIG. 7A. FIG. 7C is the diagrammatic sectional view of the SOA part along the line B–B' in FIG. 7A.

As shown in FIGS. 7A and 7B, the photosemiconductor device according to the present embodiment has the TTG laser part of the same structure as that of the photosemiconductor device according to the first embodiment but has the SOA part which is different from the SOA part of the photosemiconductor device according to the first embodiment in that in the former SOA part the MQW active layer 20 and the n type InP layer are upside down and in that the intermediate layer 20 is extended in the SOA part. That is, as shown in FIGS. 7A and 7C, the intermediate layer 22 and an upper clad layer 34a of an n type InP layer are formed on the MQW active layer 20 of the SOA part. Such change of the layer structure of the SOA part positions the electrode 48 for injecting current into the SOA on the second surface with no element formed on, i.e. the underside of the semiconductor substrate 10 of the SOA part.

In the photosemiconductor device according to the present embodiment, a prescribed voltage is applied between the electrode 48 and the electrode 52 to inject current from the electrode 48 into the SOA. The current injected from the electrode 48 is injected into the MQW active layer 20 via the semiconductor substrate 10 and the p type InP layer 12 to be led out from the electrode 52 via the intermediate layer 22, the upper clad layer 34a and the buried layer 38. A prescribed current is injected into the MQW active layer 20, whereby light propagating in the MQW active layer 20 can be amplified. At this time, the n type InP layer formed of the intermediate layer 22 and the upper clad layer 34a and having some thickness, which is formed on the MQW active layer, permits the current to be injected into the active layer with the electric resistance kept low.

Accordingly, when the wavelength variation control in the TTG laser part and the light amplification control in the SOA part are performed independently of each other, the heating in the SOA part is suppressed, the large longer wavelength-side shift and the gain decrease of the gained wavelengths are depressed, and high photooutputs can be realized while continuous wide wavelength variation widths are retained.

The photosemiconductor device according to the present embodiment can be fabricated by omitting the steps of the method for fabricating the photosemiconductor device according to the first embodiment shown in FIGS. 2A and 2B, and leaving the intermediate layer 22 in the step shown in FIG. 3A and growing the upper clad layer 34a of an n type InP layer on the intermediate layer 22.

As described above, according to the present embodiment, the TTG-DFB laser and the SOA are integrated on the semiconductor substrate, whereby characteristics of the TTG-DFB laser, the continuous, wide wavelength variation range can be obtained, and the photooutput can be much increased by the SOA.

In the present embodiment, the intermediate layer 22 is left in the SOA part, but the intermediate layer 22 may be removed.

In the structure exemplified in FIG. 1B, the electrode 48 may be formed on the upper surface of the left side of the buried layer 38.

The present embodiment corresponds to the photosemiconductor device according to the first embodiment whose structure of the SOA part is thus changed but may correspond to the photosemiconductor device according to the second embodiment whose structure of the SOA part is thus changed.

[A Fifth Embodiment]

The photosemiconductor device and the method for fabricating the photosemiconductor device according to a fifth embodiment of the present invention will be explained with reference to FIG. 8. The same members of the present embodiment as those of the photosemiconductor device and the method for fabricating the photosemiconductor device according to the first to the fourth embodiments shown in FIGS. 1A–1C, 2A–2D, 3A–3D, 4A–4C, 5A–5D, 6 and 7A–7C are represented by the same reference numbers not to repeat or to simplify their explanation.

Figure 8:
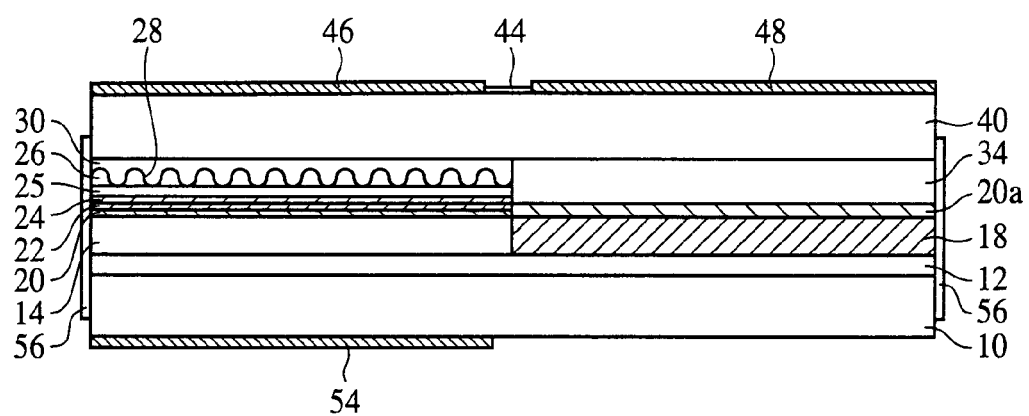
FIG. 8 is a sectional view of the photosemiconductor device according to a fifth embodiment of the present invention, which shows a structure thereof.

FIG. 8 is a diagrammatic sectional view of the structure of the photosemiconductor device according to the present embodiment.

The basic structure of the photosemiconductor device according to the present embodiment is the same as that of the photosemiconductor device according to the first embodiment shown in FIGS. 1A–1C. The photosemiconductor device according to the present embodiment is characterized in that the TTG laser part and the SOA part are different from each other in the structure of the active layer.

The photosemiconductor device according to the present embodiment has the structure of the MQW active layer 20 of the TTG laser part which is the same as that of the photosemiconductor device according to the first embodiment. The MQW active layer 20a of the SOA part is different from the MQW active layer 20 of the TTG laser and has the following structure.

That is, on the lower clad layer 18, a 40 nm-thickness SCH layer of InGaAsP of a 1.25 μm-composition is formed. On the SCH layer, a 10 nm-thickness barrier layer of InGaAsP of a 1.25 μm-composition and a 5.1 nm-thickness well layer of InGaAsP with a 0.8% compressive strain introduced in are repeatedly laid the latter on the former in a 6-layer well layers, forming a multiple quantum well layer having a 1.54 μm PL wavelength of the MQW. A 40 nm-thickness SCH layer of a 1.25 μm-composition is formed on the multiple quantum well layer.

Then, on the lower clad layers 14, 18, a 100 nm-thickness SCH layer of InGaAsP of a 1.15 μm-composition and a 40 nm-thickness SCH layer of InGaAsP of a 1.25 μm-composition are formed by, e.g., MOCCVD.

Such structure of the photosemiconductor device allows the TTG-DFB laser and the SOA to have the respective structures optimized as required.

As described above, according to the present embodiment, the TTG-DFB laser and the SOA have active layer structures different from each other, which allows the TTG-DFB laser and the SOA to have the respective structures optimized.

The present embodiment corresponds to the photosemiconductor device according to the first embodiment whose structure of the SOA part is changed but may correspond to the photosemiconductor device according to the second to the fourth embodiments whose structure of the SOA part is thus changed.

The structure of the active layer of the SOA part is not limited to the structure described in the present embodiment.

[A Sixth Embodiment]

The photosemiconductor device and the method for fabricating the photosemiconductor device according to a sixth embodiment of the present invention will be explained with reference to FIG. 9. The same members of the present embodiment as those of the photosemiconductor device and the method for fabricating the photosemiconductor device according to the first to the fifth embodiment shown in FIGS. 1A–1C, 2A–2D, 3A–3D, 4A–4C, 5A–5D, 6, 7A–7C and 8 are represented by the same reference numbers not to repeat or to simplify their explanation.

Figure 9:
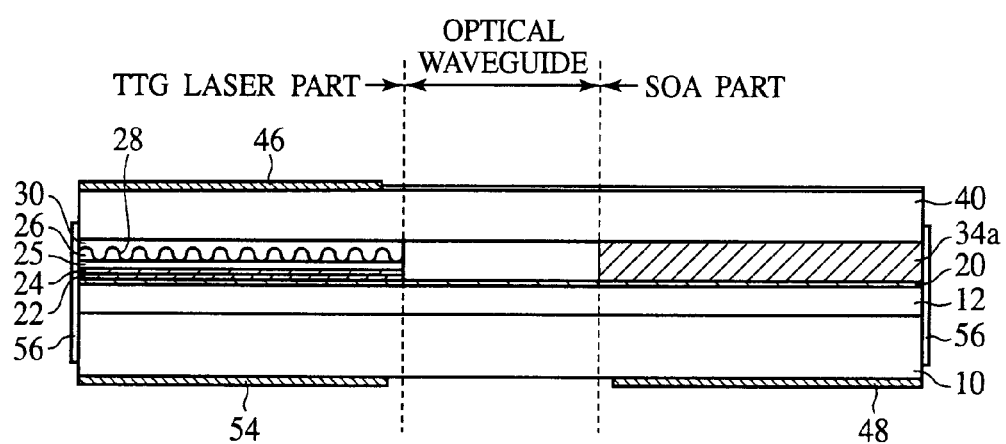
FIG. 9 is a sectional view of the photosemiconductor device according to a sixth embodiment of the present invention, which shows a structure thereof.

FIG. 9 is a diagrammatic sectional view of the photosemiconductor device according to the present embodiment, which shows the structure thereof.

The photosemiconductor device according to the present embodiment corresponds to the photosemiconductor device according to the fourth embodiment shown in FIGS. 7A–7C which characteristically includes an optical waveguide part which is disposed between the TTG laser part and the SOA part and does not contribute to the light oscillation and light amplification. The optical waveguide part has a length of, e.g., 100–1000 µm.

In the photosemiconductor device according to the fourth embodiment, the current to be injected into the active layer of the TTG-DFG laser and the current to be injected into the active layer of the SOA are both injected from the side of the semiconductor substrate 10. Accordingly, in the photosemiconductor device according to the present embodiment, the TTG laser part and the SOA part more tend to electrically interfere with each other than in the photosemiconductor device according to the first to the third embodiments.

The presence of the optical waveguide part between the TTG laser part and the SOA part as in the photosemiconductor device according to the present embodiment can increase the resistance between the electrodes 54 and the electrode 48 to thereby suppress the electric interference between the TTG laser part and the SOA part.

As described above, according to the present embodiment, the optical waveguide part is disposed between the TTG laser part and the SOA part, whereby the electric interference between the TTG laser and the SOA part can be suppressed.

[A Seventh Embodiment]

The photosemiconductor device and the method for fabricating the photosemiconductor device according to a seventh embodiment of the present invention will be explained with reference to FIG. 10. The same members of the present embodiment as those of the photosemiconductor device and the method for fabricating the photosemiconductor device according to the first to the sixth embodiments shown in FIGS. 1A–1C, 2A–2D, 3A–3D, 4A–4C, 5A–5D, 6, 7A–7C, 8 and 9 are represented by the same reference numbers not to repeat or to simplify their explanation.

Figure 10:
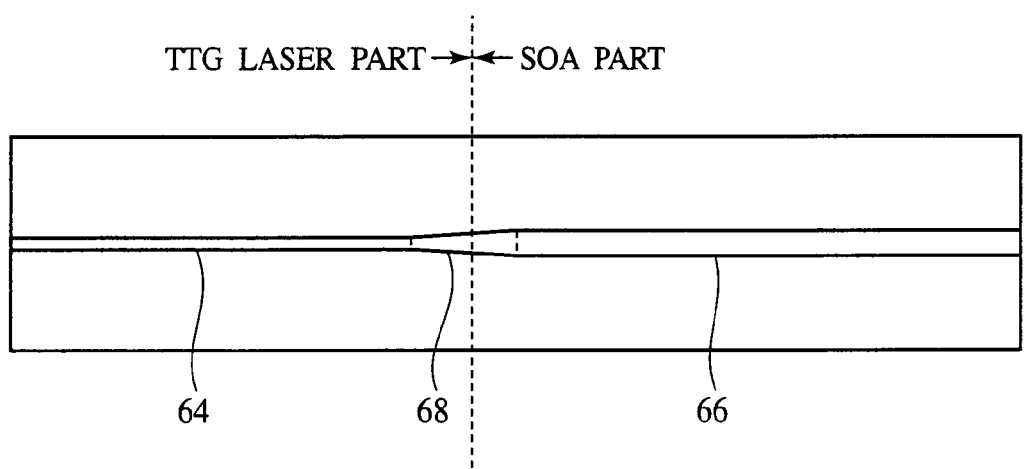
FIG. 10 is a plan view of the photosemiconductor device according to a seventh embodiment of the present invention, which shows a structure thereof.

FIG. 10 is a plan view of the photosemiconductor device according to the present embodiment, which shows the structure thereof.

As shown in FIG. 10, the photosemiconductor device according to the present embodiment is characterized in that the mesa stripe 64 of the TTG laser part and the mesa stripe 66 of the SOA part are different from each other in width, and a tapered optical waveguide 68 of a configuration having the width continuously changed is disposed between the TTG laser part and the SOA part.

When the device structure is optimized in accordance with respective requirements of the TTG-DFB laser and the SOA, the width of the active layer (the width of the mesa stripe 64) of the TTG-DFB laser and the width of the active layer (the width of the mesa stripe 66) of the SOA are often different from each other. In such case, as in the photosemiconductor device according to the present embodiment, the tapered optical waveguide 68 is disposed between the TTG laser part and the SOA part, whereby the light loss between the TTG-DFB laser and the SOA can be decreased.

To be specific, when the width of the active layer of the TTG-DFB laser is 1.0 µm, and the width of the active layer of the SOA is 1.6 µm, the tapered optical waveguide 68 of a 100 µm or more length is disposed between the TTG laser part and the SOA part, whereby the light loss between the TTG-DFB laser and the SOA can be effectively decreased.

The optical waveguide part which does not contribute to the light oscillation and the light amplification as in the sixth embodiment is disposed between the TTG laser part and the SOA part, the configuration of the optical waveguide part may be tapered.

As described above, according to the present embodiment, the tapered optical waveguide is disposed between the TTG laser part and the SOA part, whereby the light loss between the TTG-DFB laser and the SOA can be decreased.

[An Eighth Embodiment]

The photosemiconductor device and the method for fabricating the photosemiconductor device according to an eighth embodiment of the present invention will be explained with reference to FIG. 11. The same members of the present embodiment as those of the photosemiconductor device and the method for fabricating the photosemiconductor device according to the first to the seventh embodiments shown in FIGS. 1A–1C, 2A–2D, 3A–3D, 4A–4C, 5A–5D, 6, 7A–7C, 8, 9 and 10 are represented by the same reference numbers not to repeat or to simplify their explanation.

Figure 11:
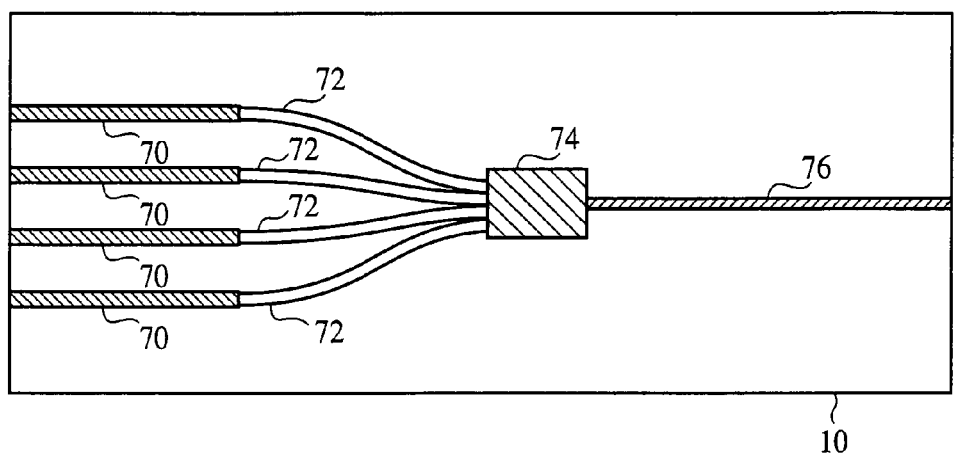
FIG. 11 is a plan view of the photosemiconductor device according to an eighth embodiment of the present invention, which shows a structure thereof.

FIG. 11 is a plan view of the photosemiconductor device according to the present embodiment, which shows the structure thereof.

On a semiconductor substrate 10 there are formed a plurality of TTG-DFB lasers 70, a plurality of optical waveguides 72 connected to respective one ends of the TTG-DFB lasers 70, an optical coupler 74 for coupling light propagating through the plurality of optical waveguides 72, and an SOA 76 for amplifying light output from the optical coupler 74.

The respective TTG-DFB lasers 70 have oscillation central wavelengths which are different from one another. The TTG-DFB lasers 70 can be the TTG-DFB lasers of the photosemiconductor device according to the first to the sixth embodiments. The SOA can be the SOA of the photosemiconductor device according to the first to the sixth embodiments.

The optical waveguide 72 may comprise an InGaAsP layer as the core layer, and InP layers as the clad layers. The lower clad layer can be a p type InP layer, e.g. of a 750 nm-thickness and a $2 \times 10^{17}$ cm$^{-3}$ dopant dose. The core layer can be a non-doped InGaAsP layer, e.g. of a 200 nm-thickness and a 1.3 µm-composition. The upper clad layer can be a p type InP layer, e.g., a 350 nm-thickness and a $2 \times 10^{17}$ cm$^{-3}$ dopant dose.

The optical coupler 74 can be, e.g., a multi-mode interference waveguide (MMI) coupler. When the MMI optical coupler is used, the size is about 40×300 µm.

As described above, the photosemiconductor device according to the present embodiment is characterized mainly in that a plurality of TTG-DFB lasers and one SOA are integrated on the semiconductor substrate. The photosemiconductor device is thus structured, whereby a wide wavelength variation range can be provided by the plurality of TTG-DFB lasers, and the output light can be much intensified by the SOA.

[A Ninth Embodiment]

(Integration of TTG-LD and Optical Waveguide on One and the Same Substrate)

One means for preparing a photosemiconductor device which can provide a wide wavelength variation range by using TTG-LD will be the same means as the array of lasers, such as DFB (Distributed FeedBack Laser Diode) or others (refer to, e.g., OFC2000, Technological Digest Series, p. 178, etc.), as in the photosemiconductor device according to the eighth embodiment. This array of lasers is means of integrating on one and the same substrate a plurality of lasers having different oscillation wavelengths, optical waveguides connected to the respective lasers, an optical coupler for coupling laser beams from the optical waveguides, and an SOA (Semiconductor Optical Amplifier) for amplifying the laser beam output from the optical coupler.

Figure 12:
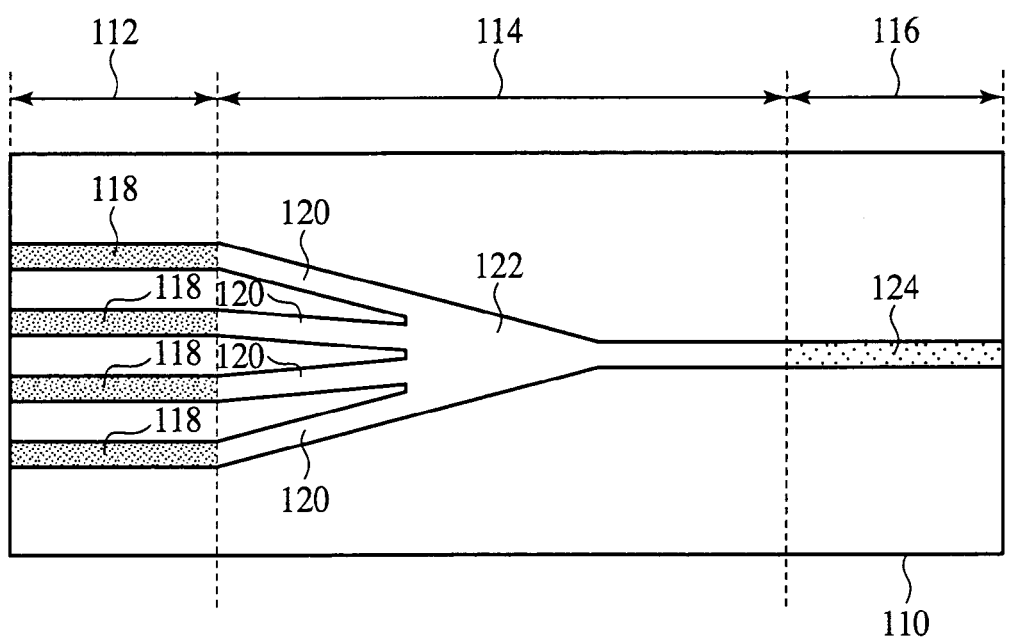
FIG. 12 is a plan view of the photosemiconductor device with a plurality of TTG-LDs arrayed on one and the same substrate, which shows a structure thereof.

FIG. 12 is a plan view of the photosemiconductor device comprising 4 TTG-LDs integrated on one and the same substrate by the above-described arraying means, which shows the structure thereof. As shown, on a semiconductor substrate 110, a TTG-LD array part 112, an optical waveguide part 114 and an SOA part 116 are provided. In the TTG-LD array part 112, a plurality of TTG-LDs 118 having central oscillation wavelengths different from one another are formed. In the optical waveguide part 114, a plurality of optical waveguides 120 connected to respective one ends of the TTG-LDs 118, and an optical coupler 122 for coupling light propagating through the plurality of optical waveguides 120 are formed. In the SOA part 116, an SOA 124 for amplifying the laser beam output from the optical coupler 122 is formed.

To operate the photosemicondcutor device shown in FIG. 12, out of the array of the plurality of TTG-LDs 118, one TTG-LD 118 to be driven is selected, and a rough oscialation wavelength is decided. Then, the oscillation wavelength of the selected TTG-LD 118 is controlled to thereby control the wavelength of the laser beam more precisely.

The laser beam output from the selected TTG-LD 118 propagates through the optical waveguide connected to one end of the selected TTG-LD 118 and then is input to the SOA 124 via the optical coupler 122. The SOA 124, which has received the laser beam, amplifies the output of the laser beam which has been attenuated by propagating through the optical waveguide 120 and the optical coupler 122 and outputs the laser beam at the exit end surface.

The plurality of TTG-LDs 118, the SOA 122, the optical waveguides 120 and the optical coupler 122 interconnecting the TTG-LDs 118 and the SOA 124, are integrated on the semiconductor substrate 110, whereby a wide wavelength variation range can be obtained without lowering the photooutput.

The steps of fabricating the photosemiconductor device having the TTG-LDs thus arrayed will be as follows.

First, on the semiconductor substrate, a layer structure including a wavelength tuning layer, an intermediate layer and an active layer of TTG-LD is formed.

Then, a mask is formed in the region except the region for the optical waveguides and the optical coupler to be formed in, and then the layer structure including the wavelength tuning layer, the intermediate layer and the active layer in the region for the optical waveguides and the optical coupler to be formed in is etched off.

Then, in the region for the optical waveguides and the optical coupler to be formed in, a layer structure including the clad layer and the core layer, which is designed to be optically coupled with the optical waveguides inside the TTG-LDs is formed.

Next, the mask formed in the region except the region of the optical waveguides and the optical coupler is removed, and then a mask for forming the stripe structure of the TTG-LD array part and the stripe structure of the optical waveguide part is formed.

Then, the stripe structure of the TTG-LD array part and the stripe structure of the optical waveguide part are formed by etching.

Then, a buried layer for covering the side surfaces of the stripe structure of the TTG-LD array part and the stripe structure of the optical waveguide part is formed to thereby bury the stripe structure of the TTG-LD array part and the stripe structure of the optical waveguide part in one and the same buried layer.

Here, TTG-LD array part and the optical waveguide part may be buried in discrete buried layers. However, from the viewpoint of simplifying the fabrication process, etc., usually the stripe structure of the TTG-LD array part and the stripe structure of the optical waveguide part will be buried in one and the same buried layer.

Figure 13:
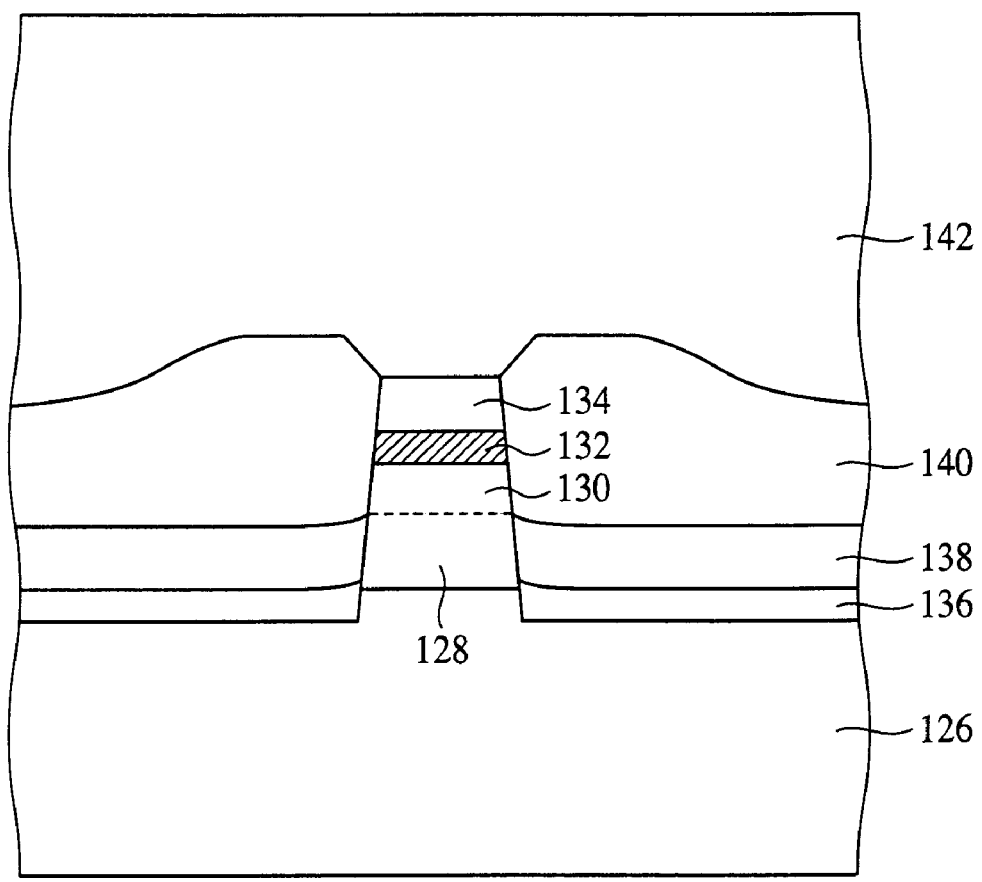
FIG. 13 is a sectional view of the photosemiconductor device with a TTG-LD and an optical waveguide formed on one and the same substrate, which shows a structure of the optical waveguide part.

As described above, when the TTG-LDs and the optical waveguides are integrated on one and the same substrate by the above-described process, the stripe structure of the TTG-LD array part and the stripe structure of the optical waveguide part are buried in one and the same buried layer. Accordingly, the following disadvantage will take place when the TTG-LDs are operated. This disadvantage will be explained with reference to FIG. 13. FIG. 13 is a sectional view of the photosemiconductor device with the TTG-LDs and the optical waveguides integrated on one and the same substrate by the above-described process, which show the structure of the optical waveguide part.

When the photosemiconductor device is fabricated by the above-described process, the buried layer filling the stripe structure of the TTG-LD array part is electrically connected to the intermediate layer of the respective TTG-LDs and earth potential, and is the common earth potential of the photosemiconductor device.

On the other hand, the stripe structure of the optical waveguide part is also buried in the same buried layer that the stripe structure of the TTG-LD part is. When the stripe structure of the TTG-LD part is buried in the buried layer of, e.g., n type InP, the stripe structure of the optical waveguide is also buried in the same buried layer of n type InP. The optical waveguide part has the structure as exemplified in FIG. 13. As shown, on the semiconductor substrate 126 of p type InP, a buffer layer 128 of p type InP, a lower clad layer 130, a core layer 132 and the upper clad layer 134 are formed. The buffer layer 128, the lower clad layer 130, the core layer 132 and the upper clad layer 134 are patterned in a mesa, forming a mesa stripe. On both sides of the mesa stripe, an n type InP buried layer 136 and a p type InP buried layer 138 and an n type InP buried layer 140 are formed. A cap layer 142 of p type InP is formed on the upper clad layer 134 and the n type InP buried layer 140.

With the optical waveguide part of the structure shown in FIG. 13, when current for the wavelength control is injected into the wavelength tuning layer of the TTG-LDs from the lower electrode formed on the second surface with no element formed on, i.e. the underside of the substrate of the TTG-LD array part, the current for the wavelength control flows also in the following route because the n type InP buried layer 140 is connected to the earth potential. That is, the current for the wavelength control flows through the lower clad layer 130 and the core layer 132 of the optical waveguide part, then through the n type InP buried layer 140 on both sides of the core layer 132 and to the outside earth potential. This means the current injection into the wavelength tuning layer is less effective.

In the case that the TTG-LD and the optical waveguide are integrated on one and the same substrate and both stripe structures are buried in one and the same buried layer, such a case of arraying the TTG-LDs as described above, it is conceivable that the efficiency of the current injection into the wavelength tuning layer of the TTG-LDs is lowered, which will lead to the occurrence of malfunction in which efficiency of the wavelength conversion for the injected current is lowered.

The photosemiconductor device and the method for fabricating the photosemiconductor device according to a ninth to an eleventh embodiments of the present invention which will be described in detail below can realize the suppression of the decrease of the efficiency of the current injection into the wavelength tuning layer of the TTG-LD and realize the increase of the efficiency of the wavelength conversion for the injected current.

(The Photosemiconductor Device and the Method for Fabricating the Photosemiconductor Device According to the Ninth Embodiment)

Figure 14:
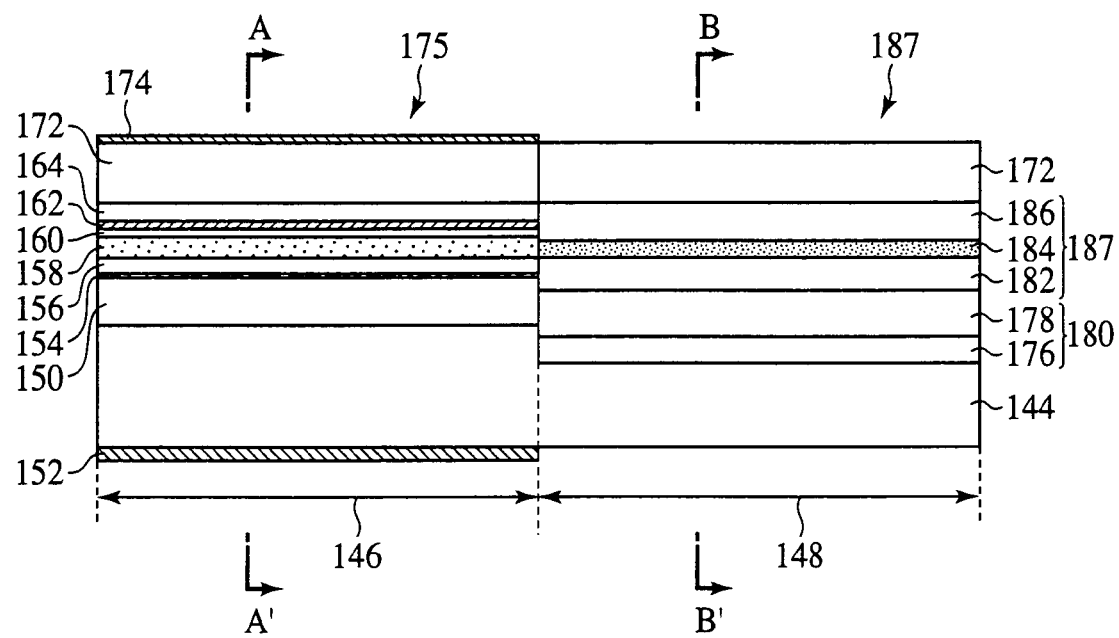
FIG. 14 is a sectional view of photosemiconductor device according to a ninth embodiment along the extension direction of the mesa stripe.
Figure 15:
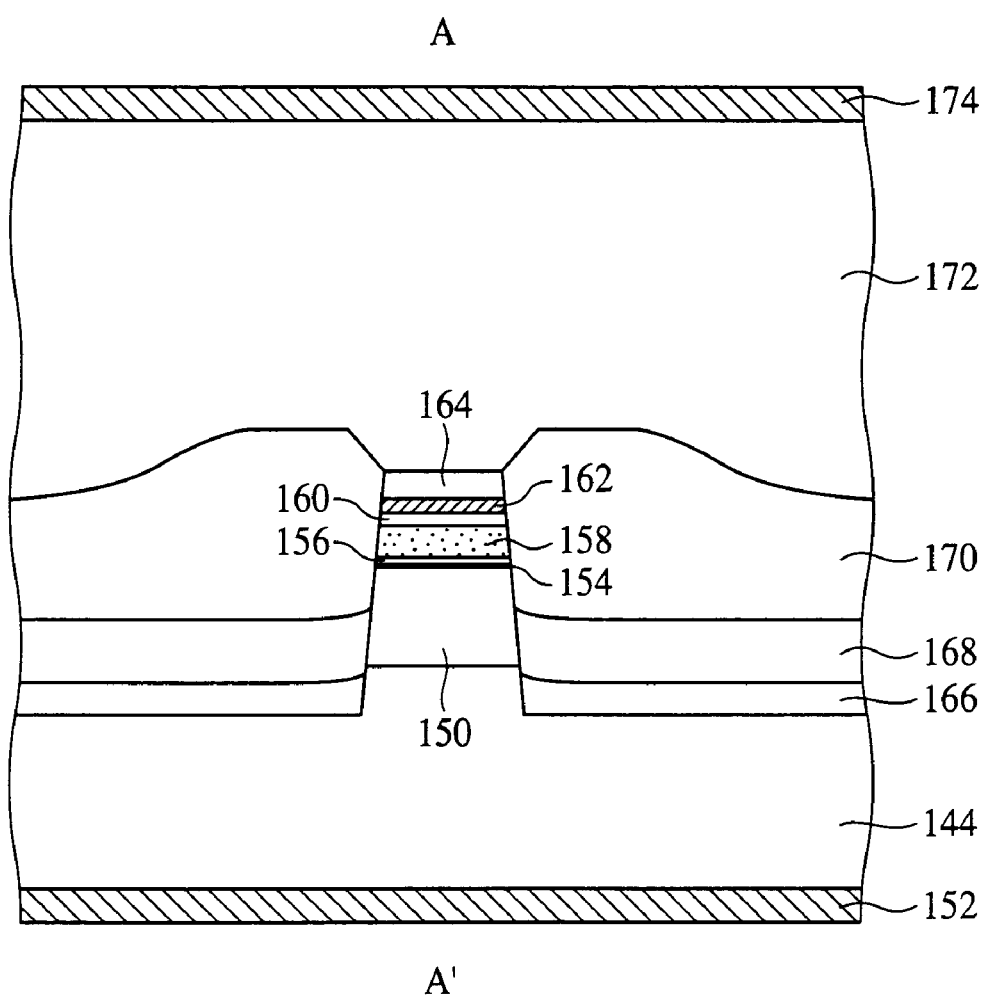
FIG. 15 is a sectional view of the photosemiconductor device according to the ninth embodiment, which shows a structure of the TTG-LD part.
Figure 16:
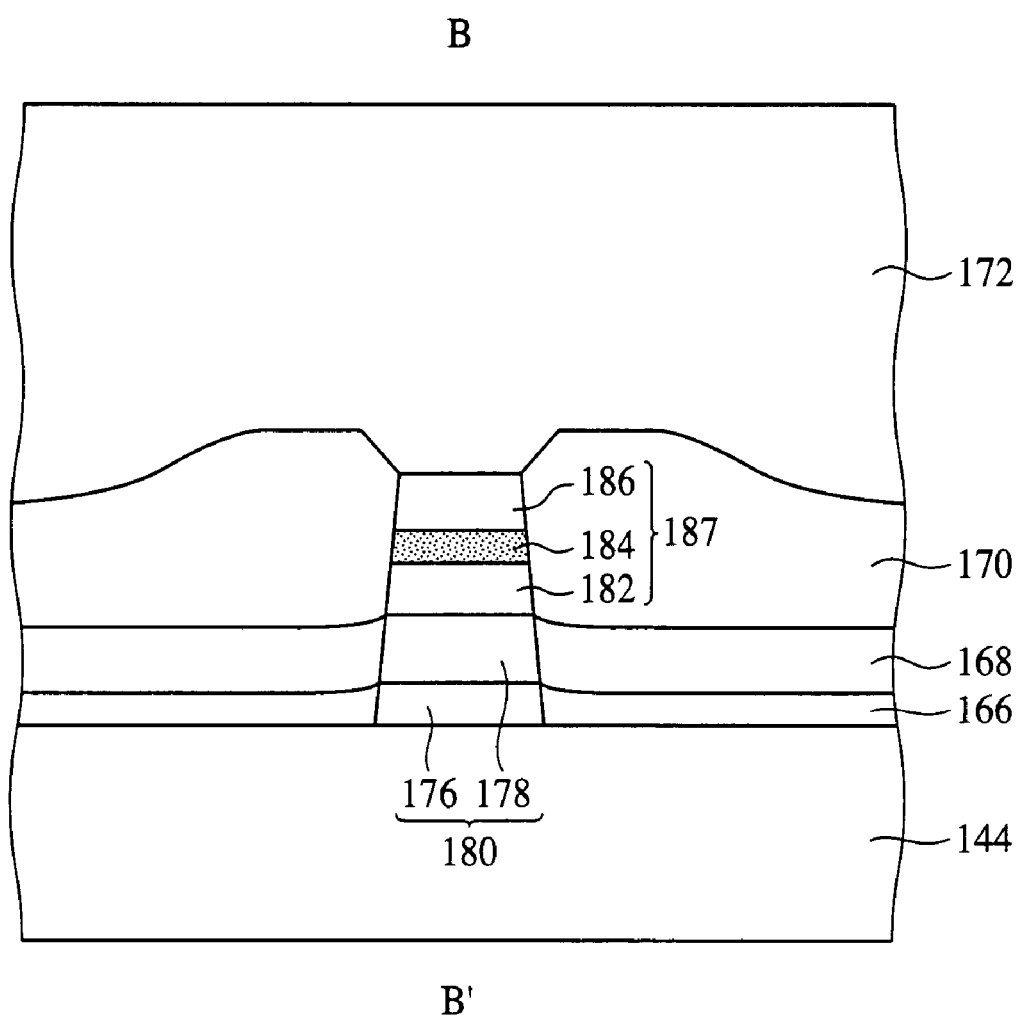
FIG. 16 is a sectional view of the photosemiconductor device according to the ninth embodiment of the present invention, which shows a structure of the optical waveguide part.

The photosemiconductor device and the method for fabricating the photosemiconductor device according to the ninth embodiment of the present invention will be explained with reference to FIGS. 14, 15, 16, 17A–17B, 18A–18B, 19A–19B, 20A–20C, 21A–21C, 22A–22C and 23A–23B. FIG. 14 is a sectional view of the photosemiconductor device according to the present embodiment in the direction of extension of the mesa strip thereof. FIG. 15 is a sectional view of the photosemiconductor device according to the present embodiment, which shows the structure of the TTG-LD part. FIG. 16 is a sectional view of the photosemiconductor device according to the present embodiment, which shows the structure of the optical waveguide part. FIGS. 17A–17B, 18A–18B, 19A–19B, 20A–20C, 21A–21C, 22A–22C and 23A–23B are bird's-eye views and sectional views of the photosemiconductor device in the steps of the method for fabricating the photosemiconductor device, which show the method.

First, the photosemiconductor device according to the present embodiment will be explained with reference to FIGS. 14, 15 and 16. FIG. 15 is the sectional view along the line A–A' in FIG. 14. FIG. 16 is the sectional view along the line B–B'.

As shown in FIG. 14, on a semiconductor substrate 144 of p type InP, a TTG-LD part 146 and an optical waveguide part 148 are provided.

The TTG-LD part 146 has the sectional structure as shown in FIG. 15.

On the semiconductor substrate 144, a buffer layer 150 of p type InP is formed. A p type electrode 152 for the wavelength control is formed on the second surface with no element formed on, i.e. the underside of the semiconductor substrate 144. In this specification, the first surface of the semiconductor substrate means the upper surface of the semiconductor substrate with the element formed on, and the second surface of the semiconductor device means underside of the semiconductor device with no element formed on.

On the buffer layer 150, a quaternary diffraction grating layer 154 with a diffraction grating formed in, a spacer layer 156 of p type InP, a wavelength tuning layer, i.e., a wavelength tuning layer 158 of non-doped InGaAsP, an intermediate layer 160 of n type InP, an MQW active layer 162 of InGaAsP, and a clad layer 164 of p type InP are laid sequentially the latter on the former. These layers, and an upper part of the semiconductor substrate 144, are etched to form a mesa stripe. The buffer layer 150 may be made thick enough to hinder the mesa stripe to be etched down to the semiconductor substrate 144.

On the semiconductor substrate 144 on both sides of the mesa stripe, an n type InP buried layer 166, a p type InP buried layer 168 and an n type InP buried layer 170 are sequentially formed, which bury the mesa stripe covering both sides of the mesa stripe. These buried layers form a current restricting structure. The n type InP buried layer 170 is electrically connected to the intermediate layer 160.

On the n type InP buried layer 170 and the clad layer 164 of the mesa stripe, a cap layer 172 of p type InP is formed.

On the cap layer 172, a p type electrode 174 for injecting current into the MQW active layer 162 is formed, electrically connected to the MQW active layer 162 via the cap layer 172 and the clad layer 164.

On the n type InP buried layer 170, an n type electrode (not shown) which is set to the earth potential is formed, electrically connected to the intermediate layer 160 via the n type InP buried layer 170.

Thus, the TTG-LD 175 is formed in the TTG-LD part 146 of the semiconductor substrate 144.

The optical waveguide part 148 has the sectional structure as shown in FIG. 16.

On the semiconductor substrate 144, a mesa stripe is formed by laying a rectifying layer 180 of an n type InP layer 176 and a p type InP layer 178 laid the latter on the former, a lower clad layer 182 of non-doped InP, a core layer 184 of non-doped InGaAsP and an upper clad layer 186 of non-doped InP laid the latter on the former and by etching the layers.

On the semiconductor substrate 144 on both sides of the mesa stripe, an n type InP buried layer 166, a p type InP buried layer 168 and an n type InP buried layer 170 are formed sequentially in the stated order, which bury the mesa stripe covering both sides of the mesa stripe. The n type InP buried layer 166 is formed in substantially the same film thickness as the n type InP layer 176 of the mesa stripe, and the p type InP buried layer 168 is formed in substantially the same film thickness as the p type InP layer 178 of the mesa stripe. Thus, the optical waveguide layer, i.e., the lower clad layer 182, the core layer 184 and the upper clad layer 186 are buried by the n type InP buried layer 170. The n type InP buried layer 170 electrically connected to the intermediate layer 160 is insulated by the rectification structure, which is formed between the semiconductor substrate 144 and the n type InP buried layer 170 and is formed of the n type InP buried layer 166 and the p type InP buried layer 168, whose conduction types are different from each other and laid the latter on the former. Thus, the mesa stripe of the optical waveguide part 148 is buried by one and the same buried layers that the mesa stripe of the TTG-LD part 146 is buried.

Thus, in the optical waveguide part 148 of the semiconductor substrate 144, the optical waveguide 187 having the InGaAsP layer as the core layer and the InP layer as the clad layer is formed.

On the n type InP buried layer 170 and the upper clad layer 186, a cap layer 172 of p type InP is formed.

The mesa stripe of the TTG-LD part 146 and the mesa stripe of the optical waveguide part 148 are arranged continuous to each other as shown in FIG. 14. The TTG-LD part 146 and the optical waveguide part 148 are thus connected to each other so as to decrease the optical loss.

Thus, the photosemiconductor device according to the present embodiment is constituted.

The photosemiconductor device according to the present embodiment is characterized mainly in that the rectifying layer 180 formed of the n type InP layer 176 and the p type InP layer 178 laid the latter on the former is formed below the optical waveguide 187 including the lower clad layer 182, the core layer 184, and the upper clad layer 186.

Next, the operation of the photosemiconductor device according to the present embodiment will be explained, and effects of providing the rectifying layer 180 below the optical waveguide 187 will be explained with reference to FIGS. 14, 15 and 16.

In the TTG-LD part 146, a prescribed voltage is applied between the p type electrode 174 and the n type electrode (not shown) electrically connected to the n type InP buried layer 170 to inject current from the p type electrode 174. The current injected from the p type electrode 174 is injected into the MQW active layer 162 via the cap layer 172 and the clad layer 164 to be led out from the n type electrode via the intermediate layer 160 and the n type InP buried layer 170. A current of above an oscillation threshold value is injected into the MQW active layer 162, whereby the light emitted in the MQW active layer 162 is oscillated by the diffraction grating formed in the quaternary diffraction grating layer 154.

Simultaneously therewith, a prescribed voltage is applied between the p type electrode 152 on the second surface with no element formed on, i.e. the underside of the semiconductor substrate 144 and the n type electrode (not shown) electrically connected to the n type InP buried layer 170 to inject current from the p type electrode 152. The current injected from the p type electrode 152 is injected into the wavelength tuning layer 158 via the semiconductor substrate 144, the buffer layer 150, the quaternary diffraction grating layer 154 and the spacer layer 156 to be led out from the n type electrode via the intermediate layer 160 and the n type InP buried layer 170. The current is injected into the wavelength tuning layer 158, whereby the refractive index is decreased due to the plasma effect, and the effective refractive index of the optical waveguide layer is decreased. This shortens the oscillation wavelength. Accordingly, the oscillation wavelength of the TTG-LD can be controlled by the current injected in the wavelength tuning layer 158.

As described above, in the optical waveguide part 148, the rectifying layer 180 is formed of the n type InP layer 176 and the p type InP layer 178 laid the latter on the former between the semiconductor substrate 144 and the optical waveguide 187. The buried layers burying the mesa stripe of the optical waveguide part 148 is the rectification structure formed of the n type InP buried layer 166, the p type InP buried layer 168 and the n type InP buried layer 170 laid the latter on the former. Thus, the rectifying layer 180 and the buried layers which have rectification structure insulate the optical waveguide 187 from the semiconductor substrate 144. Thus, when current is injected into the wavelength tuning layer 158, the generation of leak current which flows from the semiconductor substrate 144 to the optical waveguide 187 and flows to the earth potential through the n type InP buried layer 170 on both sides of the optical waveguide 187 can be suppressed. Accordingly, upon the oscillation wavelength control of the TTG-LD 175, current can be injected very effectively into the wavelength tuning layer 158, and the wavelength conversion efficiency for the injected current can be improved.

The laser beam output from the TTG-LD thus controlled by a prescribed oscillation wavelength is input to the optical waveguide 187 and propagates on inside the core layer 184 of the optical waveguide 187.

Then, the method for fabricating the photosemiconductor device according to the present embodiment will be explained with reference to FIGS. 17A–17B, 18A–18B, 19A–19B, 20A–20C, 21A–21C, 22A–22C and 23A–23B. FIGS. 17A–17B, 18A–18B and 19A–19B are bird's-eye views of the photosemiconductor device according to the present embodiment in the steps of the method for fabricating the photosemiconductor device, which show the method. FIGS. 20A–20C, 21A–21C, 22A–22C and 23A–23B are sectional views of the TTG-LD part of the photosemiconductor device according to the present embodiment in the steps of the method for fabricating the photosemiconductor device, which show the method.

First, the buffer layer 150 of p type InP of, e.g., a 1 μm-thickness is formed on the semiconductor substrate 144 of p-InP by, e.g., MOCVD (Metal Organic Chemical Vapor Deposition).

On the buffer layer 150, a p type InGaAsP layer of, e.g., a 0.07 μm-thickness and $\lambda_{PL}$ (PL (PhotoLuminescence) peak wavelength)=1.2 μm is formed by, e.g., MOCVD. Then, the diffraction grating of, e.g., 240 nm-cycle is formed by, e.g., EB (Electron Beam) exposure or others in the p type InGaAsP layer in the region for the TTG-LD to be formed in. Thus, the quaternary diffraction grating layer 154 is formed.

Next, on the quaternary diffraction grating layer 154, the spacer layer 156 of p type InP of, e.g., a 0.1 μm-thickness is formed by, e.g., MOCVD.

Then, on the spacer layer 156, the wavelength tuning layer 158 of non-doped InGaAsP of, e.g., a 0.3 m-thickness and $\lambda_{PL}$=1.3 μm is formed by, e.g., MOCVD.

Then, on the wavelength tuning layer 158, the intermediate layer 160 of n type InP of, e.g., a 0.15 μm-thickness is formed by, e.g., MOCVD.

Next, on the intermediate layer 160, the MQW active layer 162 having a multiple quantum well structure is formed by, e.g., MOCVD. The MQW active layer 162 is formed by laying a non-doped InGaAsP barrier layer, e.g., of 0.01 μm-thickness and $\lambda_{PL}$=1.3 μm and a non-doped InGaAsP well layer, e.g. of a 0.005 μm-thickness and $\lambda_{PL}$=1.55 μm the latter on the former, e.g., 7 times, and a non-doped InGaAsP SCH (Separate Confinement Heterostructure) layer, e.g., of a 0.02 μm and $\lambda_{PL}$=1.55 μm in the stated order.

Then, on the MQW active layer 162, the clad layer 164 of n type InP of, e.g., a 0.2 μm-thickness by, e.g., MOCVD.

Figure 17A:
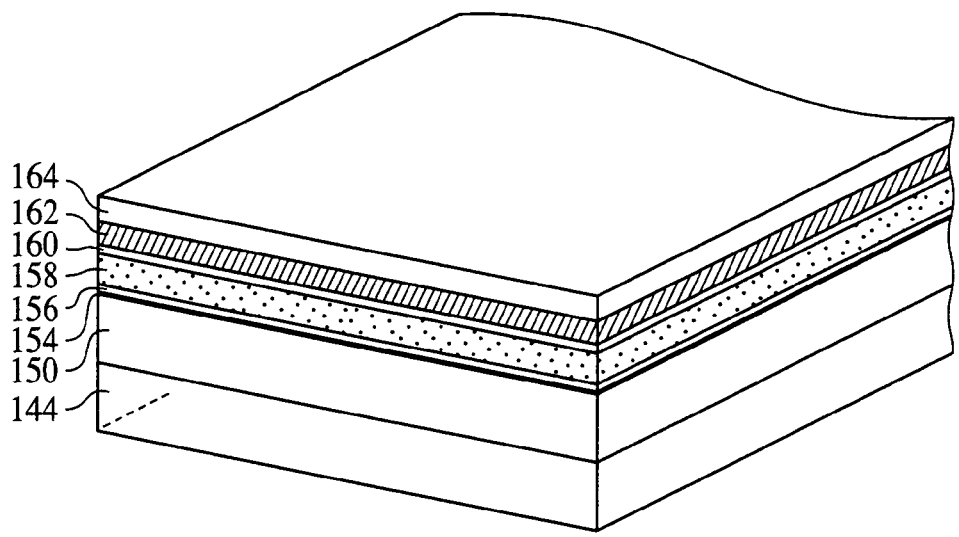
FIGS. 17A–17B are bird's-eye views of the photosemiconductor device according to the ninth embodiment of the present invention in the steps of the method for fabricating the phtosemiconductor device, which show the method (Part 1).

Thus, on the semiconductor substrate 144, the layer structure for forming the TTG-LD is formed (refer to FIG. 17A).

Next, the silicon oxide film 188 is formed on the clad layer 164 by, e.g., CVD.

Then, the silicon oxide film 188 in the optical waveguide part 148 is selectively removed by photolithography, and wet or dry etching.

Figure 17B:
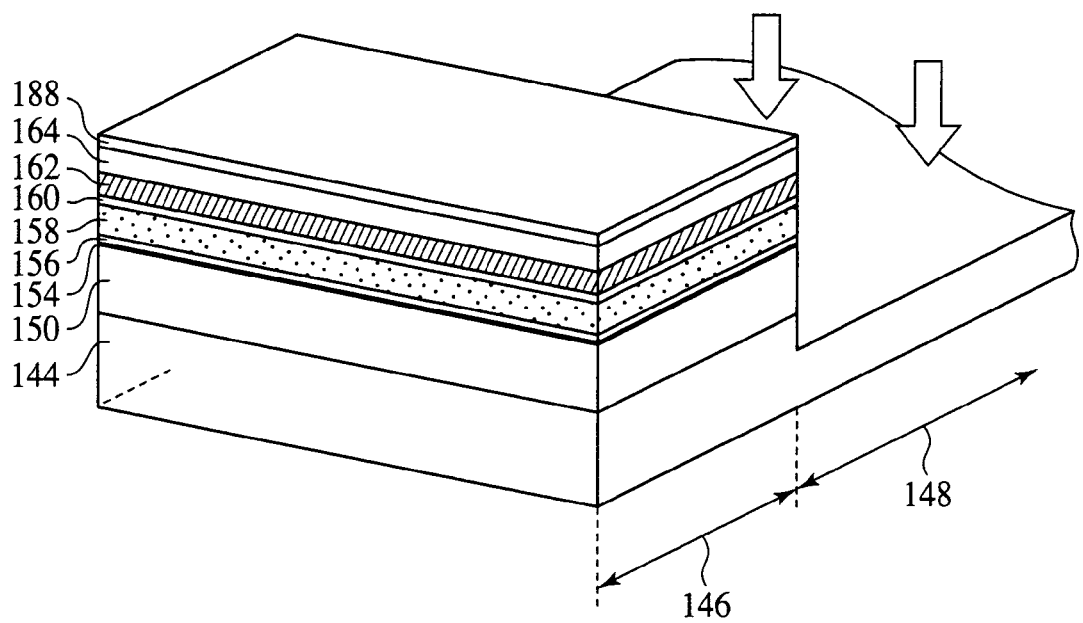

Next, with the silicon oxide film 188 as a mask, the clad layer 164, the MQW active layer 162, the intermediate layer 160, the wavelength tuning layer 158, the spacer layer 156, the quaternary diffraction grating layer 154, the buffer layer 150 and the upper part of the semiconductor substrate 144 are etched into a 2.5 μm-depth (refer to FIG. 17B).

Figure 18A:
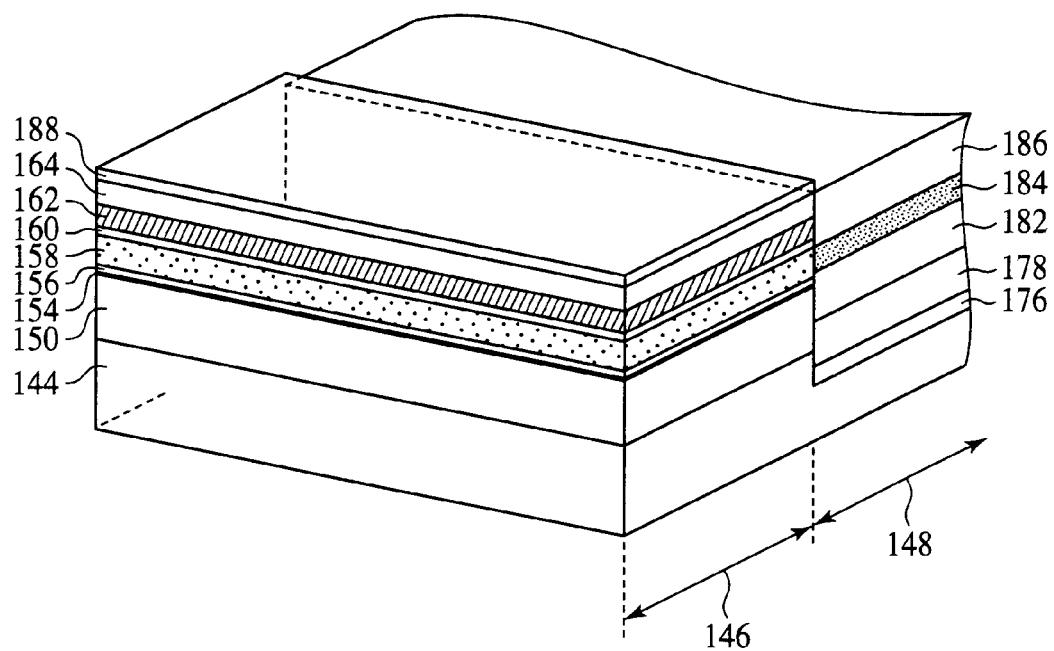
FIGS. 18A–18B are bird's-eye views of the photosemiconductor device according to the ninth embodiment of the present invention in the steps of the method for fabricating the phtosemiconductor device, which show the method (Part 2).

Then, with the silicon oxide film 188 formed in the TTG-LD part 146 as a selective growth mask, the n type InP layer 176 of, e.g., a 0.4 μm-thickness, the p type InP layer 178 of, e.g., a 0.9 μm-thickness, the lower clad layer 182 of non-doped InP of, e.g., a 0.5 μm-thickness, the core layer 184 of non-doped InGaAsP, e.g. of a 0.2 μm-thickness and $\lambda_{PL}$=1.3 μm and the upper clad layer 186 of, e.g., a 0.5 μm-thickness are laid in the stated order (refer to FIG. 18A).

Next, the silicon oxide film 188 used as the selective growth mask is removed.

Then, the silicon oxide film 190 is deposited on the clad layer 164 of the TTG-LD part 146 and the upper clad layer 186 of the optical waveguide 148 by, e.g., CVD.

Figure 18B:
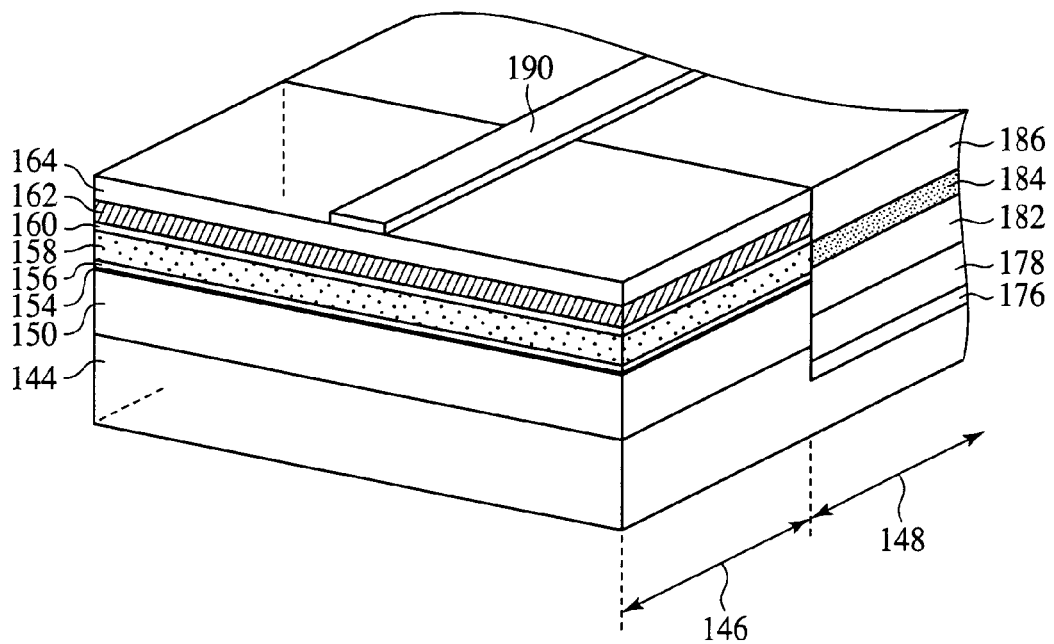

Next, the silicon oxide film 190 is selectively left by photolithography, and wet or dry etching in the regions for the mesa stripe of the TTG-LD 175 and the optical waveguide 187 to be formed in (refer to FIG. 18B).

Then, with the silicon oxide film 190 as a mask, the clad layer 164, the MQW active layer 162, the intermediate layer 160, the wavelength tuning layer 158, spacer layer 156, the quaternary diffraction grating layer 154, the buffer layer 150, the upper part of the semiconductor substrate 144 in the TTG-LD part 146, the upper clad layer 186, the core layer 184, the lower clad layer 182, the p type InP layer 178 and the n type InP layer 176 in the optical waveguide part 148 are respectively anisotropically etched in a 2.5 µm-depth to form the mesa stripe of, e.g., a 1.0 µm-width. Thus, the mesa stripe of the TTG-LD part 146 and the mesa stripe of the optical waveguide part 148 are formed continuous to each other (refer to FIG. 19A).

Figure 19A:
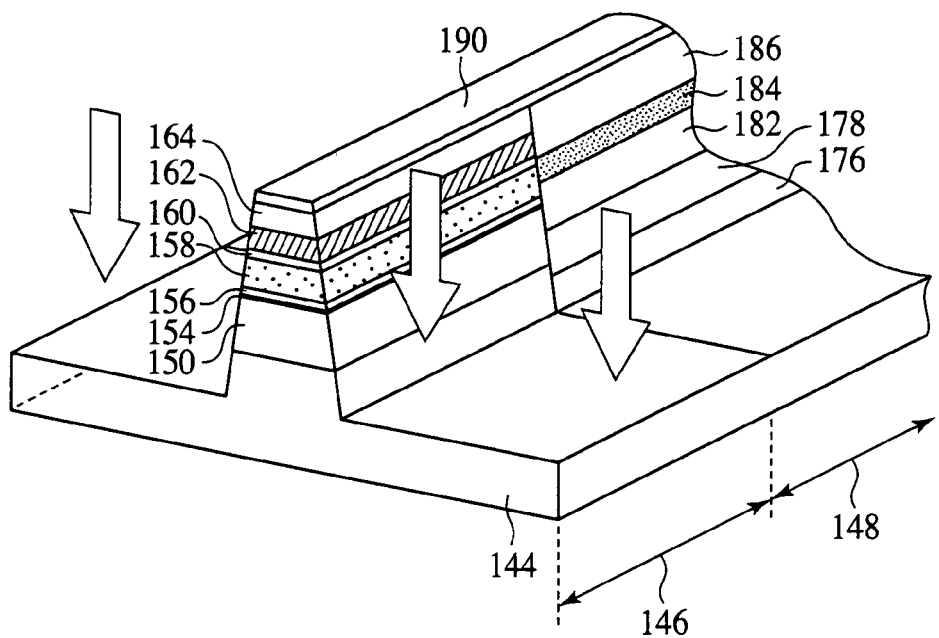
FIGS. 19A–19B are bird's-eye views of the photosemiconductor device according to the ninth embodiment of the present invention in the steps of the method for fabricating the phtosemiconductor device, which show the method (Part 3).
Figure 19B:
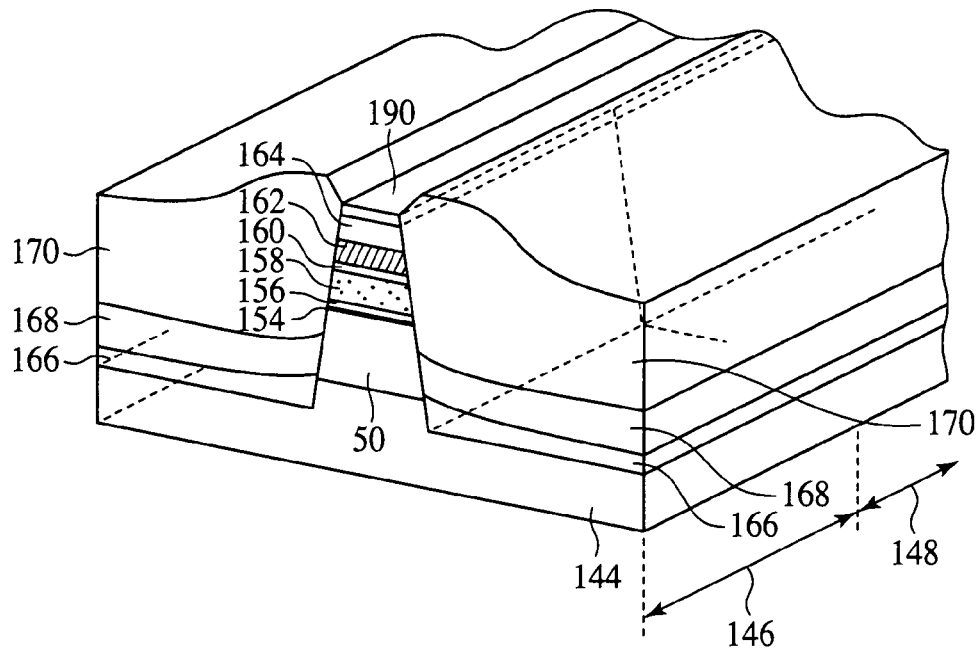

Next, on the semiconductor substrate 144 exposed on both sides of the mesa stripe of the TTG-LD part 146 and the mesa stripe of the optical waveguide part 148, with the silicon oxide film 190 as a selective growth mask, the n type InP buried layer 166 of, e.g., a 0.4 µm-thickness, the p type InP buried layer 168 of, e.g., a 0.9 µm-thickness and the n type InP buried layer 170 of a 1.2 µm-thickness are selectively grown the latter on the former (refer to FIG. 19B). Thus, the mesa stripe of the TTG-LD part 146 and the mesa stripe of the optical waveguide part 148 are concurrently buried by the n type InP buried layer 166, the p type InP buried layer 168 and the n type InP buried layer 170.

After the n type InP buried layer 166, the p type InP buried layer 168 and the n type InP buried layer 170 have been grown, the silicon oxide film 190 used as the selective growth mask is removed.

Then, on the mesa stripes and the n type InP buried layer 170, the cap layer 172 of p type InP of, e.g., a 2.5 µm-thickness is formed by, e.g., MOCVD. Thus, the layer structure formed on the semiconductor substrate 144 is planarized (refer to FIG. 20A). With reference to the sectional views of the TTG-LD part 146 shown in FIGS. 20A–20C, 21A–21C, 22A–22C and 23A–23B, the photosemiconductor device according to the present embodiment will be explained.

Figure 20A:
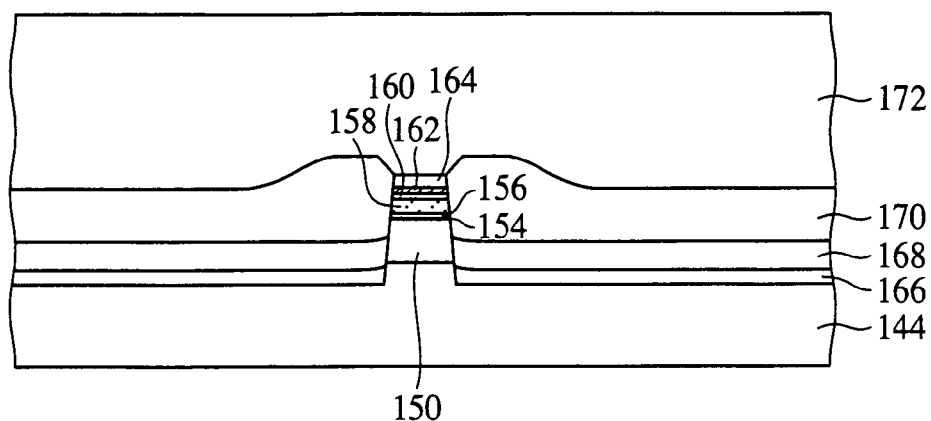
FIGS. 20A–20C are sectional views of the photosemiconductor device according to the ninth embodiment of the present invention in the steps of the method for fabricating the phtosemiconductor device, which show the method (Part 4).
Figure 20B:
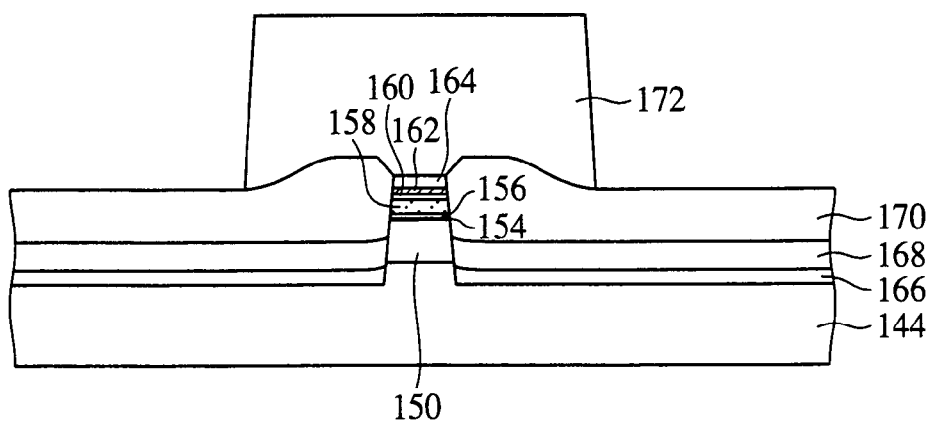

Then, the cap layer 172 is etched into a prescribed width with the position of the mesa stripe as the center by, e.g., RIE to thereby expose the n type InP buried layer 170 (refer to FIG. 20B).

Figure 20C:
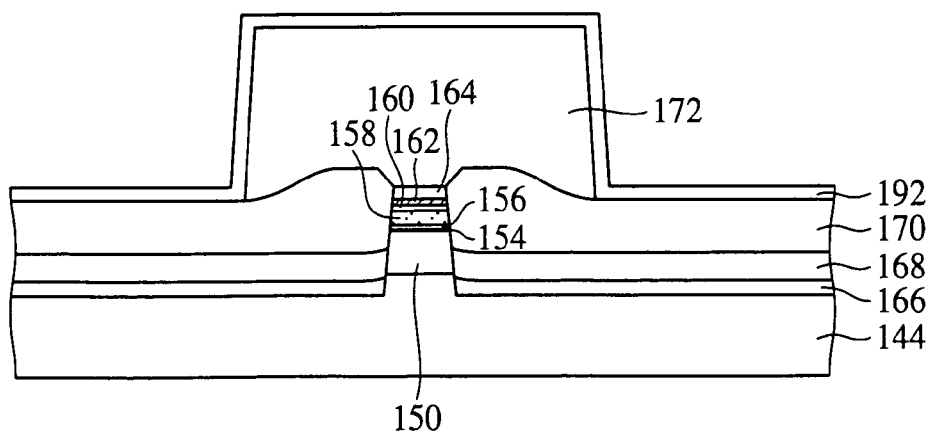

Next, on the entire surface of the element structure formed as described above, the protection film 192 of silicon oxide film of, e.g., a 0.55 µm-thickness is formed by, e.g., CVD (refer to FIG. 20C).

Then, the respective electrodes of the TTG-LD 175 are formed by the electrode forming processing which will be described below. The optical waveguide part 148 is protected by the protection film 192 so that the optical waveguide 148 is not affected by the electrode forming process.

Figure 21A:
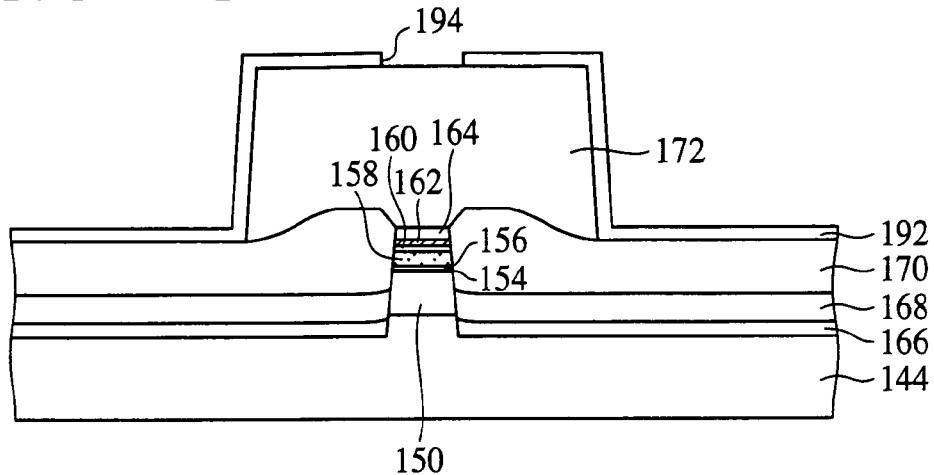
FIGS. 21A–21C are sectional views of the photosemiconductor device according to the ninth embodiment of the present invention in the steps of the method for fabricating the phtosemiconductor device, which show the method (Part 5).

First, an electrode window 194 is formed by etching in the protection film 192 on the cap layer 172 down to the cap layer 172 (refer to FIG. 21A).

Figure 21B:
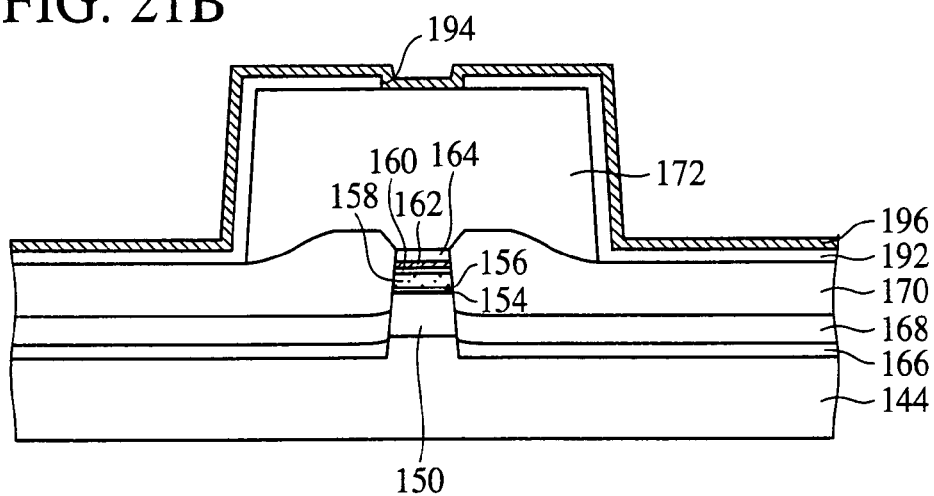

Then, a Ti/Pt film 196 of, e.g., a 0.2 µm/0.25 µm is formed on the entire surface by, e.g., vapor evaporation (refer to FIG. 21B).

Figure 21C:
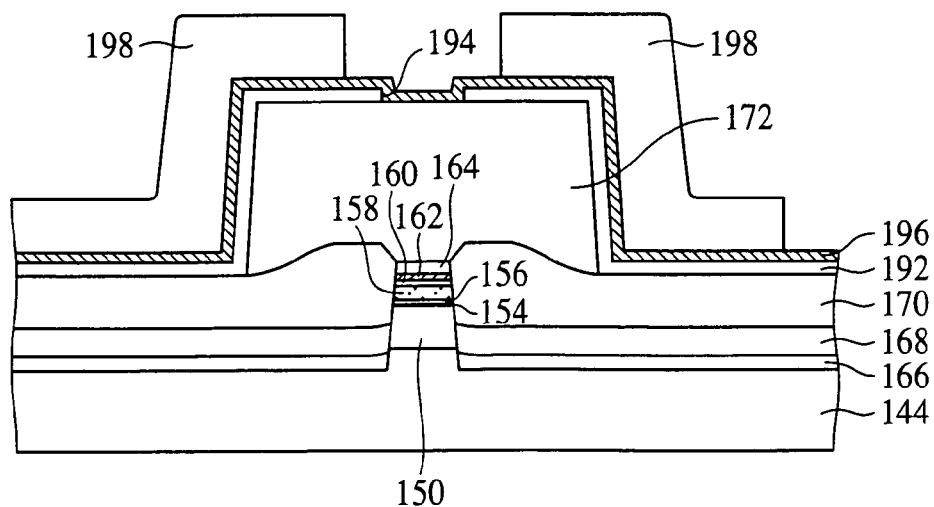

Next, a resist film 198 is formed, exposing the region for the p type electrode to be formed in containing the electrode window 194 and the region for the n type electrode to be formed in and covering the rest region (refer to FIG. 21C).

Then, with the Ti/Pt film 196 as an electrode, an Au film 200 of, e.g., a 3.0 µm-thickness is formed by plating. The Au film is not plated in the region where the resist film 198 is formed but is formed selectively in the region for the p type electrode to be formed in containing the electrode window 194 and the region for the n type electrode to be formed in. After the plating is completed, the resist film 198 is removed (refer to FIG. 22A).

Then, with the Au film 200 as a mask, the Ti/Pt film 196 is etched. Thus, on the protection film 192, the p type electrode 174 is formed of the Ti/Pt film 196 and the Au film 200 laid the latter on the former, connected to the cap layer 172 through the electrode window 194. The n type electrode 202 of the Ti/Pt film 196 and the Au film 200 laid the latter on the former is also formed. At this time, the n type electrode 202 is not connected to the n type InP buried layer 170 (refer to FIG. 22B).

Figure 22A:
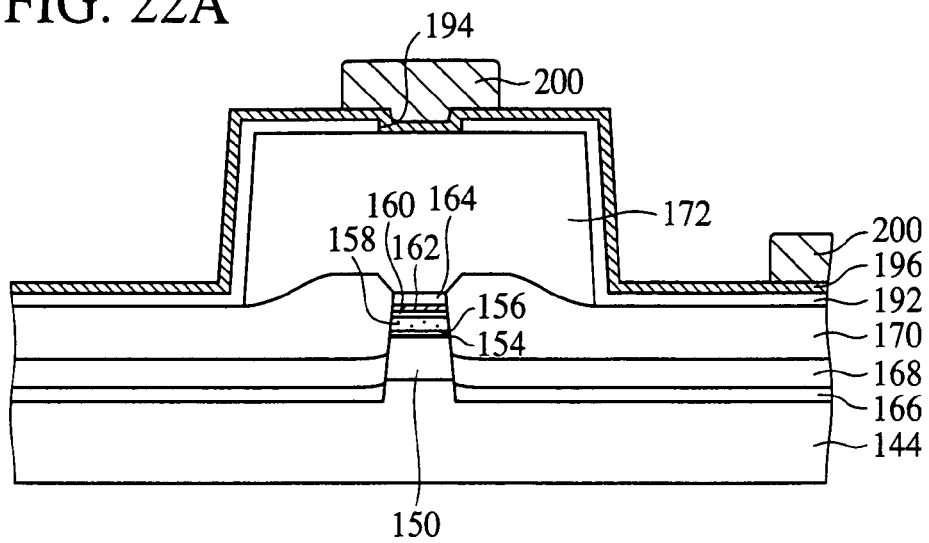
FIGS. 22A–22C are sectional views of the photosemiconductor device according to the ninth embodiment of the present invention in the steps of the method for fabricating the phtosemiconductor device, which show the method (Part 6).
Figure 22B:
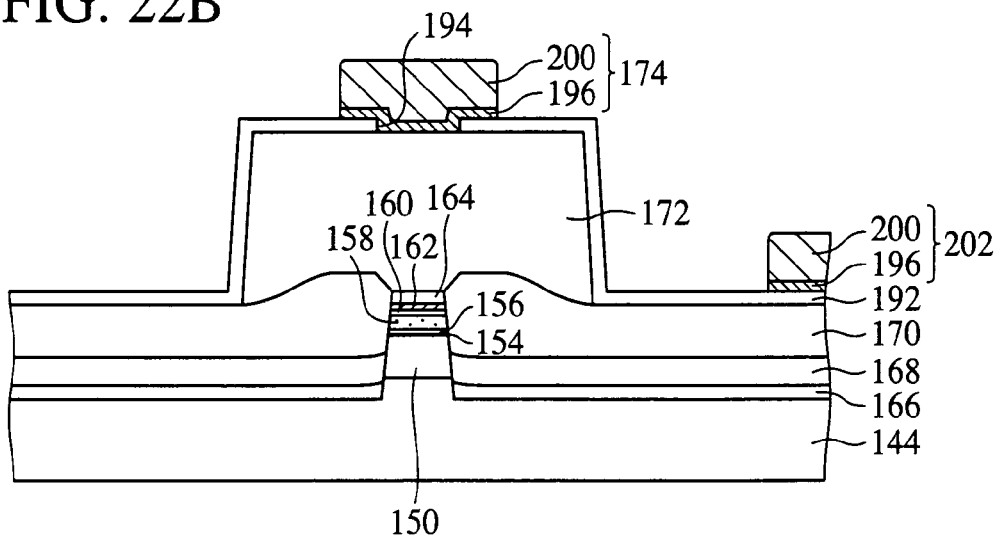
Figure 22C:
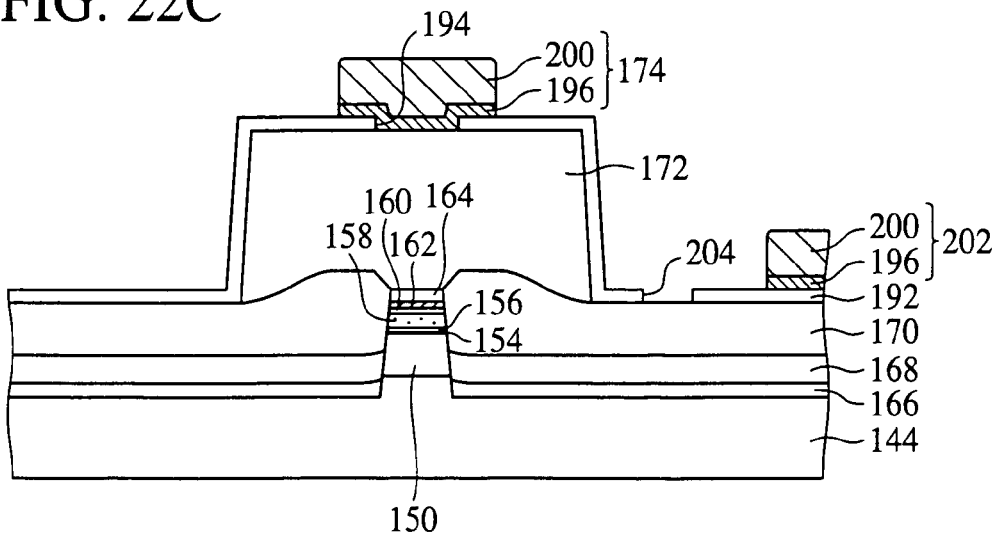
Figure 23A:
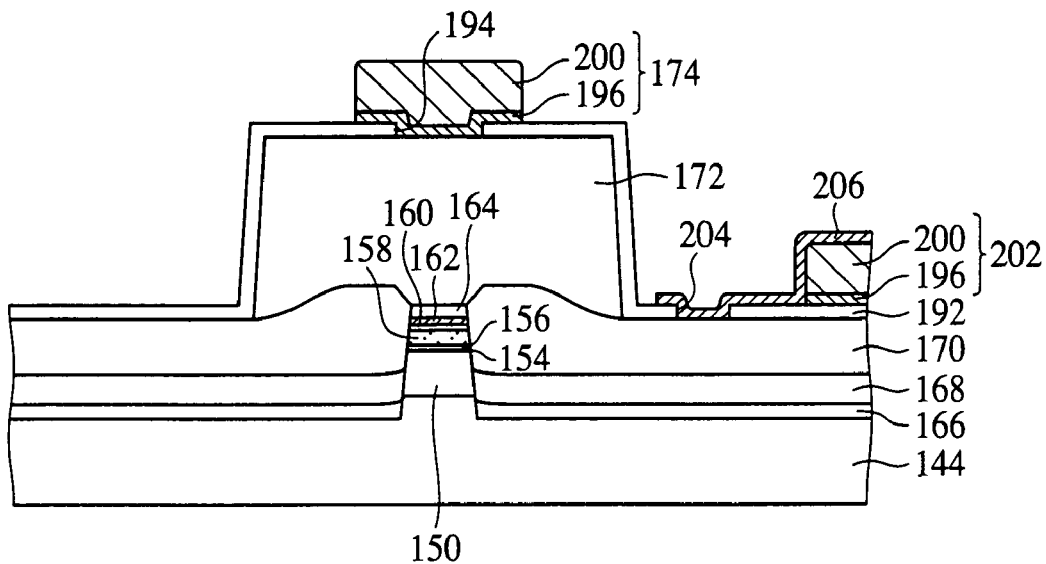
FIGS. 23A–23B are sectional views of the photosemiconductor device according to the ninth embodiment of the present invention in the steps of the method for fabricating the photosemiconductor device, which show the method (Part 7).
Figure 23B:
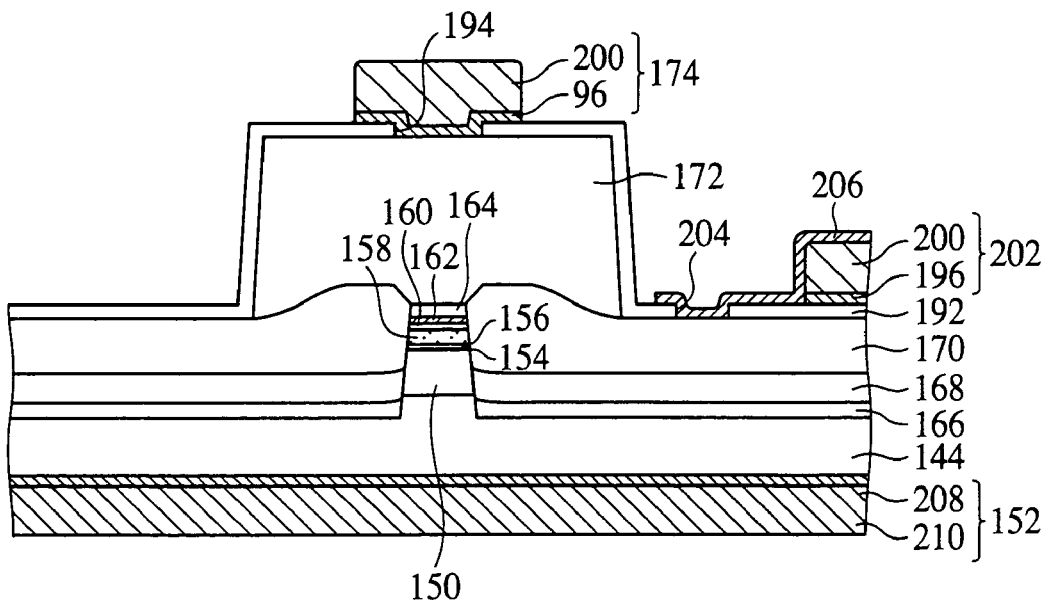

Then, an electrode window 204 is formed by etching in the protection film 192 on the n type InP buried layer 170 down to the n type InP buried layer 170 (refer to FIG. 22C).

Then, an AuGe/Au film 206 of, e.g., a 0.05 µm/0.25 µm-thickness is formed by, e.g., vapor evaporation using a mask. Thus, the AuGe/Au film 206 interconnecting the n type electrode 202 and the n type InP buried layer 170 exposed in the electrode window 204 is formed (refer to FIG. 23A).

Then, the underside of the semiconductor substrate 144 is polished to make the semiconductor substrate 144 into a thickness of, e.g., 150 µm.

Then, on the underside of the semiconductor substrate 144, an Au/Zn/Au film 208 of, e.g., a 0.015 µm/0.018 µm/0.17 µm-thickness is formed.

Then, a resist film (not shown) is formed covering the Au/Zn/Au film 208 in the optical waveguide part 148.

Then, with the Au/Zn/Zu film 208 as an electrode, an Au film 210 of, e.g., a 3.0 µm-thickness is formed by plating. At this time, the Au film is not plated in the region where the resist film is formed but is formed selectively on the Au/Zn/Au film 208 in the TTG-LD part 146. After the plating has been completed, the resist film is removed.

Then, with the Au film 210 as a mask, the Au/Zn/Zu film 208 is etched. Thus, on the underside of the semiconductor substrate 144 of the TTG-LD part 146, the p type electrode 152 is formed of the Au/Zn/Au film 208 and the Au film 210 laid the latter on the former (refer to FIG. 23B).

Thus, the photosemiconductor device according to the present embodiment is fabricated.

As described above, according to the present embodiment, when the TTG-LD 175 and the optical waveguide 187 are integrated on one and the same semiconductor substrate 144, the rectifying layer 180 of the n type InP layer 176 and the p type InP layer 178 laid the former on the later is formed below the optical waveguide 187 including the lower clad layer 182, the core layer 184 and the upper clad layer 186, whereby the semiconductor substrate 144 and the optical waveguide 187 are insulated from each other, and the generation of leak current between the two can be suppressed. Resultantly, upon the oscillation wavelength control of the TTG-LD, current can be every effectively injected into the wavelength tuning layer 158, and the wavelength conversion effectiveness for the injected current can be improved. Accordingly, the TTG-LD 175 and the optical waveguide 187 can be integrated on one and the same substrate without characteristic deterioration.

[A Tenth Embodiment]

Figure 24:
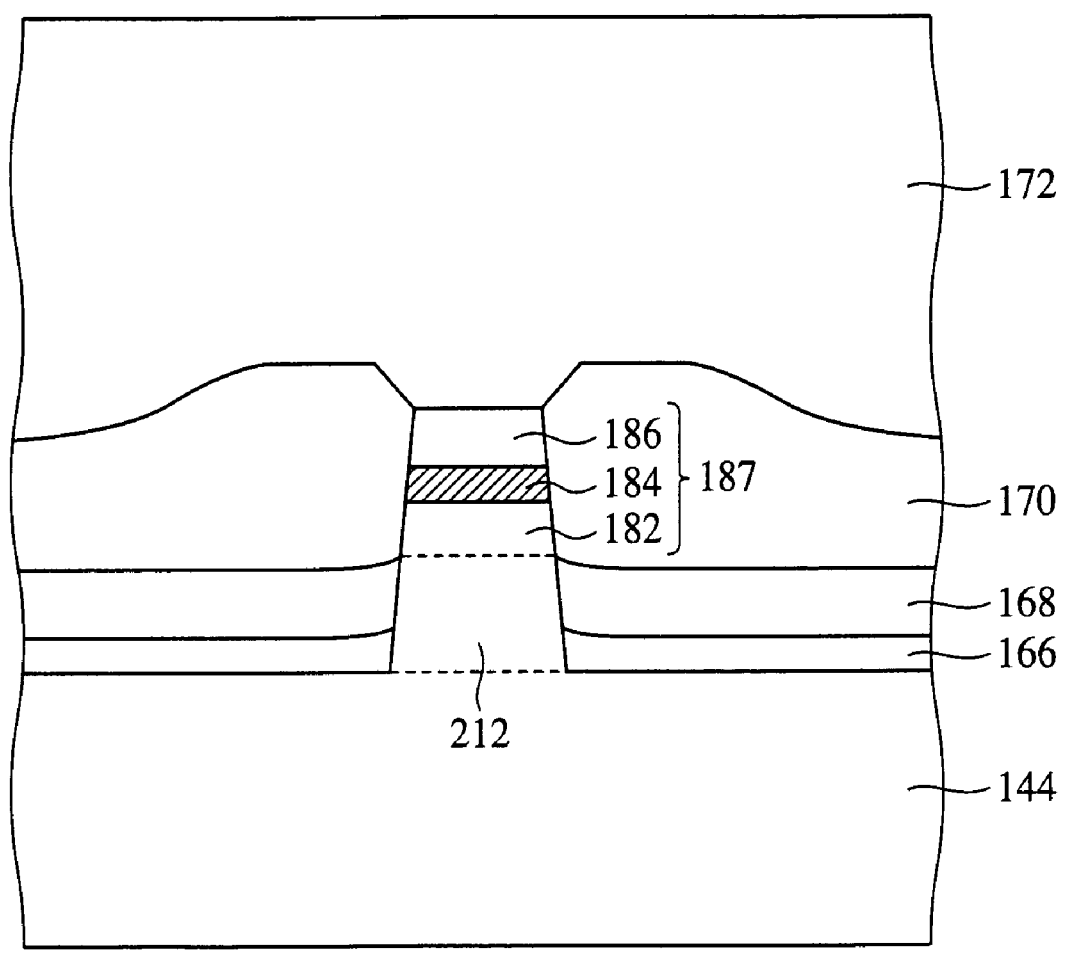
FIG. 24 is a sectional view of the photosemiconductor device according to a tenth embodiment of the present invention, which shows a structure of the optical waveguide part.

The photosemiconductor device and the method for fabricating the photosemiconductor device according to a tenth embodiment of the present invention will be explained with reference to FIG. 24. FIG. 24 is a sectional view of the photosemiconductor device according to the present embodiment, which shows the structure of the optical waveguide part. The same members of the present embodiment as those of the photosemiconductor device and the method for fabricating the photosemiconductor device according to the ninth embodiment shown in FIGS. 14, 15, 16, 17A–17B, 18A–18B, 19A–19B, 20A–20C, 21A–21C, 22A–22C and 23A–23B are represented by the same reference numbers not to repeat or to simplify their explanation.

The basic structure of the photosemiconductor device according to the present embodiment is substantially the same as those of the photosemiconductor device according to the ninth embodiment. The photosemiconductor device according to the present embodiment is characterized in that a semi-insulating semiconductor layer 212 is formed in place of the rectifying layer 180 formed of the n type InP layer 176 and the p type InP layer 178 laid the latter on the former.

As shown in FIG. 24, in the optical waveguide part 148 of the photosemiconductor device according to the present embodiment, a mesa stripe formed by laying sequentially the latter on the former and etching a semi-insulating semiconductor layer 212, a lower clad layer 182 of non-doped InP, a core layer 184 of non-doped InGaAsP, and an upper clad layer 186 of non-doped InP are formed on a semiconductor substrate 144.

On the semiconductor substrate 144 on both sides of the mesa stripe, an n type InP buried layer 166, a p type InP buried layer 168 and an n type InP buried layer 170 are formed sequentially in the stated order, which bury the mesa stripe.

As described above, in the optical waveguide part 148 of the photosemiconductor device according to the present embodiment, the semi-insulating semiconductor layer 212 of semi-insulating InP is formed between the semiconductor substrate 144 and the core layer 184, whereby, together with the rectification structure of the buried layers burying the mesa stripe of the optical waveguide part 148, the semiconductor substrate 144 and the optical waveguide 187 are insulated from each other. Thus, when current is injected from the p type electrode 152 into the wavelength tuning layer 158 to control the oscillation wavelength of the TTG-LD 175, the generation of leak current which flows from the semiconductor substrate 144 to the optical waveguide 187 and flows to the earth potential through the n type InP buried layer 170 on both sides of the optical waveguide 187 can be suppressed in the same way as in the photosemiconductor device according to the ninth embodiment. Accordingly, upon the oscillation wavelength control of the TTG-LD 175, current can be injected very effectively into the wavelength tuning layer 158, and the wavelength conversion efficiency for the injected current can be improved.

[An Eleventh Embodiment]

Figure 25:
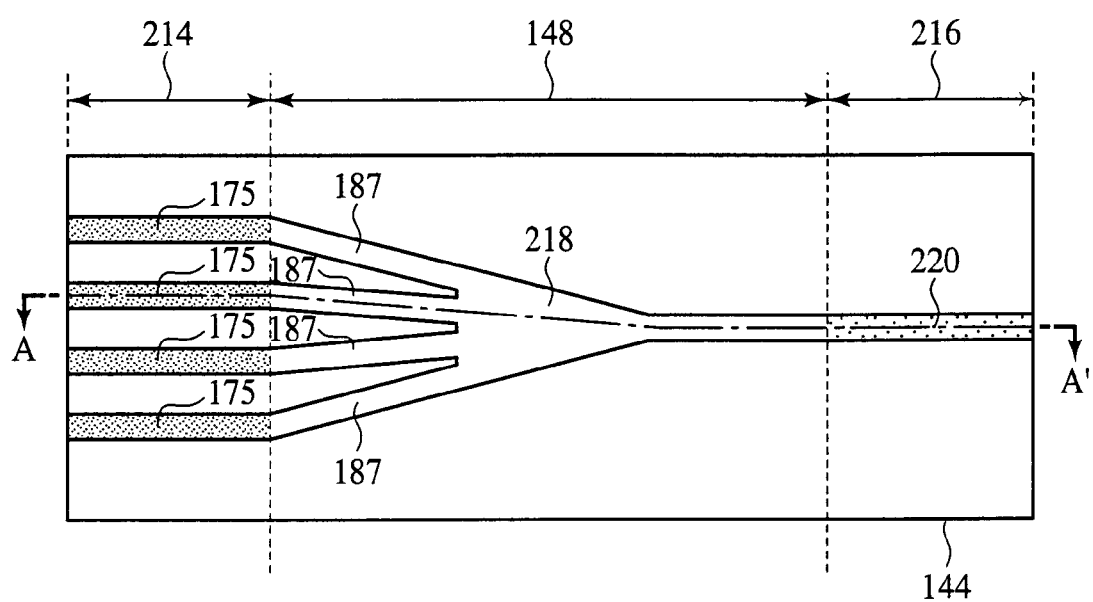
FIG. 25 is a plan view of the photosemiconductor device according to an eleventh embodiment of the present invention, which shows a structure thereof.
Figure 26:
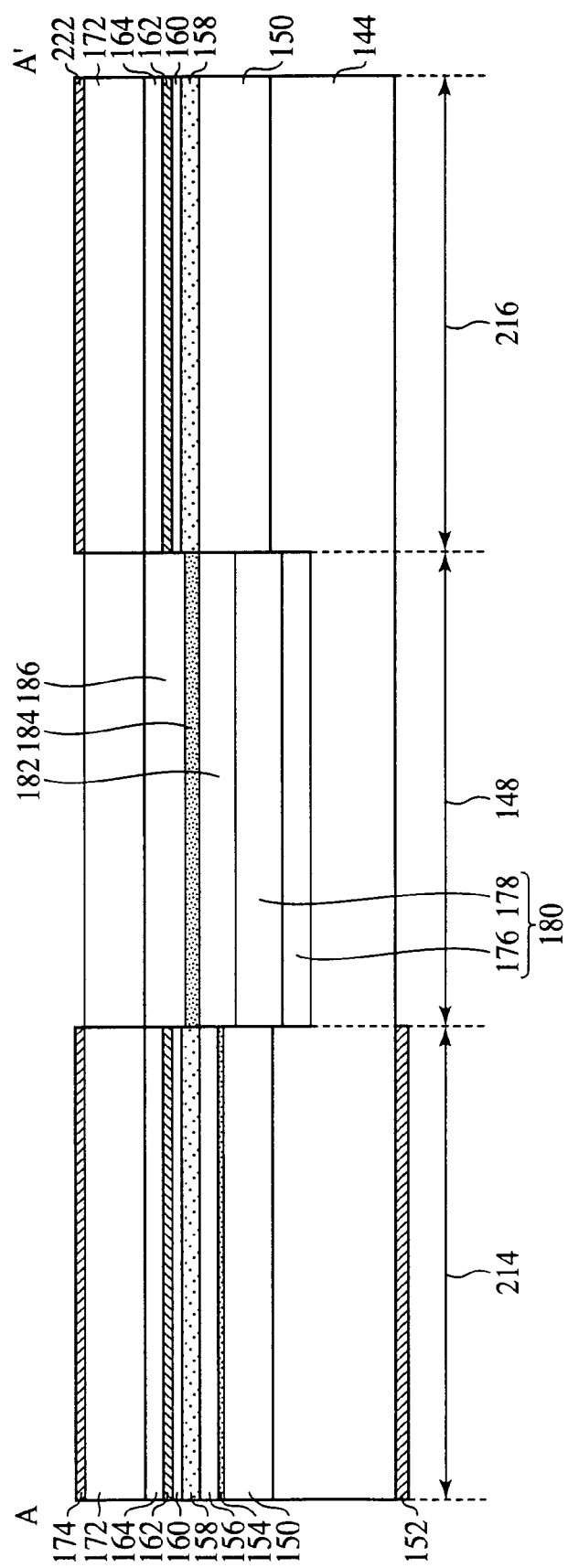
FIG. 26 is a sectional view of the photosemiconductor device according to an eleventh embodiment of the present invention along the extension direction of the mesa stripe.

The photosemiconductor device and the method for fabricating the photosemiconductor device according to an eleventh embodiment of the present invention will be explained with reference to FIGS. 25 and 26. FIG. 25 is a plan view of the photosemiconductor device according to the present embodiment, which shows the structure thereof. FIG. 26 is a sectional view along the line A–A' in FIG. 25 in the direction of extension of the mesa stripe. The same members of the present embodiment as those of the photosemiconductor device and the method for fabricating the photosemiconductor device according to the ninth embodiment shown in FIGS. 14, 15, 16, 17A–17B, 18A–18B, 19A–19B, 20A–20C, 21A–21C, 22A–22C and 23A–23B are represented by the same reference numbers not to repeat or to simplify their explanation.

In the photosemiconductor device according to the present embodiment, a plurality of TTG-LDs is arrayed on one and the same substrate and an SOA which amplifies the photooutput of the TTG-LDs is also formed on the same substrate, whereby wide wavelength variation ranges can be realized without decreasing the photooutput.

As shown in FIG. 25, a TTG-LD array part 214, the optical waveguide 148 and an SOA part 216 are provided on the semiconductor substrate 144. In the TTG-LD array part 214, a plurality of TTG-LDs 175 having central oscillation wavelength different from one another are formed. In the optical waveguide part 148, a plurality of optical waveguides 187 respectively connected to one ends of the TTG-LDs 175, and an optical coupler 218 for coupling light which has propagated through the plurality of optical waveguides 187. In the SOA part 216, an SOA 220 for amplifying a laser beam output from the optical coupler 218.

As shown in FIG. 26, each of the TTG-LDs 175 of the TTG-LD array part 214 has the same sectional structure as that of the photosemiconductor device according to the ninth embodiment.

As shown in FIG. 26, the optical waveguide part 148 has the same structure as that of the photosemiconductor device according to the ninth embodiment. That is, on the semiconductor substrate 144, a rectifying layer 180 formed of an n type InP layer 176 and a p type InP layer 178 laid the latter on the former, a lower clad layer 182 of non-doped InP, a core layer 184 of non-doped InGaAsP and an upper clad layer 186 of non-doped InP are sequentially laid the latter on the former, and are patterned in mesa stripes and optical coupler, formed in the plurality of optical waveguides 187 and the optical coupler 218. On the semiconductor substrate 144 on both sides of the patterned layer structure, an n type InP buried layer 166, a p type InP buried layer 168 and an n type InP buried layer 170 are sequentially formed, burying the layer structure.

As shown in FIG. 26, the SOA part 216 has substantially the same sectional structure as that of the TTG-LD 175. That is, on the semiconductor substrate 144, a mesa stripe is formed by laying sequentially the former on the latter and etching a buffer layer 150 of p type InP, a wavelength tuning layer 158 of non-doped InGaAsP, an intermediate layer 160 of n type InP, an MQW active layer 162 of InGaAsP and a clad layer 164 of p type InP. On the semiconductor substrate 144 of the mesa stripe, an n type InP buried layer 166, a p type InP buried layer 168 and an n type InP buried layer 170 are sequentially formed, burying the mesa stripe. A cap layer 172 is formed on the n type InP buried layer 170 and the clad layer 164 of the mesa stripes. On the cap layer 172, a p type electrode 222 electrically connected to the MQW active layer 162 via the cap layer 172 and the clad layer 164 for injecting current into the MQW active layer 162 are formed. On the n type InP buried layer 170, an n type electrode (not shown) is formed, electrically connected to the intermediate layer 160 via the n type InP buried layer 170. Thus, the SOA 220 is formed in the SOA part 216. The layer structure of the SOA part 216, which is substantially the same as that of the TTG-LD array part 214 can be formed concurrently with forming the layer structure of the TTG-LD array part 214. An InGaAsP layer (not shown) which corresponds to the quaternary diffraction grating layer of the TTG-LD 175 is formed in the SOA part 216 but has no diffraction grating formed in. In the operation of the photosemiconductor device, a prescribed voltage is applied between the p type electrode 222 and the n type electrode formed on the n type InP buried layer 170 to inject current into the MQW active layer 162, whereby the photo-amplification is performed.

As described above, the photosemiconductor device according to the present embodiment is characterized mainly in that a plurality of TTG-LDs 175 and the SOA 220 are integrated on the semiconductor substrate 144. In the photosemiconductor device having such structure, a plurality of TTG-LDs 175 can provide a wide wavelength variation range, and the SOA 220 can amplify laser beams which have been attenuated, propagating through the optical waveguides 187 and the optical coupler 218, resultantly without photo-output decrease.

Furthermore, the photosemiconductor device according to the present embodiment is characterized mainly in that, as in the photosemiconductor device according to the ninth embodiment, the rectifying layer 180 formed by laying the n type InP layer 176 and the p type InP layer 178 the latter on the former is provided below the lower clad layer 182, the core layer 184 and the upper clad layer 186 of the optical waveguide part 148. Accordingly, the generation of the leak current which, when current is injected into the wavelength tuning layer 158 of the array of the TTG-LDs 175 from the p type electrode 152 on the underside of the semiconductor substrate 144, flows from the semiconductor substrate 144 and through the optical waveguides 187 and the n type InP buried layer 170 on both sides of the optical waveguides 187 can be suppressed. Thus, the decrease of the current injection efficiency of the wavelength tuning layer 158 of the TTG-LD 175 can be suppressed, and the increase of the wavelength conversion effectiveness for the injected current can be realized.

As described above, according to the present embodiment, a plurality of TTG-LDs 175 having central oscillation wavelengths different from each other, and the SOA 220 are integrated on the semiconductor substrate 144, whereby wide wavelength variation ranges can be realized without decreasing the photooutput. Because of the rectifying layer 180 formed between the semiconductor substrate 144 and the optical waveguide 187 of the optical waveguide part 148, the decrease of the effectiveness of the current injection into the wavelength tuning layer 158 of the TTG-LD 175 can be suppressed, and furthermore, the increase of the wavelength conversion effectiveness for the injected current can be realized.

In the present embodiment, the optical waveguide part of the same sectional structure as that of the photosemiconductor device according to the ninth embodiment is used, but the optical waveguide part of the same sectional structure as that of the photosemiconductor device according to the tenth embodiment may be used.

In the present embodiment, 4 TTG-LDs 175 are integrated as shown in FIG. 25, but the number of a plurality of the TTG-LDs to be integrated is not limited to 4.

In the present embodiment, a plurality of TTG-LDs is arrayed, but the invention is applicable to the case in which 1 TTG-LD and the SOA formed on a semiconductor substrate are connected each other via an optical waveguide.

In the present embodiment, the SOA 220 has substantially the same layer structure as that of the TTG-LD 175. However, the SOA 220 may have a layer structure which is different from that of the TTG-LD 175.

[A Twelfth Embodiment]
(Arraying TTG-DFB Lasers)

The inventors of the present application have already proposed a photosemiconductor device including a TTG-DFB laser and an SOA integrated in one piece as a photosemiconductor device which can provide wide wavelength variation ranges and high photooutputs.

Figure 27A:
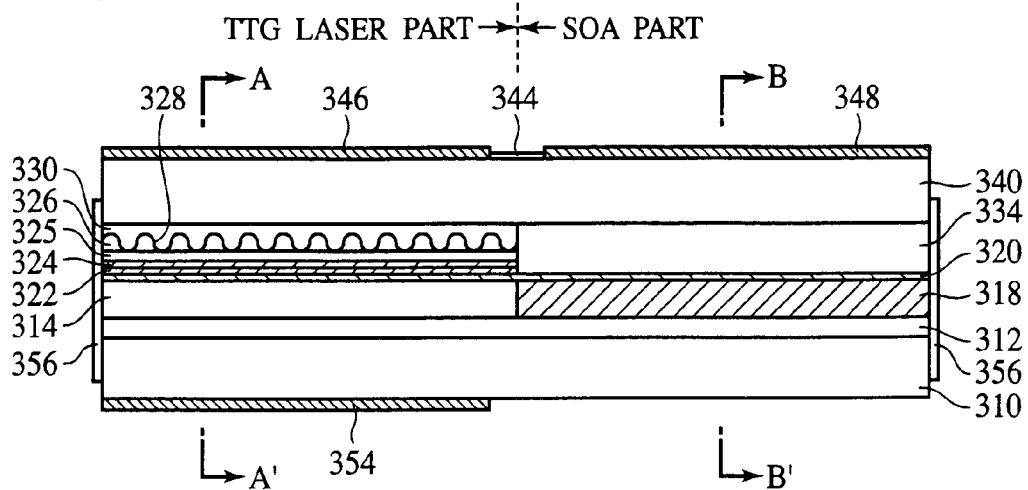
FIGS. 27A–27C are diagrammatic sectional views of the photosemiconductor device with TTG-DFB lasers and an SOA integrated in one-piece, which show a structure thereof.
Figure 27B:
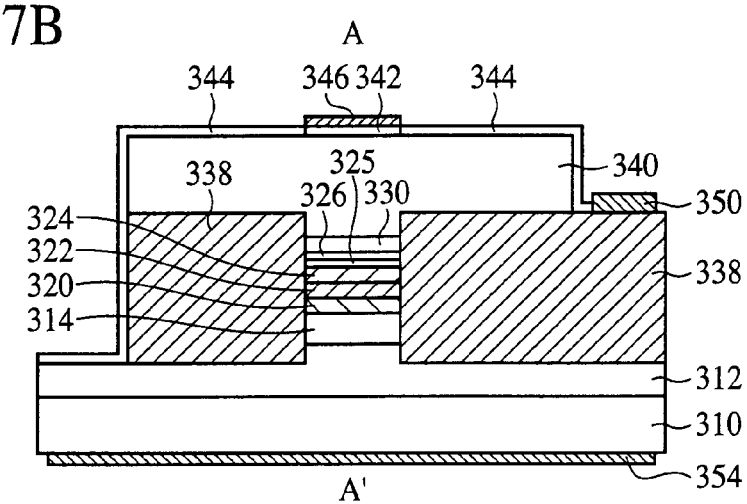
Figure 27C:
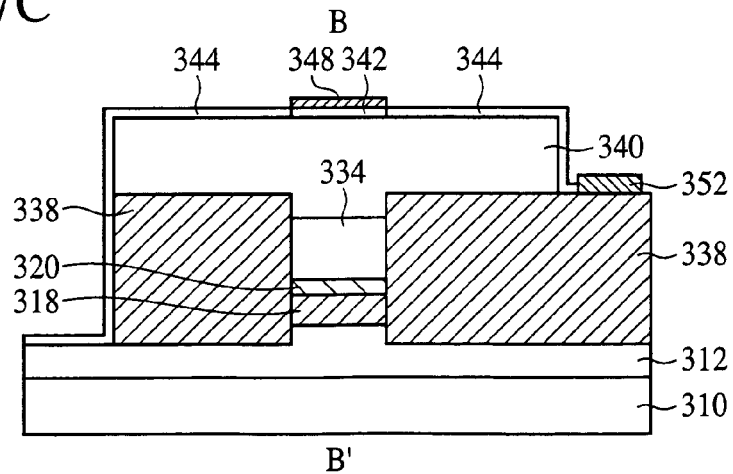

FIGS. 27A–27C are diagrammatic sectional views of a photosemiconductor device having a TTG-DFB laser and an SOA integrated in one piece, which show a structure thereof. FIG. 27A is a diagrammatic sectional view along the extension of the mesa stripe. FIG. 27B is a diagrammatic sectional view of the TTG laser part along the line A–A' in FIG. 27A. FIG. 27C is a diagrammatic sectional view of the SOA part along the line B–B' in FIG. 27A.

The TTG laser part and the SOA part are provided on a semiconductor substrate 310.

The TTG laser part has the sectional structure as shown in FIG. 27B. On the semiconductor substrate 310 of p type InP, there are formed a p type InP layer 312, a lower clad layer 314 of p type InP, MQW (Multiple Quantum Well) active layer 320, an intermediate layer 322 of an n type InP layer, a wavelength tuning layer 324 of an InGaAsP layer, a clad layer 325 of a p type InP layer, an InGaAsP layer 326 with a diffraction grating 328 formed in, and a buried layer 330 of an InP layer. The buried layer 330, the InGaAsP layer 326, the wavelength tuning layer 324, the intermediate layer 322, the MQW active layer 320 and the lower clad layer 314 are patterned in a mesa, forming a mesa stripe. A buried layer 338 of an n type InP layer is formed on both sides of the mesa stripe. On the buried layers 330, 338, a p type InP layer 340 is formed. On the p type InP layer 340, an electrode 346 is formed with a contact layer 342 of a p type InGaAs layer formed therebetween. An electrode 350 is formed on the buried layer 338. An electrode 354 is formed on the second surface with no element formed on, i.e. the underside of the semiconductor substrate 310. A protection film 344 of a silicon oxide film is formed on the exposed surfaces of the p type InP layers 312, 340 and the buried layer 338. In this specification, the first surface of the semiconductor substrate means the upper surface of the semiconductor substrate with the element formed on, and the second surface of the semiconductor device means underside of the semiconductor device with no element formed on.

The SOA part has the sectional structure as shown in FIG. 27C. On the semiconductor substrate 310, a p type InP layer 312, a lower clad layer 318 of an n type InP layer, an MQW active layer 320 and an upper clad layer 334 of a p type InP layer are formed. The upper clad layer 334, the MQW active layer 320 and the lower clad layer 318 are patterned in a mesa, forming a mesa stripe. A buried layer 338 of an n type InP layer is formed on both sides of the mesa stripe. On the upper clad layer 334 and the buried layer 338, a p type InP layer 340 is formed. On the p type InP layer 340, an electrode 348 is formed with a contact layer 342 of a p type InGaAs layer formed therebetween. An electrode 352 is formed on the buried layer 338. A protection film 344 of a silicon oxide film is formed on the exposed surfaces of the p type InP layers 312, 340 and the buried layer 338.

As shown in FIG. 27A, the mesa stripe of the TTG laser part and the mesa stripe of the SOA part are arranged continuous to each other. The MQW active layer of the TTG laser part and the MQW active layer of the SOA part are formed of a common semiconductor layer. Anti-reflection films 356 are formed on the end surfaces of the mesa stripe on the side of the SOA and on the side of the TTG-DFB laser.

Figure 28:
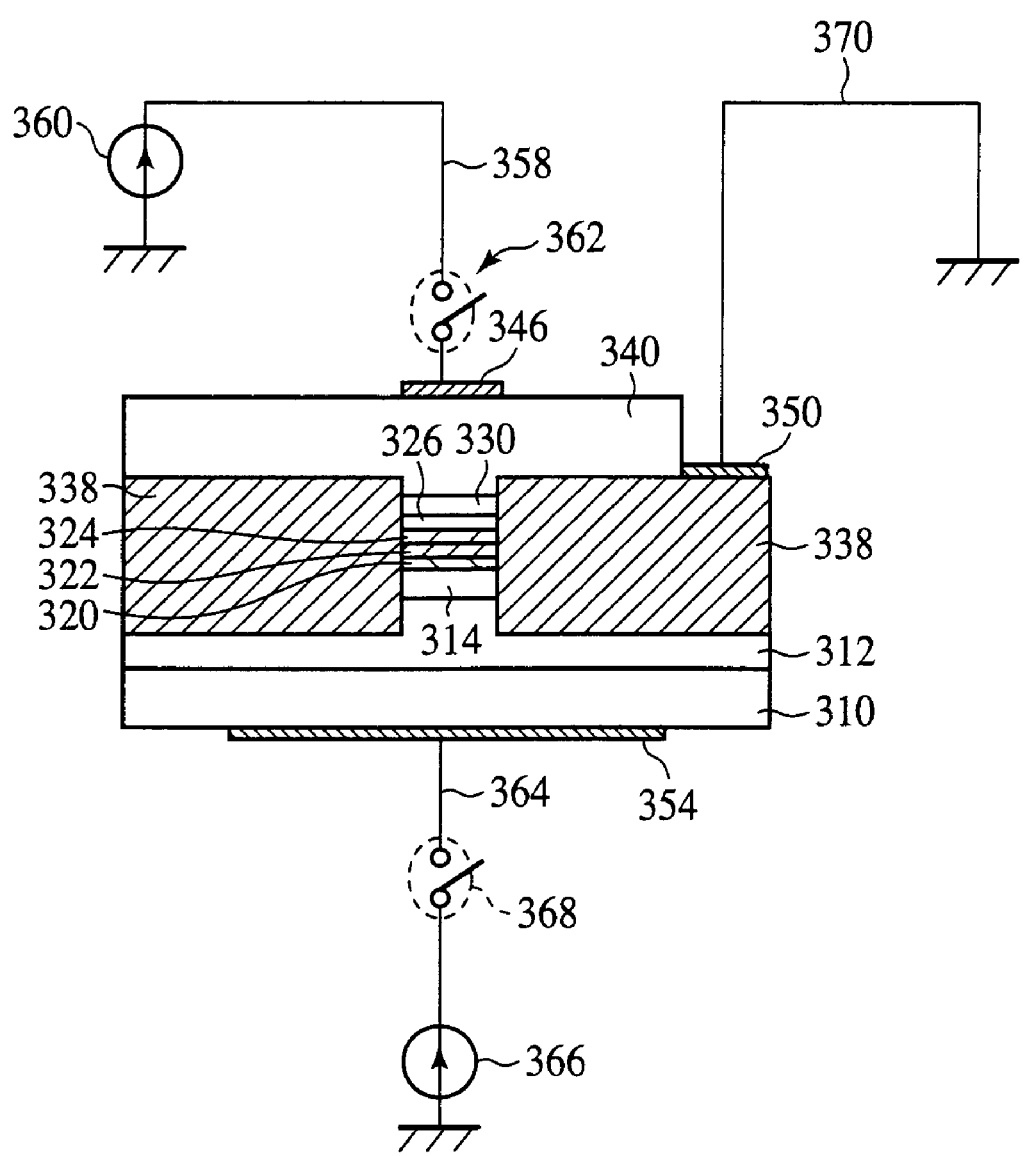
FIG. 28 is a view of a drive circuit of the photosemiconductor device with a TTG-DFB laser and an SOA integrated in one-piece.

Then, the operation of the TTG-DFB laser of the photosemicondcutor device including the TTG-DFB laser and the SOA integrated in one piece will be explained with reference to FIGS. 27A–27C and 28. FIG. 28 is a diagrammatic view of a drive circuit for the TTG laser of the photosemiconductor device described above.

As shown in FIG. 28, the electrode 346 is connected to a wavelength control electric power source 360 via a wire 358, and a first switch 362 is provided in the wire 358. A laser drive electric power source 366 is connected to the electrode 354 via a wire 364, and a second switch 368 is provided in the wire 364. The electrode 350 is grounded via a wire 370.

In the TTG laser part, with the second switch 368 closed, a prescribed voltage is applied between the electrode 354 and the electrode 350 from the laser drive electric power source 366 to inject current from the electrode 354. The current injected from the electrode 354 is injected into the MQW active layer 320 via the p type InP layer 312 and the lower clad layer 314 and is led out from the electrode 350 via the intermediate layer 322 and the buried layer 338. A current of above an oscillation threshold value is injected into the MQW active layer 320, whereby light emitted in the MQW active layer 320 is oscillated in the DFB mode by the diffraction grating 328.

Simultaneously therewith, with the first switch 362 closed, a prescribed voltage is applied between the electrode 346 and the electrode 350 from the wavelength control electric power source 360 to inject current from the electrode 346. The current injected from the electrode 346 is injected into the wavelength tuning layer 324 via the p type InP layer 340, the buried layer 330 and the InGaAsP layer 326 and is led out from the electrode 350 via the intermediate layer 322 and the buried layer 338. Current is injected into the wavelength tuning layer 324, whereby the refractive index is decreased by the plasma effect, and the effective refractive index of the optical waveguide layer is decreased. Accordingly, the DFB oscillation wavelength is shortened. Thus, the DFB oscillation wavelength can be controlled by the current injected into the wavelength tuning layer 324.

In the SOA part, a prescribed voltage is applied between the electrode 348 and the electrode 352 to inject current from the electrode 348. The current injected from the electrode 348 is injected into the MQW active layer 320 via the p type InP layer 340 and the upper clad layer 334 and is led out from the electrode 352 via the lower clad layer 318 and the buried layer 338. A prescribed current is injected into the MQW active layer 320, whereby light propagating in the MQW active layer 320 can be amplified. At this time, the lower clad layer 318, which has some thickness, allows the current to be injected into the active layer with the electric resistance kept low.

Accordingly, when the wavelength variation control in the TTG laser part and the light amplification control in the SOA part are performed independently of each other, the heating of the SOA part is suppressed, the large long-wavelength-side shift and gain decrease of gained wavelengths can be suppressed, and high photooutputs having continuous wide wavelength variation widths can be realized.

In such photosemiconductor device, a plurality of TTG-DFB lasers having different wavelength variation ranges are arrayed, whereby further extended wavelength variation ranges can be provided. In this case, a plurality of the arrayed TTG-DFB lasers may be optically connected to the SOA by the respective optical waveguides and the optical coupler.

However, in the case that a plurality of TTG-DFB lasers are simply arrayed on one and the same semiconductor substrate, the electrodes disposed on the undersides of the respective TTG-DFB lasers are electrically connected on the entire underside of the semiconductor substrate. Accordingly, it is difficult to drive the respective plurality of the arrayed TTG-DFB lasers independently of each other. In order to independently drive the respective TTG-DFB lasers adjacent to each other, it is necessary to isolate the respective adjacent TTG-DFB lasers.

As means for electrically isolating the plurality of the arrayed TTG-DFB lasers on one and the same semiconductor substrate will be, e.g., isolating the respective TTG-DFB lasers from each other by high-resistance regions formed in the semiconductor substrate or others by ion implantation.

Figure 29:
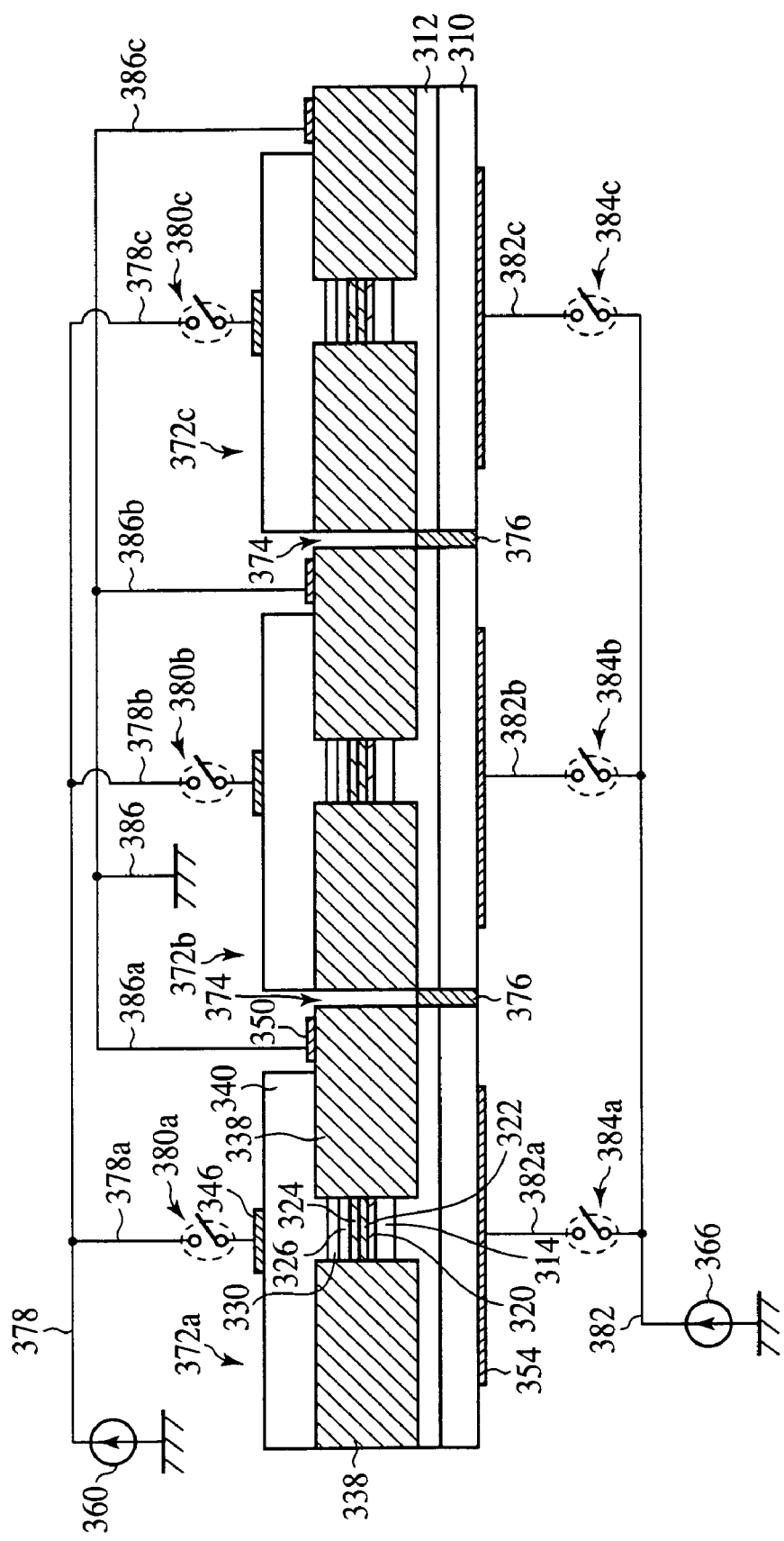
FIG. 29 is a sectional view of one example of the structure of a plurality of arrayed TTG-DFB lasers which are electrically isolated from each other.

FIG. 29 is a sectional view of the arrayed TTG-DFB lasers isolated from each other by high-resistance regions formed by ion implantation, which shows the structure and the driving circuit. As shown, the TTG-DFB lasers 372a, 372b, 372c having different wavelength variation ranges are juxtaposed on one and the same semiconductor substrate 310. The buried layers 338 for the respective TTG-DFB lasers 372a, 372b, 372c are electrically isolated by grooves 374. The regions where the respective TTG-DFB lasers 372a, 372b, 372c are electrically isolated by the high-resistance regions 376 formed in the semiconductor substrate 310 and the p type InP layer 312 by ion implantation.

The electrodes 346 of the respective TTG-DFB lasers 372a, 372b, 372c are connected in parallel to the wavelength control electric power source 360 by wires 378, 378a, 378b, 378c. Switches 380a, 380b, 380c are provided in the respective wires 378a, 378b, 378c. The electrodes 354 are connected in parallel to the drive electric power source 366 by wires 382, 382a, 382b, 382c. Switches 384a, 384b, 384c are provided in the respective wires 382a, 382b, 382c. The electrodes 350 are electrically connected in parallel by wires 386, 386a, 386b, 386c and grounded.

The TTG-DFB lasers 372a, 372b, 372c are arrayed, electrically isolated form each other by the high-resistance regions 376 as shown in FIG. 29, whereby the electrodes 354 of the respective TTG-DFB lasers 372a, 372b, 372c provided underside of the semiconductor substrate 310 are never electrically connected to each other. Accordingly, in principle, the switches 380a, 380b, 380c, and the switches 384a, 384b, 384c are opened and closed, whereby the respective TTG-DFB lasers 372a, 372b, 372c can be operative independently of each other.

However, as the semiconductor substrate for TTG-DFB lasers to be formed on, semiconductor substrates having an about 100 μm-thickness are generally used. Forming high-resistance regions by ion implantation in a 100 μm-depth, which is the depth of the semiconductor substrates, is very laborious. Furthermore, unless the high-resistance regions are satisfactorily formed by ion implantation, the electric isolation between the arrayed TTG-DFB lasers is insufficient. Resultantly, the photosemiconductor device has low reliability. Thus, it is actually impossible to form the high-resistance regions by ion implantation to thereby electrically isolate the arrayed TTG-DFB lasers from each other.

Another means which can electrically isolate the arrayed TTG-DFB lasers will arraying the TTG-DFB lasers on a semi-insulating semiconductor substrate. However, in the case that a semi-insulating semiconductor substrate is used, electrodes electrically connected to the active layers, electrodes electrically connected to the wavelength tuning layers and electrodes electrically connected to the intermediate layer must be arranged on the side of the upper surface of the substrate. Because of this arrangement of the electrodes, the wiring pattern must be designed to be a multi-level interconnection, which results in an increased number of the electrode forming steps, further in a increased number of the electrode pads, and larger element dimensions.

(The Principle of the Photosemiconductor Device According to a Twelfth to a Fourteenth Embodiments)

The photosemiconductor device according to the present invention enables each of arrayed TTG-DFB lasers to be independently driven without the above-described disadvantages. Thus, such photosemiconductor device can realize high photooutputs in a wider wavelength variation range in comparison with the photosemiconductor device including one TTG-DFB laser and an SOA integrated. The principle of the photosemiconductor device according to the present invention will be explained with reference to FIGS. 30 and 31.

Figure 30:
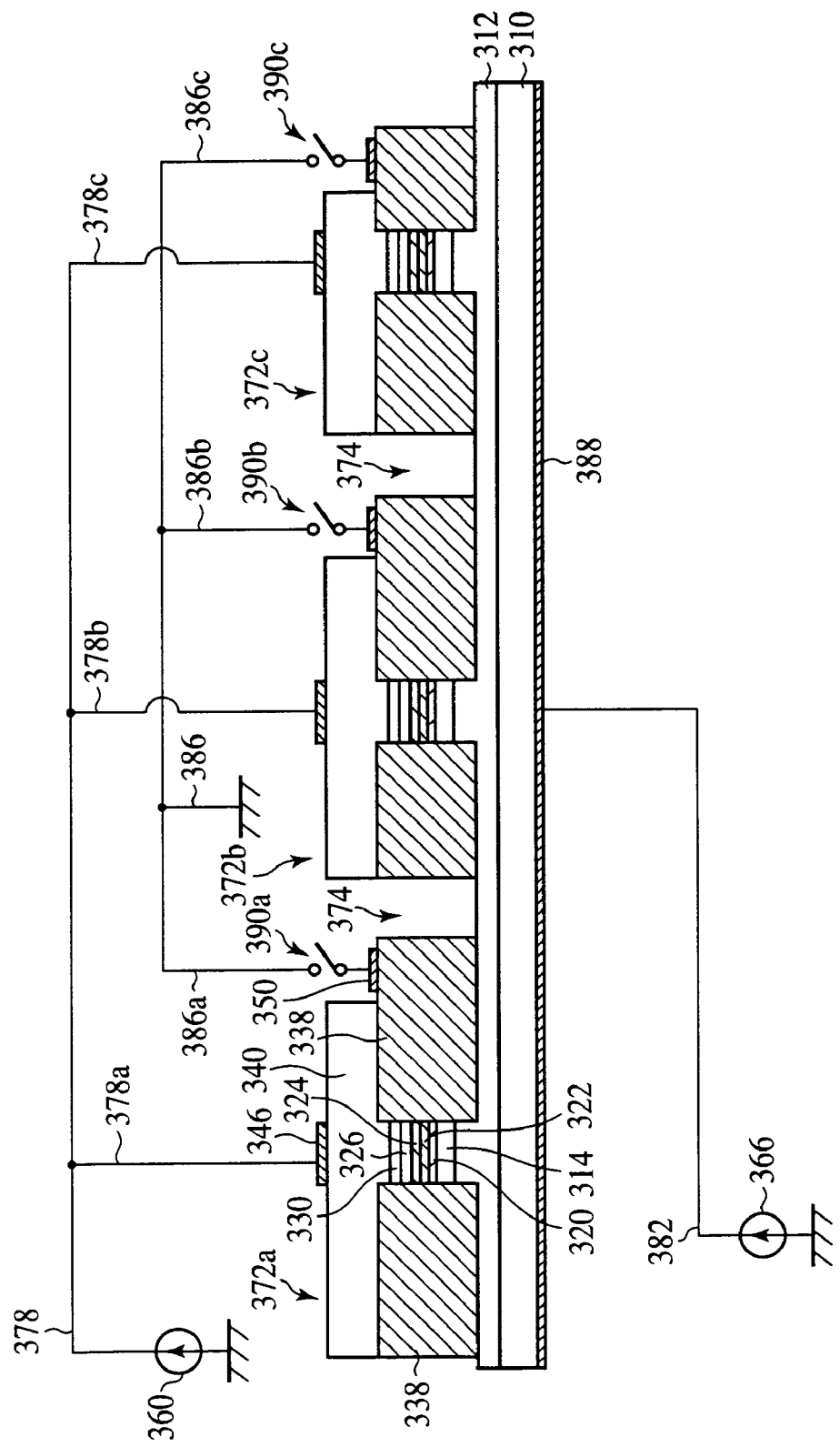
FIG. 30 is a view explaining the principle of the photosemiconductor device according to the present invention (Part 1).

In the photosemiconductor device according to the present invention, as shown in FIG. 30, a plurality of TTG-DFB lasers 372a, 372b, 372c having different wavelength variation ranges are provided on one and he same semiconductor substrate 310 in parallel. Grooves 374 are formed between buried layers 338 of the respective TTG-DFB lasers 372a, 372b, 372c, electrically isolating the buried layers 338 from each other.

On the second surface with no element formed on, i.e. underside of the semiconductor substrate 310, a common electrode 388 is disposed in place of the electrodes 354 formed on the underside of the semiconductor substrate 310 associated with the respective TTG-DFB lasers 372a, 372b, 372c.

The electrode 388 disposed on the underside of the semiconductor substrate 310 is connected to a laser drive electric power source 366 by a wire 382. The electrodes 346 of the respective TTG-DFB lasers 372a, 372b, 372c are connected in parallel to a wavelength control electric power source 360 by wires 378, 378a, 378b, 378c. The electrodes 350 of the respective TTG-DFB lasers 372a, 372b, 372c are connected to a reference voltage, e.g., the earth potential after electrically connected in parallel by wires 386, 386a, 386b, 386c. Drive change-over switches 390a, 390b, 390c are provided in the respective wires 386a, 386b, 386c.

The semiconductor device according to the present invention is characterized mainly in that the drive change-over switches 390a, 390b, 390c are provided respectively in the wires 386a, 386b, 386c connected to the electrodes 350 of the respective TTG-DFB lasers 372a, 372b, 372c. That is, the drive change-over switches 390a, 390b, 390c provided in the wires 386a, 386b, 386c connected to the electrodes 350 for grounding the intermediate layer 322 are opened and closed, whereby the potential of the intermediate layer 322 of a desired one alone of the arrayed plurality of TTG-DFB lasers 372a, 372b, 372c can be the earth potential. That is, that of the TTG-DFB lasers, which can lead out current from the intermediate layer 322 can be optionally changed over. Thus, out of the arrayed plural TTG-DFB lasers 372a, 372b, 372c, a desired one can be made operative. Accordingly, the arrayed plural TTG-DFB lasers 372a, 372b, 372c can be driven independently of each other.

In the photosemiconductor device according to the present invention, it is not necessary that the high-resistance regions are formed in the semiconductor substrate, etc. by ion implantation, as are in FIG. 29, so as to electrically isolate the arrayed TTG-DFB lasers 372a, 372b, 372c form each other. It is not necessary to form the electrodes for injecting current into the MQW active layers 320 are formed for the respective arrayed TTG-DFB lasers, but the electrode formed on the underside of the semiconductor substrate can be used as the common electrode. As described above, the structure of the arrayed lasers of the photosemiconductor device according to the present invention is simple enough to be fabricated by the usual semiconductor process.

Figure 31:
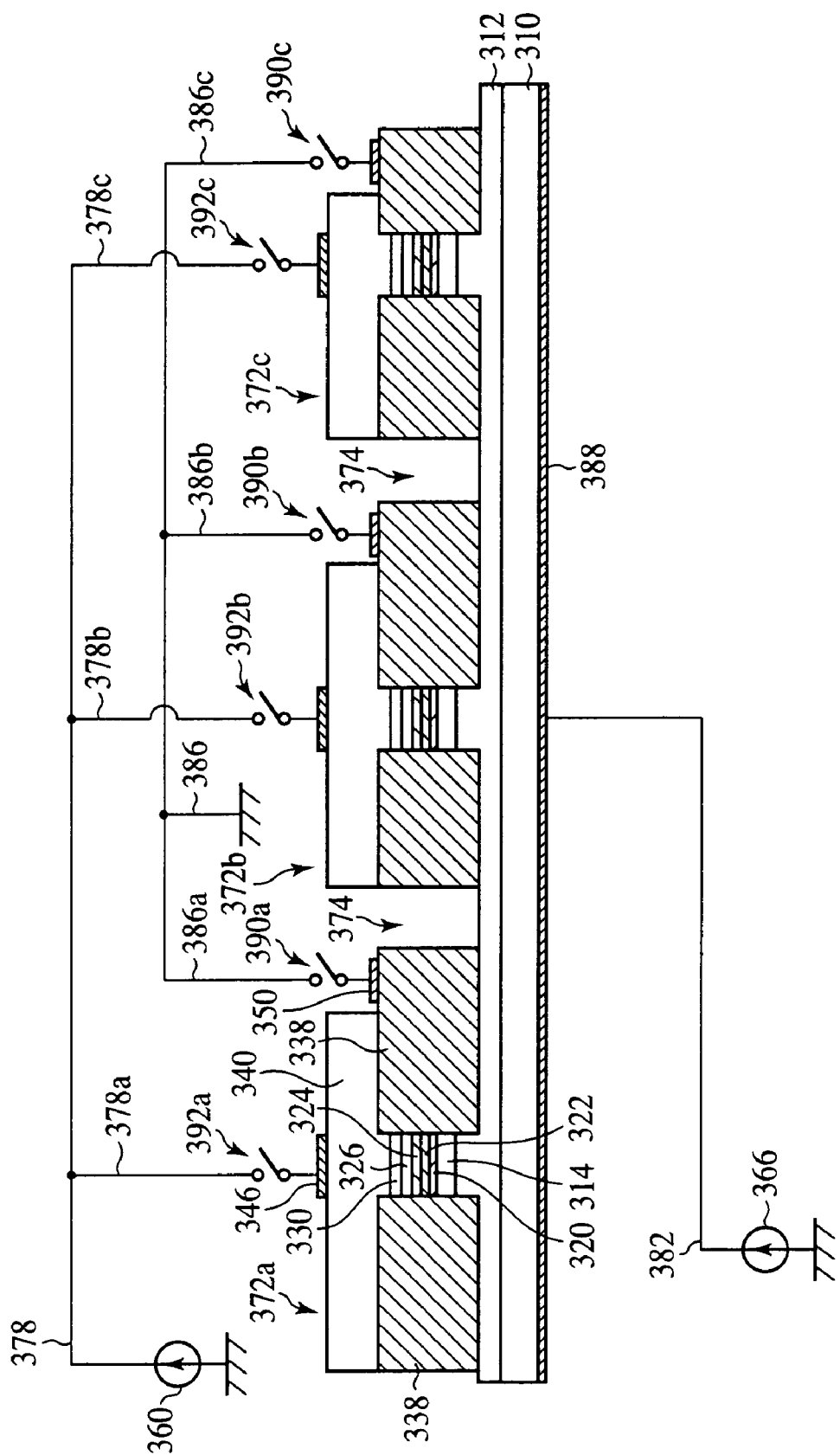
FIG. 31 is a view explaining the principle of the photosemiconductor device according to the present invention (Part 2).

Moreover, as shown in FIG. 31, current injection switches 392a, 392b, 392c may be provided respectively in the wires 378a, 378b, 378c interconnecting the electrodes 346 of the respective TTG-DFB lasers 372a, 372b, 372c and the wavelength control electric power source 360. The current injection switches 392a, 392b, 392c are opened and closed, whereby the current supply to the TTG-DFB lasers can be operated without sudden stop and start of the current supply, and the breakage of the TTG-DFB lasers can be prevented. The photosemiconductor device can be operated, suppressing the generation of reactive power due to leak current, etc. in the TTG-DFB lasers which are not in operation can, and stable laser oscillation at a single wavelength can be realized.

The structure and the driving method of the photosemiconductor device according to the present invention will be detailed with reference to the twelfth to the fourteenth embodiments.

(The Photosemiconductor Device According to the Twelfth Embodiment)

Figure 32:
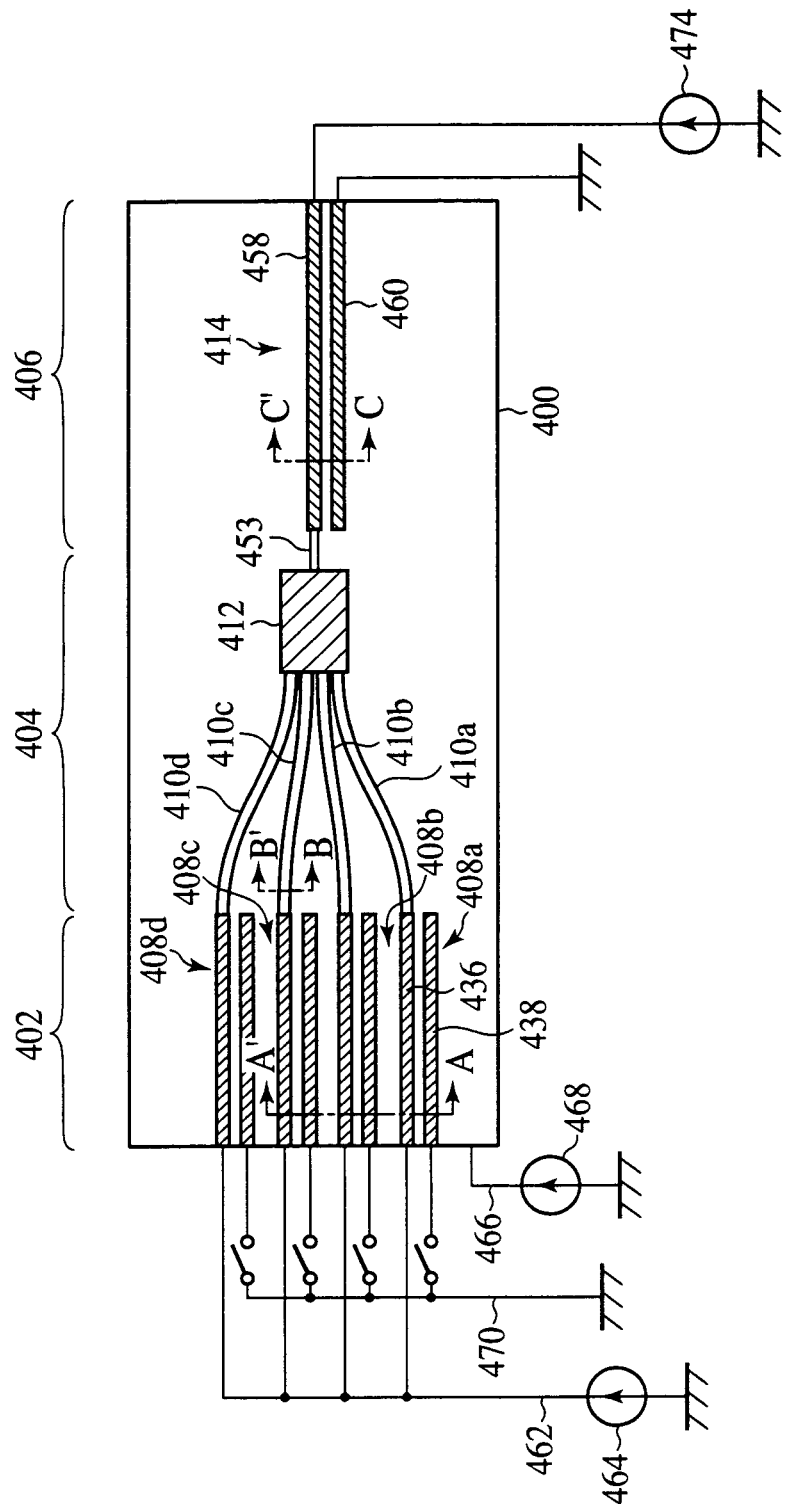
FIG. 32 is a plan view of the photosemiconductor device according to a twelfth embodiment of the present invention, which shows a structure thereof.

The photosemiconductor device according to the twelfth embodiment of the present invention will be explained with reference to FIGS. 32, 33A–33B, 34A–34B, 35A–35C and 36A–36B. FIG. 32 is a plan view of the photosemiconductor device according to the present embodiment, which shows the structure thereof. FIGS. 33A–33B and 34A–34B are sectional views of the photosemiconductor device according to the present embodiment, which show the structure thereof. FIGS. 35A–35C and 36A–36B are views explaining the method for driving the photosemiconductor device according to the present embodiment.

Figures 33A, 33B:
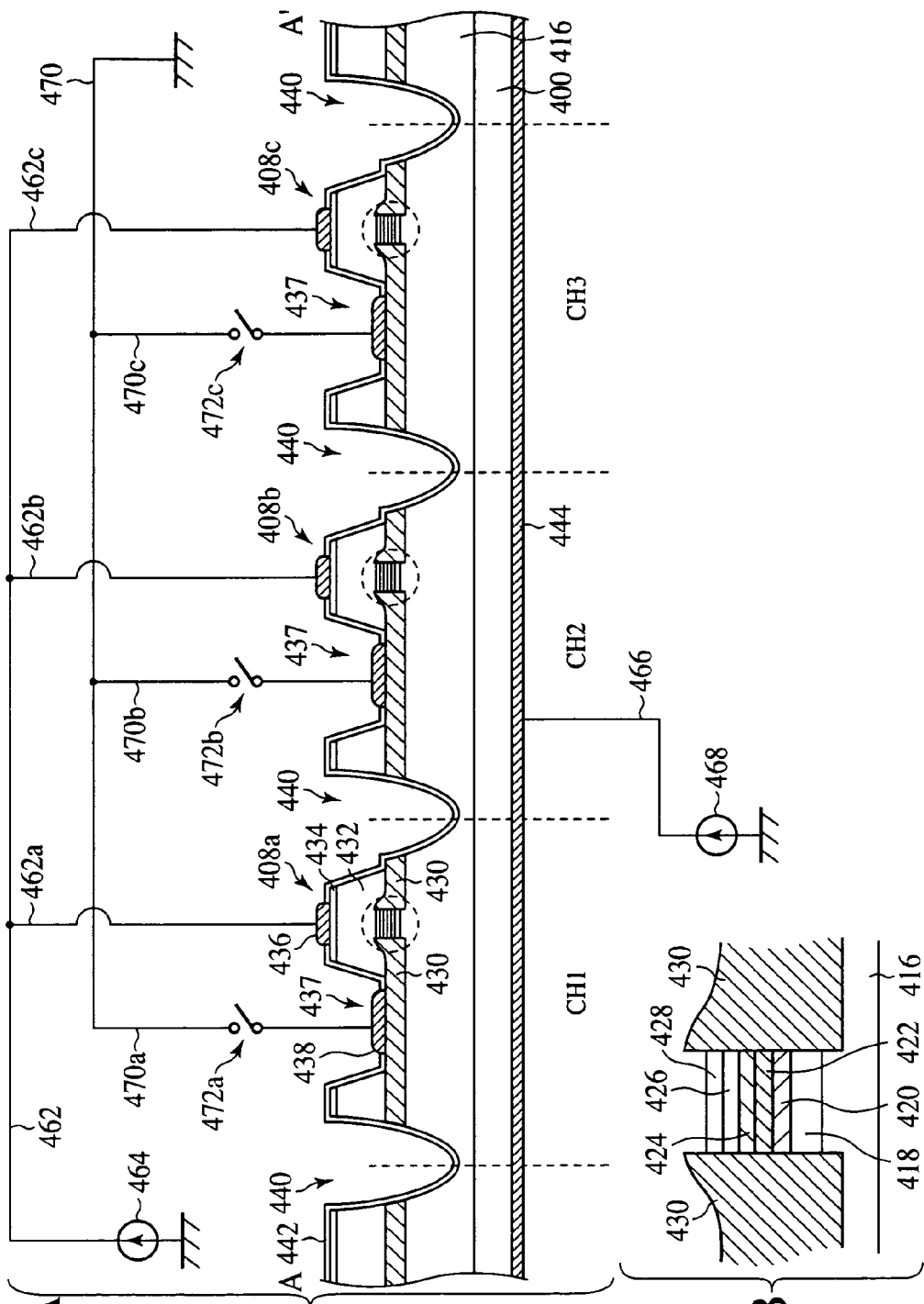
FIGS. 33A–33B are sectional views of the photosemiconductor device according to a twelfth embodiment of the present invention, which show a structure of the laser array part and the drive circuit.
Figure 34A:
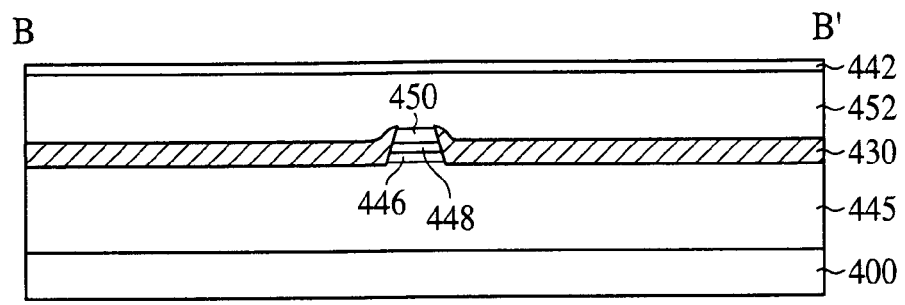
FIGS. 34A–34B are sectional views of the photosemiconductor device according to the twelfth embodiment of the present invention, which show structures of the optical waveguide and the SOA.
Figure 34B:
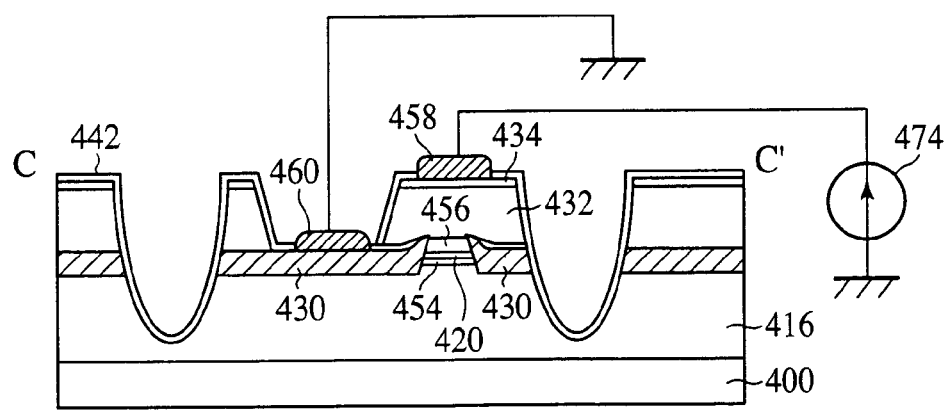

First, the structure of the phtosemiconductor device according to the present embodiment will be explained with reference to FIGS. 32, 33A–33B and 34A–34B. FIG. 33A is the sectional view along the line A–A' in FIG. 32. FIG. 33B is an enlarged view of the part encircled by the broken line in FIG. 33A. FIG. 34A is the sectional view along the line B–B' in FIG. 32. FIG. 34B is the sectional view along the line C–C' in FIG. 32.

As shown in FIG. 32, a laser array part 402, an optical waveguide part 404 and an SOA part 406 are provided on a semiconductor substrate 400 of p type InP of, e.g., a $1 \times 10^{18}$ cm$^{-3}$ dopant dose.

In the laser array part 402, a plurality of TTG-DFB lasers 408a, 408b, 408c, 408d are arrayed in parallel on a semiconductor substrate 400. In the optical waveguide part 404, a plurality of optical waveguides 410a, 410b, 410c, 410d respectively connected to one ends of the TTG-DFB lasers 408a, 408b, 408c, 408d, and an optical coupler 412 which couples light which has propagated through the optical waveguides 410a, 410b, 410c, 410d are formed on the semiconductor substrate 400. In the SOA part 406, an SOA 414 for amplifying the light output from the optical coupler 412 is formed on the semiconductor substrate 400. The length of the respective arrayed TTG-DFB lasers 408a, 408b, 408c, 408d is, e.g., 400 µm. The length of the SOA 424 is, e.g., 600 µm.

The laser array part 402, where the plurality of TTG-DFB lasers 408a, 408b, 408c are arrayed, has the sectional structure shown in FIGS. 33A and 33B.

In the region where the respective TTG-DFB lasers 408a, 408b, 408c are formed, on the semiconductor substrate 400 there are formed a p type InP layer 416, e.g. of a 2000 nm-thickness and a $1 \times 10^{18}$ m$^{-3}$ dopant dose, a lower clad layer 418 of a p type InP layer, e.g. of a $1 \times 10^{18}$ m$^{-3}$ dopant dose, an MQW active layer 420, an intermediate layer 422 of an n type InP layer, e.g., of a 160 nm-thickness and a $1 \times 10^{18}$ m$^{-3}$ dopant dose, a wavelength tuning layer 424 of an InGaAsP layer of, e.g., a 290 nm-thickness and a 1.3 µm-composition, an InGaAsP layer 426, e.g., of a 290 nm-thickness and a 1.3 µm-composition with a diffraction grating formed in, and a buried layer 428 of a InP layer of, e.g., a 100 nm-thickness.

The MQW active layer 420 is formed, e.g., of a 100 nm-thickness SCH layer of InGaAsP of a 1.15 µm-composition, a 40 nm-thickness SCH layer of InGaAsP of a 1.25 µm-composition, a multiple quantum well layer of a 1.55 µm-PL wavelength of the MQW and a 40 nm-thickness SCH layer of InGaAsP of a 1.25 µm-composition are laid the latter on the former, and the multiple quantum well layer is sandwiched by the SCH layers. The multiple quantum well layer is formed, e.g., by laying a 9 nm-thickness barrier layer of InGaAsP of a 1.25 µm-composition and a 7 nm-thickness InGaAsP well layer with a 0.8% compressive strain introduced in the latter on the former 7 times.

The buried layer 428, the InGaAsP layer 426, the wavelength tuning layer 424, the intermediate layer 422, the MQW active layer 420 and the lower clad layer 418 are patterned in a mesa, forming a mesa stripe with the active layer set in, e.g., a 1.0 µm-width.

A buried layer 430 of an n type InP layer of, e.g., a $2\times10^{18}$ cm$^{-3}$ dopant dose and a 1500 nm-thickness is formed on both sides of the mesa stripe. On the buried layers 428, 430, a p type InP layer 432 of, e.g., a $1\times10^{18}$ cm$^{-3}$ dopant dose and a 5000 nm-thickness is formed. On the p type InP layer 432, an electrode 436 of Au/Zn are formed with a contact layer 434 of a p type InGaAs layer of, e.g., a $1\times10^{18}$ cm$^{-3}$ dopant dose and a 500 nm-thickness formed therebetween. Grooves 437 are formed in the p type InP layer 432 down to the buried layer 430. On the buried layer 430, an electrode 438 are formed of Au/Ge. The depth of the grooves 437 is, e.g., 6.0 µm.

A plurality of TTG-DFB lasers 408a, 408b, 408c having the above-described structure are arrayed in parallel with each other with the grooves 440 therebetween. The grooves 440 are formed in the p type InP layer 432, the buried layer 430 and the p type InP layer 416 between each of the TTG-DFB lasers and the adjacent one, electrically isolating the TTG-DFB lasers from each other. The grooves 440 has a depth of, e.g., 8 µm and formed on both sides of each mesa at a 15 µm-distance.

The respective arrayed TTG-DFB lasers 408a, 408b, 408c , (408d) have different cycles of the diffraction gratings formed in the respective InGaAsP layers 426 and thus have oscillation central wavelengths different from one another. The cycles of the diffraction gratings of the TTG-DFB lasers 408a, 408b, 408d , (408d) are, e.g., 240 nm, 241.2 nm, 242.4 nm and 243.6 nm, respectively.

A protection film 442 of a silicon oxide film of, e.g., a 300 nm-thickness is formed on the exposed surfaces of the p type InP layers 416, 432 and the buried layer 430.

An electrode 444 of Au/Zn which is commonly used by the respective TTG-DFB lasers 408a, 408b, 408c, (408d) is formed on the second surface with no element formed on, i.e. the underside of the semiconductor substrate 400.

The respective optical waveguides 410a, 410b, 410c, 410d of the optical waveguide part 404 have the sectional structure shown in FIG. 34A.

On the semiconductor substrate 400, a p type InP layer 445 of, e.g., a $2\times10^{18}$ cm$^{-3}$ dopant dose and a 2000 nm-thickness is formed. On the p type InP layer 445, a lower clad layer 446 of p type InP of, e.g., a $1\times10^{18}$ cm$^{-3}$ dopant dose and a 200 nm-thickness, a core layer 448 of non-doped InGaAsP of, e.g., a 200 nm-thickness and a 1.3 µm-composition and an upper clad layer 450 of p type InP of, e.g., a $1\times10^{18}$ cm$^{-3}$ and a 350 nm-thickness are sequentially laid the latter on the former.

The upper clad layer 450, the core layer 448 and the lower clad layer 446 are patterned in a mesa, forming a mesa stripe of, e.g., a 1.0 µm-core layer width.

A buried layer 430 of an n type InP layer is formed on both sides of the mesa stripe. On the buried layer 430 and the upper clad layer 450, a p type InP layer 452, e.g., of a $2\times10^{18}$ cm$^{-3}$ and a 5000 nm-thickness is formed. On the p type InP layer 452, a protection film 442 of a silicon oxide film is formed.

On one ends of the respective optical waveguides 410a, 410b, 410c, 410d, the mesa stripes of the respective TTG-DFB lasers 408a, 408b, 408c, 408d and the mesa stripes of the respective optical waveguides 410a, 410b, 410c, 410d are arranged continuous to each other. The MQW active layers 420 of the TTG-DFB lasers and the core layers 448 of the optical waveguides are optically connected to each other.

The other ends of the respective optical waveguides 410a 410b, 410c, 410d are optically connected to the input end of the optical coupler 412 having the same layer structure as the optical waveguides on the semiconductor substrate 400. The output end of the optical coupler 412 is optically connected to the SOA 414 via an optical waveguide 453 having the same layer structure and formed on the semiconductor substrate 400. The optical coupler 412 can be provided by, e.g., MMI (Multi-Mode Interference) waveguide optical coupler. The size of the MMI optical coupler is about 40×300 µm.

The SOA part 406 has the sectional structure shown in FIG. 34B.

On the semiconductor substrate 400, there are formed a p type InP layer 416, a lower clad layer 454 of an n type InP layer of, e.g., a $1\times10^{18}$ cm$^{-3}$ dopant dose and a 500 nm-thickness, an MQW active layer 420 and an upper clad layer 456 of a p type InP layer of, e.g., a $1\times10^{18}$ cm$^{-3}$ dopant dose and a 800 nm-thickness.

The MQW active layer 420 of the SOA part 406 is formed, e.g., of a 40 nm-thickness SCH layer of a 1.25 µm-composition InGaAsP, a multiple quantum well layer of a 1.54 µm-PL wavelength of the MQW and a 40 nm-thickness SCH layer of InGaAsP of a 1.25 µm-composition laid the latter on the former, and the multiple quantum well layer is sandwiched by the SCH layers. The multiple quantum well layer is formed, e.g., of a 10 nm-thickness barrier layer of a 1.25 µm-composition and a 5.1 nm-thickness InGaAsP well layer with a 0.8% compressive strain introduced in which are laid the latter on the former 6 times.

The upper clad layer 456, the MQW active layer 420 and the lower clad layer 454 are patterned in a mesa, forming a mesa stripe having, e.g., a 1.0 µm-active layer width. A buried layer 430 of an n type InP layer is formed on both sides of the mesa stripe. A p type InP layer 432 is formed on the upper clad layer 456 and the buried layer 430. On the p type InP layer 432, an electrode 458 of Au/Zn is formed with a contact layer 434 of a p type InGaAs layer formed therebetween. On the buried layer 430, an electrode 460 of Au/Ge is formed. A protection film 442 of a silicon oxide film is formed on the exposed surfaces of the p type InP layers 416, 432 and the buried layer 430.

Then, the driving circuit for the arrayed TTG-DFB lasers, and the driving circuit for the SOA will be explained. In FIG. 32, 4 TTG-DFB lasers 408a, 408b, 408d, 408d are shown, but for the convenience of the explanation, the driving circuit of 3 TTG-DFB lasers 408a, 408b, 408c will be explained. In the explanation of the driving method of the photosemiconductor device which will be described later as well, the 3 TTG-DFB lasers 408a, 408b, 408c will be explained.

In the laser array part 402, as shown in FIGS. 32 and 33A, the electrodes 436 of the respective TTG-DFB lasers 408a, 408b, 408c are connected in parallel to the wavelength control electric power source 464 by the wires 462, 462a, 462b, 462c. The electrode 444 formed on the underside of the semiconductor substrate 400 is connected to the laser drive electric power source 468 by a wire 466. The electrodes 438 of the respective TTG-DFB lasers 408a, 408b, 408c are connected in parallel to the wires 470, 470a, 470b, 470c and then connected to a reference potential, e.g., grounded. Drive change-over switches 472a, 472b, 472c are provided in the respective wires 470a, 470b, 470c. The drive change-over switches 472a, 472b, 472c are closed to thereby connect the electrodes 438 of the respective TTG-DFB lasers 408a. 408b, 408c to the reference potential. The drive change-over switches 472a, 472b, 472c are opened to thereby disconnect the electrodes 438 of the respective TTG-DFB lasers 408a, 408b, 408c from the reference potential.

In the SOA part 406, as shown in FIGS. 32 and 34B, the electrode 458 of the SOA 414 is connected to a light amplification electric power source 474 by wiring. The electrode 460 of the SOA 414 is connected by wiring to the reference potential, e.g., grounded.

Next, the method for driving the photosemiconductor device according to the present embodiment will be explained with reference to FIGS. 33A–33B, 34A–34B, 35A–35C and 36A–36B. In this description, the TTG-DFB lasers 408a, 408b, 408c on the left side, at the center and the right side of FIG. 33A oscillate respective signal light CH1, CH2, CH3. In the circuit diagrams of FIGS. 35A–35C and 36A–36B, the MQW active layers 420 and the wavelength tuning layers 424 of the TTG-DFB lasers 408a, 408b, 408c are represented by marks indicative diodes.

Figure 35A:
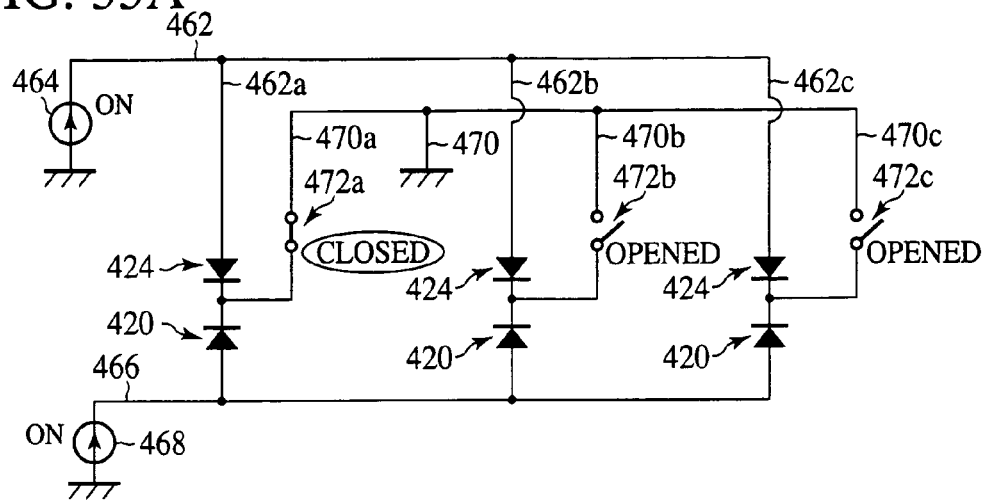
FIGS. 35A–35C are views explaining the method for driving the photosemiconductor device according to the twelfth embodiment of the present invention (Part 1).

FIG. 35A shows the state of the driving circuit, in which the TTG-DFB laser 408a alone, which oscillates signal light CH1, is driven and is placed in the steady state having a prescribed oscillation wavelength. The state of the switches provided in the wires 470a, 470b, 470c at this time is that the drive change-over switch 472a is closed, and the drive change-over switches 472b, 472c are opened. With the switches in this state, the wavelength control electric power source 464 and the laser drive electric power source 468 are driven, and prescribed source voltages are generated respectively in the wavelength control electric power source 464 and the laser drive electric power source 468.

In the TTG-DFB laser 408a of CH1, the drive change-over switch 472a is closed. Accordingly, the intermediate layer 422 of the TTG-DFB laser 408a is grounded, and current is injected into the MQW active layer 420 and the wavelength tuning layer 434. Thus, the TTG-DFB 408a of CH1 is in the driven state.

On the other hand, in the TTG-DFB laser 408b of CH2 and the TTG-DFB laser 408c of CH3, the drive change-over switches 472b, 472c are opened. Accordingly, the intermediate layer 422 of the TTG-DFB lasers 408b, 408c is not grounded and is floating, and no current is injected into the MQW active layer 420 and the wavelength tuning layer 434. Thus, the TTG-DFB lasers 408b, 408c of CH2 and CH3 are not driven.

Thus, in FIG. 35A, out of the arrayed TTG-DFB lasers 408a, 408b, 408c the TTG-DFB laser 408a alone is driven independently. The case in which the drive of the TTG-DFB laser 408a of CH1 is finished, and then the drive of the TTG-DFB laser 408b of CH2 follows will be explained below.

Figure 35B:
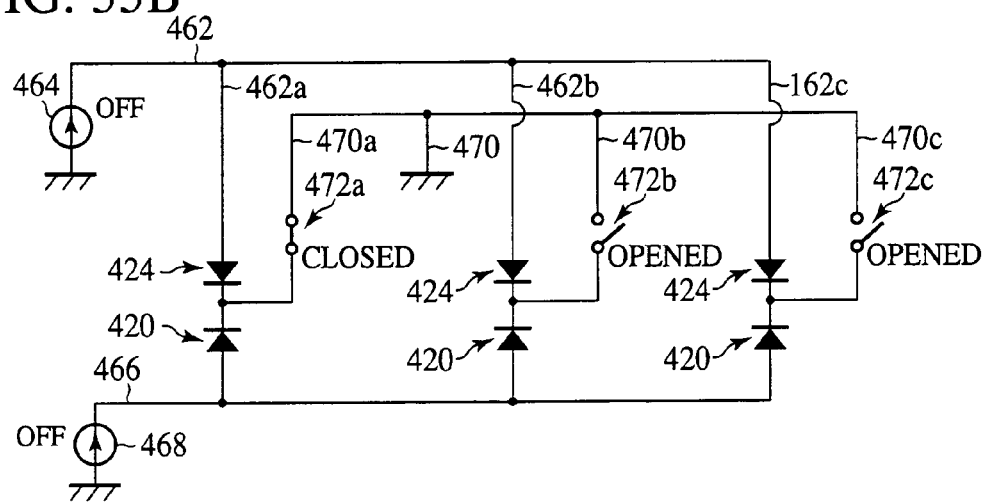

First, the drive of the wavelength control electric power source 464 and the laser drive electric power source 468 is stopped in the state of FIG. 35A, and the generation of the source voltage in the wavelength control electric power source 464 and the laser drive electric power source 468 is stopped (refer to FIG. 35B). Thus, the injection of current into the wavelength tuning layer 424 and the MQW active layer 420 of the TTG-DFB laser 408a of CH1 is stopped.

Figure 35C:
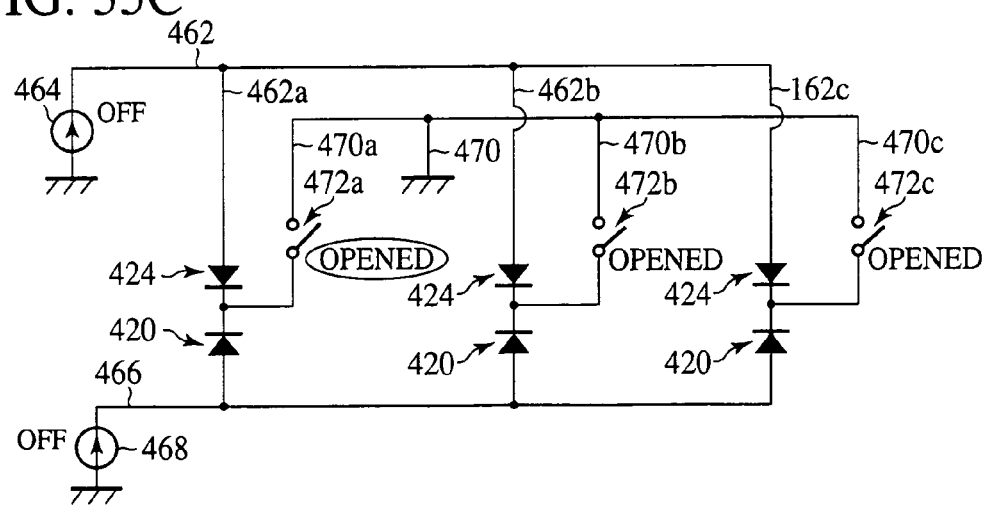

Then, the drive change-over switch 472a of the TTG-DFB laser 408a of CH1 is opened, and all the drive change-over switches 472a, 472b, 472c of CH1–CH3 are opened (refer to FIG. 35C).

Then, the drive change-over switch 472b of the TTG-DFB laser 408b of CH2 is closed. The drive change-over switches 472a, 472c of the TTG-DFB lasers of CH1 and CH3 are kept opened (refer to FIG. 36A).

Figure 36A:
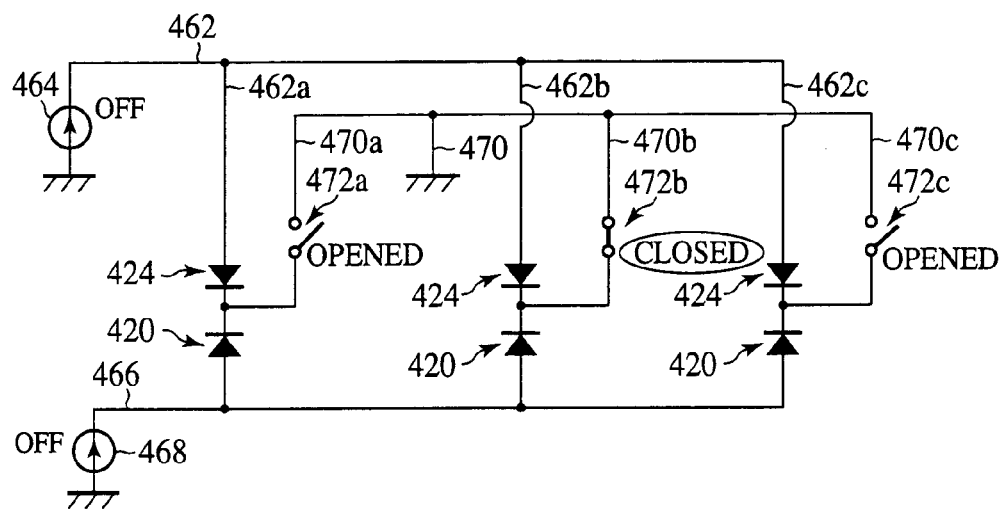
FIGS. 36A–36B are views explaining the method for driving the photosemiconductor device according to the twelfth embodiment of the present invention (Part 2).
Figure 36B:
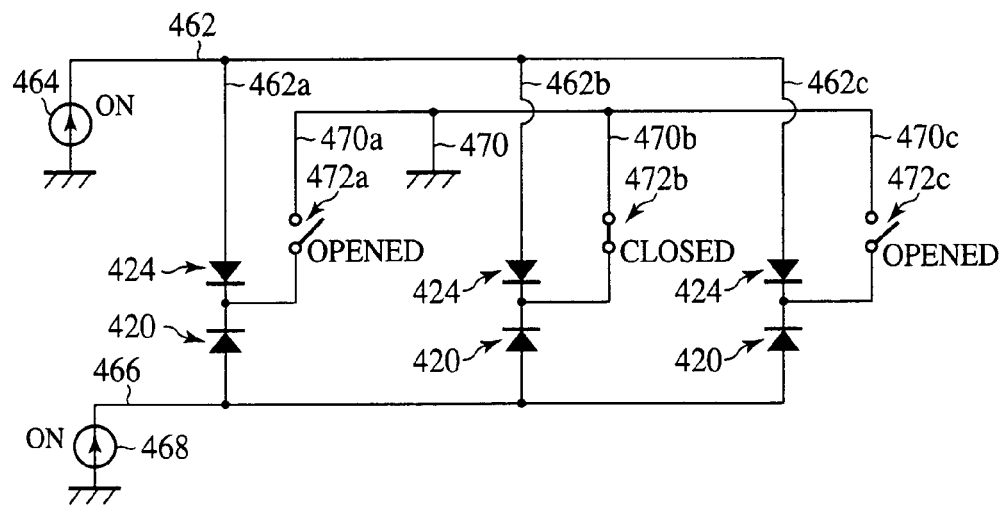

Next, the drive of the wavelength control electric power source 464 and the laser drive electric power source 468 are resumed to generate a prescribed source voltage in the wavelength control electric power source 464 and in the laser drive electric power source 468 (refer to FIG. 36B). Current is injected into the wavelength tuning layer 424 and the MQW active layer 420 of the TTG-DFB laser 408b of CH2, and the current is led out from the intermediate layer 422. Thus, the TTG-DFB laser 408b of CH2 is driven and is placed in the steady state having a prescribed oscillation wavelength. The current amount to be injected into the wavelength tuning layer 424 from the wavelength control electric power source 464 is adjusted, whereby the oscillation wavelength of the TTG-DFB laser 408b CH2 can be controlled.

On the other hand, in the TTG-DFB lasers 408a, 408c of CH1 and CH3, the drive change-over switches 472a, 472c are set opened. Accordingly, the intermediate layer 422 of the TTG-DFB lasers 408a, 408c are not grounded and in the floating state. No current is injected into the MQW active layer 420 and the wavelength tuning layer 424. Thus, the TTG-DFB lasers 408a, 408c of CH1 and CH3 are not driven.

As described above, the drive of the TTG-DFB laser 408a of CH1 is changed over to the drive of the TTG-DFB laser 408b of CH2.

The change-over of the drive of one of the TTG-DFB lasers to another, e.g., the change-over of the drive of the TTG-DFB laser 408b of CH2 to the drive of the TTG-DFB laser 408c of CH3, is performed in the same way as described above.

As described above, the drive of a plurality of TTG-DFB lasers having different wavelength variation ranges is changed over, or the control of the oscillation wavelengths of the TTG-DFB lasers is made, whereby signal light of desired wavelengths over wider wavelength variation ranges can be provided.

The signal light provided in the laser array part 402 propagates through one of the optical waveguides 410a, 410b, 410c which is connected to the driving TTG-DFB laser, and then enters the MQW active layer 420 of the SOA 414 via the optical coupler 412.

In the SOA 414, a prescribed voltage is applied between the electrode 458 and the electrode 460 to inject current from the electrode 458. The current injected from the electrode 458 is injected into the MQW active layer 420 via the p type InP layer 432 and the upper clad layer 456 and led out from the electrode 460 via the lower clad layer 454 and the buried layer 430. By injecting the prescribed current into the MQW active layer 420, the light which has been emitted by the driving TTG-DFB laser and propagated through the MQW active layer 420 can be amplified.

As described above, according to the present embodiment, the drive change-over switches 472a, 472b, 472c provided in the wires 470a, 470b, 470c electrically connected to the intermediate layer 422 of a plurality of arrayed TTG-DFB lasers are opened and closed to ground the intermediate layer 422 of that of the TTG-DFB laser to be driven to thereby lead out current, whereby the respective TTG-DFB lasers can be driven independently of each other. Thus, high photooutputs can be realized over wider wavelength variation ranges in comparison with the use of one TTG-DFB laser.

[A Thirteenth Embodiment]

Figures 37A, 37B:
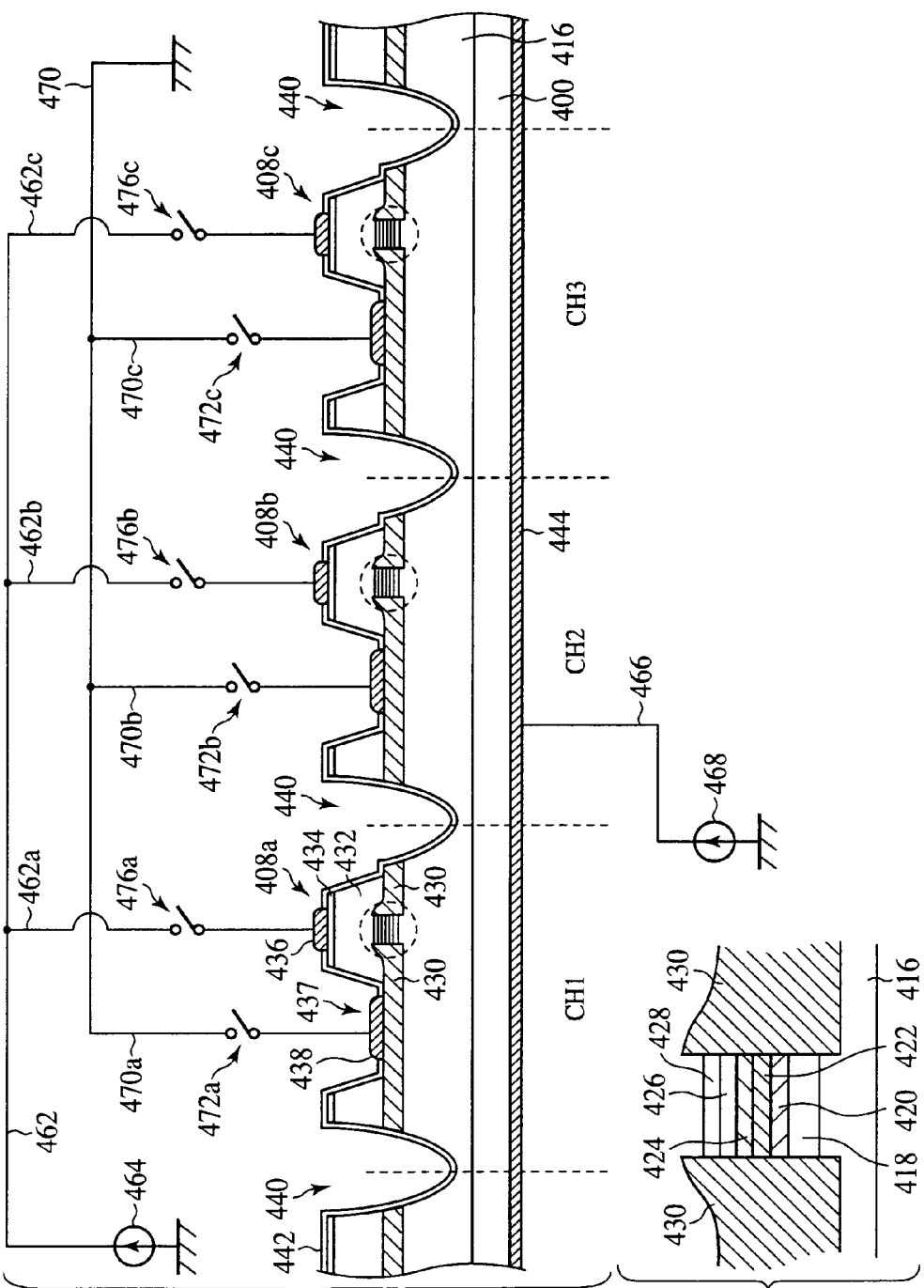
FIGS. 37A–37B are sectional views of the photosemiconductor device according to a thirteenth embodiment of the present invention, which show a structure of the laser array part and the driving circuit.

The photosemiconductor device according to a thirteenth embodiment of the present invention will be explained with reference to FIGS. 37A–37B, 38A–38C and 39A–38B. FIGS. 37A–37B are sectional views of the photosemiconductor device according to the thirteenth embodiment of the present invention, which show the structure of the laser array part and the driving circuit. FIGS. 38A–38C and 39A–39B are views explaining the method for driving the photosemiconductor device according to the present embodiment. The same members of the present embodiment as those of the photosemiconductor device according to the twelfth embodiment shown in FIGS. 32, 33A–33B, 34A–34B, 35A–35C and 36A–36B are represented by the same reference numbers not to repeat or to simplify their explanation.

In the photosemiconductor device according to the twelfth embodiment, no switches are provided in the wires 462, 462a, 462b, 462c interconnecting the wavelength control electric power source 464 and electrodes 436 of the respective TTG-DFB lasers 408a, 408b, 408c which are arrayed. Accordingly, when the photosemiconductor device is in operation, current is injected into the wavelength tuning layer 424 of the TTG-DFB lasers which are not driven. Resultantly, reactive power is generated due to leak current, etc. in the TTG-DFB lasers which are not driven. Cases that stable laser oscillation at a single wavelength is difficult might take place.

The basic structure of the photosemiconductor device according to the present embodiment is the same as that of the photosemiconductor device according to the twelfth embodiment shown in FIGS. 32, 33A–33B and 34A–34B. FIG. 37A is a sectional view of the photosemiconductor device according to the present embodiment, which shows the structure of the laser array part and the drive circuit. FIG. 37B is an enlarged view of the part encircled by the broken line in FIG. 37A. The photosemiconductor device according to the present embodiment corresponds to the photosemiconductor device according to the twelfth embodiment including current injection switches 476a, 476b, 476c respectively provided in the wires 462a, 462b, 462c. The current injection switches 476a, 476b, 476c are closed to thereby connect the electrodes 436 of the respective TTG-DFB lasers 408a, 408b, 408c to the wavelength control electric power source 464. The current injection switches 476a, 476b, 476c are opened to thereby disconnect the electrodes 436 of the respective TTG-DFB lasers 408a, 408b, 408c from the wavelength control electric power source 464. The current injection switches 476a, 476b, 476c are thus opened and closed, whereby the generation of reactive power due to the leak current, etc. in the TTG-DFB lasers not driven is prevented, and the stable laser oscillation at a single wavelength can be realized.

Then, the method for driving the photosemiconductor device according to the present embodiment will be explained with reference to FIGS. 37A–37B, 38A–38C and 39A–39B.

Figure 38A:
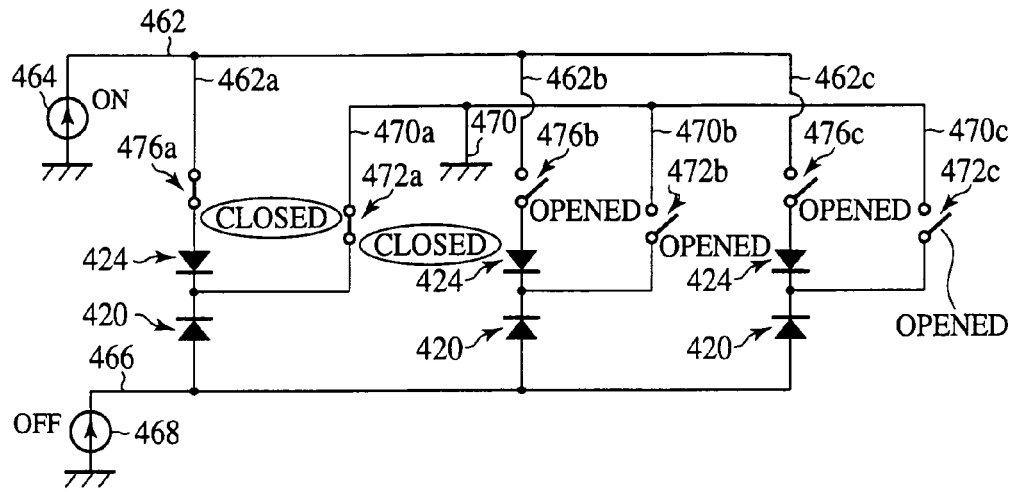
FIGS. 38A–38C are views explaining the method for driving the photosemiconductor device according to the thirteenth embodiment of the present invention (Part 1).

FIG. 38A shows the state of the driving circuit where the TTG-DFB laser 408a of CH1 is driven and is in the steady state having a prescribed oscillation wavelength. The state of the drive change-over switches at this time is that the drive change-over switch 472a is closed, and the drive change-over switches 472b, 472c are opened. The state of the current injection switches is that the current injection switch 476a is closed, and the current injection switches 476b, 476c are opened. The wavelength control electric power source 464 and the laser drive electric power source 468 are driven, and as in the twelfth embodiment, current is injected into the MQW active layer 420 and the wavelength tuning layer 424 alone of the TTG-DFB laser 408a of CH1.

Then, the case that the drive of the TTG-DFB laser 408a of CH1 is finished, and the drive of the TTG-DFB laser 408b follows will be explained.

Figure 38B:
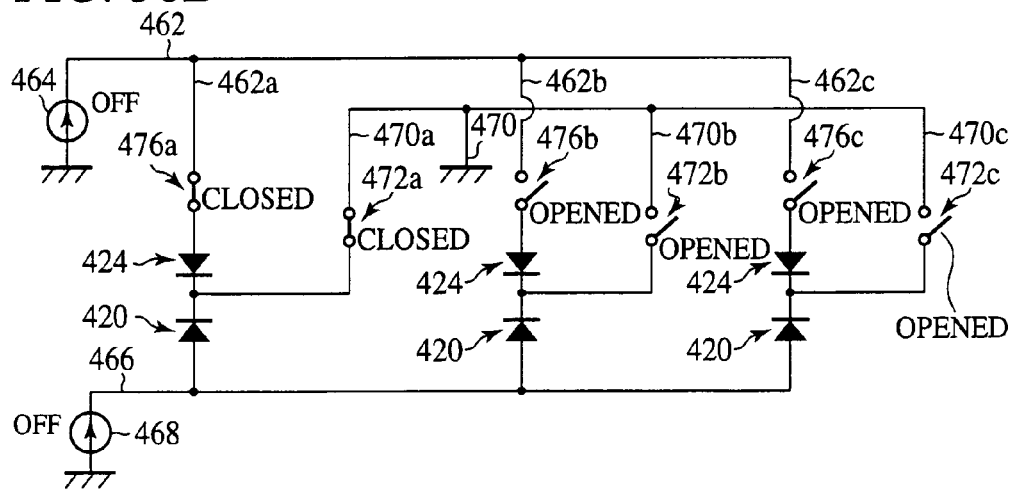

First, in the state shown in FIG. 38A, the drive of the wavelength control electric power source 464 and the laser drive electric power source 468 are stopped (refer to FIG. 38B).

Figure 38C:
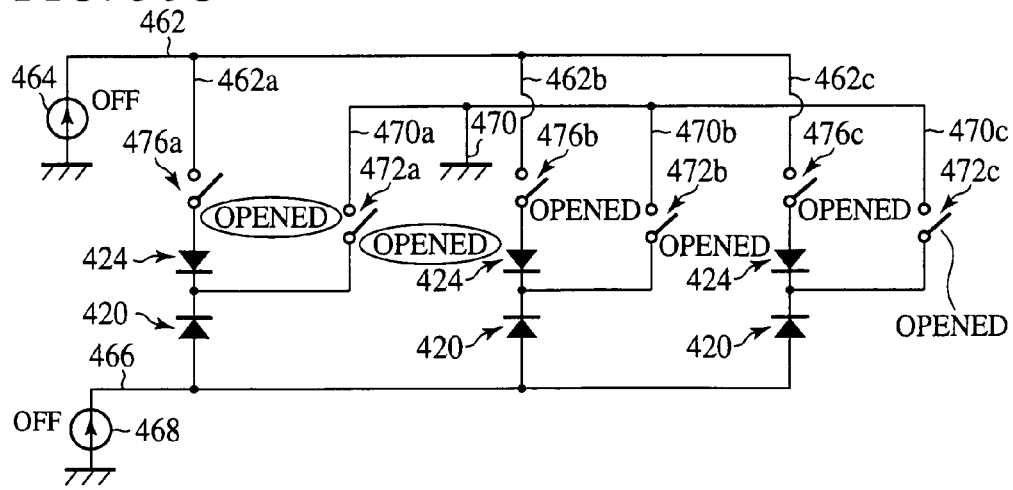

Then, the drive change-over switch 472a and the current injection switch 476a of the TTG-DFB laser 408a of CH1 are opened, and all the drive change-over switches 472a, 472b, 472c and the current injection switches 476a, 476b, 476c of the TTG-DFB lasers of CH1–CH3 are opened (refer to FIG. 38C). Here, the drive change-over switch 472a and the current injection switch 476a are opened after the drive of the wavelength control electric power 464 is stopped, so that the breakage of the TTG-DFB laser due to the sudden stop of the current injection into the wavelength tuning layer 424 is prevented.

Then, the drive change-over switch 472b and the current injection switch 476b of the TTG-DFB laser 408b of CH2 are closed. The drive change-over switches 472a, 472c and the current injection switches 476a, 476c of the TTG-DFB lasers 408a, 408c of CH1 and CH3 are kept opened (refer to FIG. 39A).

Figure 39A:
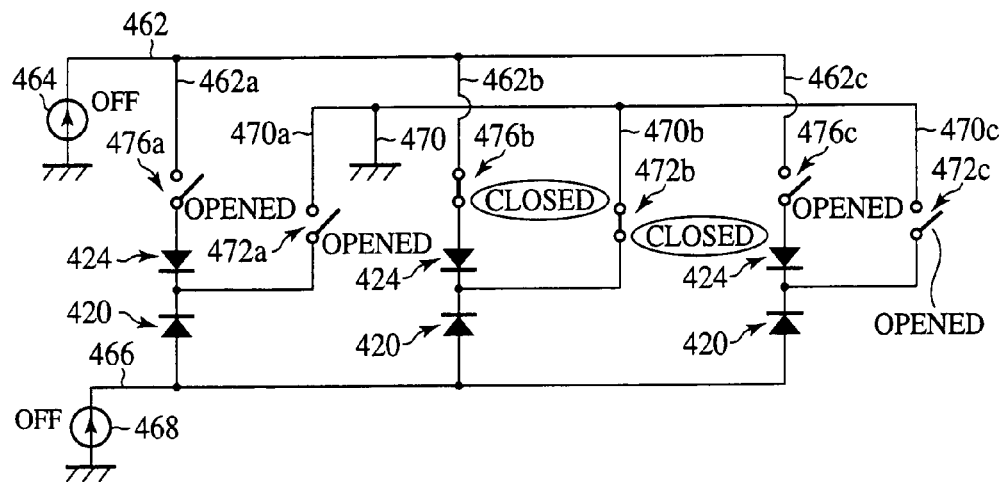
FIGS. 39A–39B are views explaining the method for driving the photosemiconductor device according to the thirteenth embodiment of the present invention (Part 2).
Figure 39B:
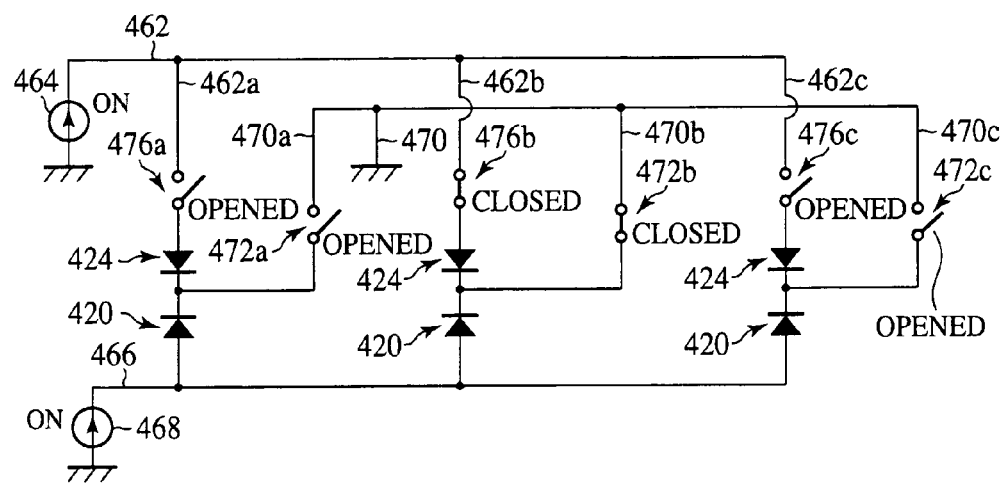
Figure 41:
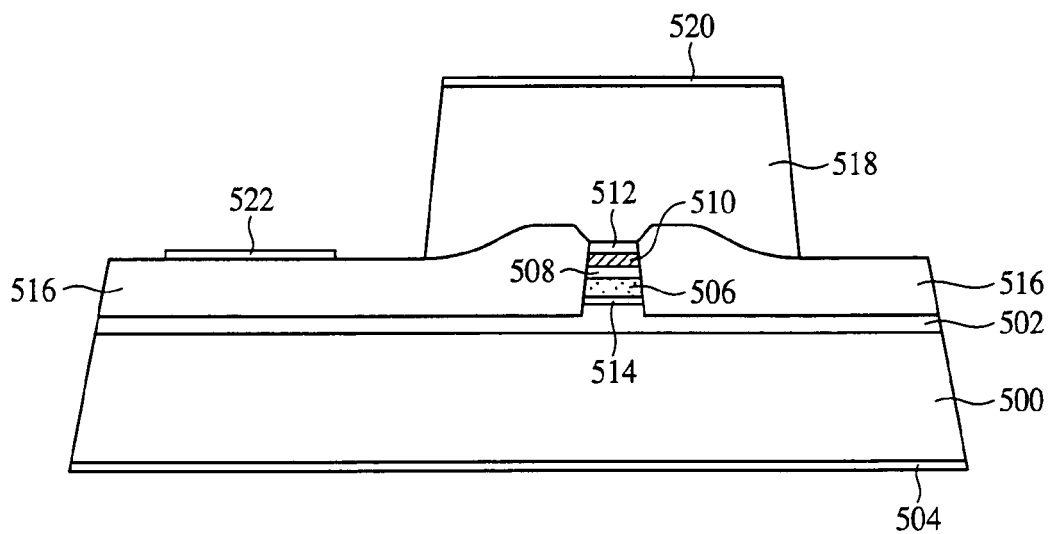
FIG. 41 is a sectional view of the TTG-LD structure.

Then, the drive of the wavelength control electric power source 464 and the laser drive electric power source 468 are resumed (refer to FIG. 39B). Thus, as in the twelfth embodiment, current is injected into the wavelength tuning layer 424 and the MQW active layer 420 of the TTG-DFB laser 408b of CH2 alone, and the TTG-DFB laser 408b of CH2 alone is driven. Here, the drive change-over switch 472b and the current injection switch 476b are closed before the drive of the wavelength control electric power source 464 is resumed, so that the breakage of the TTG-DFB laser due to the sudden start of the current injection into the tuning layer 424 is prevented.

Thus, the TTG-DFB laser to be driven is changed over.

As described above, the method for driving the photosemiconductor device according to the present embodiment is characterized mainly in that the drive of the wavelength control electric power source 464 and the laser drive electric power source 468 are stopped, the drive change-over switch and the current injection switch of the driven TTG-DFB laser are opened, and then after the drive change-over switch and the current injection switch of the TTG-DFB laser to be driven are closed, the drive of the wavelength control electric power source 464 and the laser drive electric power source 468 is resumed. Thus, the sudden stop and the sudden start of the current supply to the TTG-DFB lasers do not take place, whereby the breakage of the TTG-DFB lasers can be prevented.

The photosemiconductor device according to the present embodiment is also characterized mainly in that the current injection switches of the TTG-DFB lasers which are not driven are opened. Thus, the generation of reactive power due to the leak current, etc. in the TTG-DFB lasers not driven is prevented, and the stable laser oscillation at a single wavelength can be realized.

In the present embodiment, the drive change-over switches 472a, 472b, 472c of the respective TTG-DFB lasers 408a, 408b, 408c and the current injection switches thereof may be interlocked to concurrently perform the switching operations. That is, at the same time that the drive change-over switch 472a is opened, the current injection switch 476a is opened, and at the same time that the drive change-over switch 472a is closed, the current injection switch 476a is closed. This is the same with the drive change-over switch 472b and the current injection switch 476b and with the drive change-over switch 472c and the current injection switch 476c. Such interlocked switching operation allows the TTG-DFB laser to be driven to be changed over at higher response speed.

[A Fourteenth Embodiment]

The photosemiconductor according to a fourteenth embodiment of the present invention will be explained with reference to FIGS. 40A–40B. FIG. 40A is sectional views of the photosemiconductor device according to the present embodiment, which shows the structure of the laser array part and the drive circuit. FIG. 40B is an enlarged view of the part encircled by the broken line in FIG. 40A. The same members of the present embodiment as those of the photosemiconductor device according to the thirteenth embodiment shown in FIG. 37 are represented by the same reference numbers not to repeat or to simplify their explanation.

The photosemiconductor device according to the present embodiment is substantially the same as the photosemiconductor device according to the thirteenth embodiment except that, as shown in FIG. 40B, in the former, the layer structure from the MQW active layer 420 to the buried layer 428 of the TTG-DFB lasers 408a, 408b, 408c is reversed.

That is, the laser array part 402 has the sectional structure shown in FIGS. 40A and 40B. In the region where the TTG-DFB lasers 408a, 408b, 408c are formed, on a semiconductor substrate 400 of p type InP there are formed a p type InP layer 416, an InGaAsP layer 426 with a diffraction grating formed in, a buried layer 428 of an InGaAsP layer, a wavelength tuning layer 424 of an InGaAsP layer, an intermediate layer 422 of an n type InP layer and an MQW active layer 420. The MQW active layer 420, the intermediate layer 422, the wavelength tuning layer 424, the buried layer 428 and the InGaAsP layer 426 are patterned in a mesa, forming a mesa stripe. A buried layer 430 of an n type InP layer is formed on both sides of the mesa stripe. A p type InP layer 432 is formed on the MQW active layer 420 and the buried layer 430. On the p type InP layer 432, an electrode 436 of Au/Zn is formed with a contact layer 434 of a p type InGaAs layer formed therebetween. On the buried layer 430, an electrode 438 of Au/Ge is formed. An electrode 444 of Au/Zn is formed on the second surface with no element formed on, i.e. the underside of the semiconductor substrate 400. A protection film 442 of a silicon oxide film is formed on the exposed surfaces of the p type InP layers 416, 432 and the buried layer 430.

The SOA part 406 is basically the same as that of the photosemiconductor device according to the twelfth embodiment shown in FIG. 34B. The photosemiconductor device according to the present embodiment is different from the photosemiconductor device according to the twelfth embodiment in that in the former the upper surface of the lower clad layer 454 is substantially flush with the upper surface of the intermediate layer 422.

The drive circuit of the TTG-DFB lasers is different from that of the thirteenth embodiment in the electric power sources connected to the electrodes 436, 444. That is, as shown in FIG. 40A, the electrodes 436 of the respective TTG-DFB lasers 408a, 408b, 408c are connected in parallel to the laser drive electric power source 468 by the wires 462, 462a, 462b, 462c, and the electrode 444 formed on the underside of the semiconductor substrate 400 is connected to the wavelength control electric power source 464 by the wire 466.

The photosemiconductor device according to the present embodiment can be operated by substantially the same driving method as that of the photosemiconductor device according to the thirteenth embodiment.

That is, the wavelength control electric power source 464 and the laser drive electric power source 468 are driven with the drive change-over switch and the current injection switch of the TTG-DFB laser to be driven, whereby the desired TTG-DFB laser can be independently driven.

In the photosemiconductor device according to the present embodiment, the current injection switches of the TTG-DFB lasers which are not driven are opened, whereby the current injection into the MQW active layers 420 of the TTG-DFB lasers which are not driven can be prevented. Thus, as in the thirteenth embodiment, the generation of reactive power due to the leak current, etc. in the TTG-DFB lasers not driven is prevented, and the stable laser oscillation at a single wavelength can be realized.

In the present embodiment, the layer structure from the MQW active layer 420 to the buried layer 428 of the photosemiconductor device according to the thirteenth embodiment is reversed, but the layer structure from the MQW active layer 420 to the buried layer 428 of the photosemiconductor device according to the twelfth embodiment may be reversed.

[Modified Embodiments]

The present invention is not limited to the above-described embodiments and can cover other various modifications.

For example, in the above-described embodiments, the photosemiconductor device uses a p type semiconductor substrate. However, the present invention is applicable to photosemiconductor devices using n type semiconductor substrates, and in this case, the conduction types of the respective layers are exchanged in the above-described embodiments. In the above-described embodiments, the photosemiconductor device uses an InP substrate. However, the present invention is applicable to photosemiconductor devices using compound semiconductor substrate, such as GaAs substrates, etc.

The photosemiconductor device is not essentially formed of the material groups used in the above-described embodiments and may be formed of other material groups. Sizes, such as film thickness, etc., dopant doses, etc. of the respective layers can be design-changed suitably as required.

In the ninth to the eleventh embodiments, the rectifying layer 180 or the semi-insulating semiconductor layer 212 are formed between the semiconductor substrate 144, and the optical waveguide structure including the lower clad layer 182, the core layer 184 and the upper clad layer 186. However, any other layer may be used as long as the layer can insulate the optical waveguide structure including the optical waveguide 187 and the optical coupler 218, etc from the semiconductor substrate 144. In place of the rectifying layer 180 and the semi-insulating semiconductor layer 212, for example, oxide layers, or insulation films, such as sufficiently thick non-doped semiconductor layers, etc., may be formed. Plural kinds of such insulation films are laid to thereby insulate the optical waveguide structure from the semiconductor substrate 144.

In the ninth to the eleventh embodiments, the MQW active layer 162 is formed on the wavelength tuning layer 158 with the intermediate layer 160 formed therebetween, but the positions of the wavelength tuning layer 158 and the MQW active layer 162 may be exchanged. That is, the wavelength tuning layer 158 may be formed on the MQW active layer 162 with the intermediate layer 160 formed therebetween, and in this constitution, current is injected into the MQW active layer 162 from the p type electrode 152 formed on the underside of the semiconductor substrate 144. In this case, when the current is injected into the MQW active layer 162, the rectifying layer 180 or the semi-insulating semiconductor layer 212 suppress the generation of leak current which flows from the semiconductor substrate 144 to the earth potential through the core layer 184 of the optical waveguide 187 and the n type InP buried layer 170 on both sides of the core layer 184. Accordingly, the decrease of the effectiveness of the current injection into the MQW active layer 162 of the TTG-LD 175 can be suppressed, and the TTG-LD 175 and the optical waveguide 187 can be integrated on one and the same substrate without characteristic deterioration.

In the ninth to the eleventh embodiments, the optical waveguide integrated with the TTG-LD 175 is optically coupled with the TTG-LD 175. However, the optical waveguide integrated with the TTG-LD 175 on one and the same substrate may not be optically coupled with the TTG-LD 175.

In the ninth to the eleventh embodiments, the mesa stripe of the TTG-LD part 146 and the mesa stripe of the optical waveguide part 148 are concurrently formed. However, both may not be formed concurrently.

In the eighth embodiment, the eleventh embodiment, and the twelfth to the fourteenth embodiments, a plurality of TTG-DFB lasers having different wavelength variation ranges are arrayed. However, the TTG-DFB lasers to be arrayed do not essentially have different wavelength variation ranges. A plurality of arrayed TTG-DFB lasers may contain back-up TTG-DFB lasers having the same wavelength variation ranges. A number of the arrayed TTG-DGB lasers is not limited to the number described in the embodiments.

In the twelfth to the fourteenth embodiments, the SOA is disposed on one and the same semiconductor substrate together with a plurality of arrayed TTG-DFB lasers, but the SOA may not be formed.

What is claimed is:

1. A photosemiconductor device comprising:
   a light oscillation part formed in a first region of a first conduction-type semiconductor substrate and including a first active layer which generates light by current injection, a wavelength tuning layer with a second conduction-type intermediate layer formed between the first active layer and the wavelength tuning layer, for varying an oscillation wavelength by current injection, and a diffraction grating formed near the first active layer and the wavelength tuning layer; and
   a light amplification part formed in a second region of the semiconductor substrate and including a second active layer which amplifies light by current injection, for amplifying light generated by the light oscillation part,
   the light amplification part being processed in a mesa stripe, and
   the device further comprising one electrode for leading out current from the light amplification part, said one electrode being positioned at the side surface of the mesa stripe.

2. The photosemiconductor device according to claim 1, wherein
   a clad layer of the second conduction-type is formed between the semiconductor substrate and the second active layer.

3. The photosemiconductor device according to claim 2, wherein
   two semiconductor layers of conduction types different from each other are formed between the semiconductor substrate and the clad layer.

4. The photosemiconductor device according to claim 2, wherein
   a semi-insulating semiconductor layer is formed between the semiconductor substrate and the clad layer.

5. The photosemiconductor device according to claim 2, further comprising:
   another electrode for injecting current into the light amplification part,
   said one electrode and said another electrode being formed on the side of a first surface of the semiconductor substrate.

6. The photosemiconductor device according to claim 5, wherein
   said one electrode is formed on a semiconductor layer of the second conduction-type connected to the clad layer at the side surface of the mesa stripe.

7. The photosemiconductor device according to claim 1, wherein
   a clad layer of the second conduction-type is formed on the second active layer.

8. The photosemiconductor device according to claim 7, wherein
   the intermediate layer is formed, extended in the second region of the semiconductor substrate.

9. The photosemiconductor device according to claim 7, further comprising:
   another electrode for injecting current into the light amplification part, said another electrode being formed on the side of a second surface of the semiconductor substrate,
   said one electrode being formed on the side of a first surface of the semiconductor substrate.

10. The photosemiconductor device according to claim 9, wherein
    said one electrode is formed on a semiconductor layer of the second conduction-type connected to the clad layer at the side surface of the mesa stripe.

11. The photosemiconductor device according to claim 1, further comprising
    an optical waveguide part which is formed between the light oscillation part and the light amplification part and does not contribute to the light oscillation and the light amplification.

12. The photosemiconductor device according to claim 1, wherein
    the first active layer and the second active layer are formed of a semiconductor layer of the same structure.

13. The photosemiconductor device according to claim 1, wherein
    the light oscillation part has a mesa stripe configuration of a first width,
    the light amplification part has a mesa stripe configuration of a second width, and
    the first width is continuously changed to the second width between the light oscillation part and the light amplification.

14. The photosemiconductor device according to claim 1, further comprising
an anti-reflection film formed on the end surface of the light amplification part.

15. The photosemiconductor device according to claim 1, wherein
the light oscillation part comprises a plurality of light oscillation elements having central oscillation wavelengths different from each other,
the device further comprising:
a plurality of optical waveguides formed between the light oscillation part and the light amplification part, for guiding light output from the plurality of the light oscillation elements; and
an optical coupler part for connecting the plurality of the optical waveguides and the light amplification part.

16. A photosemiconductor device comprising:
a light oscillation part formed in a first region of a first conduction-type semiconductor substrate and including an active layer, for generating light by current injection, and a wavelength tuning layer with a second-conduction type intermediate layer formed between the active layer and the wavelength tuning layer, for varying an oscillation wavelength of the active layer by current injection; and
an optical waveguide part including an insulation film formed in a second region of the semiconductor substrate and an optical waveguide layer formed above the insulation film, for guiding light output from the light oscillation part.

17. The photosemiconductor device according to claim 16, wherein
the insulation film includes two semiconductor layers of conduction types different from each other.

18. The photosemiconductor device according to claim 16, wherein
the insulation film comprises a semi-insulating semiconductor layer.

19. The photosemiconductor device according to claim 16, further comprising
a buried layer formed on the semiconductor substrate, for covering the side of a first mesa stripe of the active layer, the intermediate layer and the wavelength tuning layer which are patterned and for covering the side of a second mesa stripe of the insulation film and the optical waveguide layer which are patterned.

20. The photosemiconductor device according to claim 19, wherein
the buried layer includes a first buried layer of the second conduction type electrically connected to the intermediate layer and a second buried layer formed between the semiconductor substrate and the first buried layer, for insulating the first buried layer from the semiconductor substrate.

21. The photosemiconductor device according to claim 20, wherein
the second buried layer includes two semiconductor layers of conduction types different from each other.

22. The photosemiconductor device according to claim 19, wherein
the first mesa stripe and the second mesa stripe are connected continuously to each other.

23. The photosemiconductor device according to claim 16, further comprising
a light amplification part formed in a third region of the semiconductor substrate, for amplifying light which has been generated in the light oscillation part and has propagated through the optical waveguide part.

24. The photosemiconductor device according to claim 23, wherein
the light oscillation part includes a plurality of light oscillation elements having central oscillation wavelengths different from one another, and
the optical waveguide part includes a plurality of optical waveguides for guiding light output from the plurality of the light oscillation elements and an optical coupler part for connecting the plurality of the optical waveguides and the light amplification part.

25. The photosemiconductor device according to claim 16, wherein
the first conduction type is p type, and the second conduction type is n type.

26. A photosemiconductor device comprising:
a light oscillation part formed on a first conduction-type semiconductor substrate and including a plurality of light oscillation elements which include an active layer for generating light by current injection, a wavelength tuning layer with a second conduction-type intermediate layer formed between the active layer and the wavelength tuning layer, for varying an oscillation wavelength by current injection, and a diffraction grating formed near the active layer and the wavelength tuning layer; and
a current leading-out part for selectively leading out current injected into the active layer or the wavelength tuning layer from the intermediate layer of an arbitrary one of the light oscillation elements.

27. The photosemiconductor device according to claim 26, wherein
the current leading-out part includes a plurality of switches for changing over the respective connections of the intermediate layer of the plurality of the light oscillation elements to a reference potential.

28. The photosemiconductor device according to claim 26, further comprising
a first current injecting part for injecting current into the active layer or the wavelength tuning layer of the plurality of the light oscillation elements via an electrode formed on the side of a first surface of the semiconductor substrate.

29. The photosemiconductor device according to claim 28, wherein
the first current injecting part includes an electric power source, and a plurality of wires connecting the active layer or the wavelength tuning layer of the plurality of the light oscillation elements in parallel to the electric power source.

30. The photosemiconductor device according to claim 29, wherein
the first current injecting part further includes a plurality of switches respectively provided in the plurality of the wires.

31. The photosemiconductor device according to claim 27, further comprising
a first current injecting part comprising an electric power source, a plurality of wires connecting the active layer or the wavelength tuning layer of the plurality of the light oscillation elements in parallel to the electric power source, and a plurality of switches provided in the respective plurality of the wires and interlocked operatively with the plurality of the switches of the current leading-out part, for injecting current into the active layer or the wavelength tuning layer of an arbitrary one of the light oscillation elements via an electrode formed on the side of a first surface of the semiconductor substrate.

32. The photosemiconductor device according to claim 26, further comprising
a second current injecting part for injecting current into the wavelength tuning layer or the active layer of the plurality of the light oscillation elements via an electrode formed on the side of a second surface of the semiconductor substrate.

33. The photosemiconductor device according to claim 26, further comprising
a light amplification part formed on the semiconductor substrate and including an active layer for amplifying light by current injection, for amplifying light generated by the light oscillation part.

34. The photosemiconductor device according to claim 33, between the light oscillation part and the light amplification part, further comprising:
a plurality of optical waveguides for guiding light output from the plurality of the light oscillation elements; and
an optical coupler for optically connecting the plurality of the optical waveguides and the light amplification part.

35. The photosemiconductor device according to claim 26, wherein
the plurality of the light oscillation elements have central oscillation wavelengths different from one another.

* * * * *